(12) United States Patent
Shirakawa

(10) Patent No.: US 9,355,737 B2
(45) Date of Patent: May 31, 2016

(54) SEMICONDUCTOR MEMORY DEVICE

(71) Applicant: KABUSHIKI KAISHA TOSHIBA, Tokyo (JP)

(72) Inventor: Masanobu Shirakawa, Chigasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/470,322

(22) Filed: Aug. 27, 2014

(65) Prior Publication Data

US 2015/0262698 A1 Sep. 17, 2015

(30) Foreign Application Priority Data

Mar. 17, 2014 (JP) .................................. 2014-052991

(51) Int. Cl.
| | |
|---|---|
| *G11C 16/06* | (2006.01) |
| *G11C 16/34* | (2006.01) |
| *G11C 16/04* | (2006.01) |
| *G11C 16/16* | (2006.01) |
| *G11C 29/00* | (2006.01) |

(52) U.S. Cl.
CPC ........ *G11C 16/3445* (2013.01); *G11C 16/0483* (2013.01); *G11C 16/16* (2013.01); *G11C 29/76* (2013.01)

(58) Field of Classification Search
CPC ........... G11C 16/0483; G11C 16/3445; G11C 11/5621; G11C 16/04; G11C 16/06; G11C 16/08; G11C 16/10; G11C 16/16; G11C 29/04; G11C 29/44; G11C 29/785; G11C 29/789; G11C 29/832; G11C 16/14
USPC .............. 365/185.17, 185.11, 185.18, 185.29
See application file for complete search history.

(56) References Cited

U.S. PATENT DOCUMENTS

| | | | |
|---|---|---|---|
| 7,965,554 B2 | 6/2011 | Lutze et al. | |
| 2010/0002513 A1 | 1/2010 | Lutze et al. | |
| 2012/0320698 A1 | 12/2012 | Itagaki et al. | |
| 2014/0085982 A1* | 3/2014 | Asaoka | G11C 16/06 365/185.17 |

FOREIGN PATENT DOCUMENTS

| | | |
|---|---|---|
| JP | 2011-258289 A | 12/2011 |
| JP | 2013-145623 | 7/2013 |
| JP | 2014-164789 | 9/2014 |

* cited by examiner

*Primary Examiner* — Thong Q Le
(74) *Attorney, Agent, or Firm* — Patterson & Sheridan, LLP

(57) ABSTRACT

A semiconductor memory device includes a block including a plurality of string units, each including a plurality of memory cells electrically connected in series, a bad string register in which information indicating which of the string units is a bad string is stored, and a control circuit. The control circuit controls an erase operation on the memory cells, the erase operation including a first erase operation followed by a first verify operation and as needed a subsequent erase operation followed by a subsequent verify operation. During the erase operation, the control circuit skips a verify operation for a string unit if the information in the bad string register indicates the string unit is a bad string.

19 Claims, 48 Drawing Sheets

FIG. 38

|  | PB0 | PB1 | PB2 | PB3 |
|---|---|---|---|---|
| SU11 |  |  |  |  |
| SU10 |  |  |  |  |
| SU9 |  |  |  |  |
| SU8 |  |  |  |  |
| SU7 |  |  |  |  |
| SU6 |  |  |  |  |
| SU5 |  |  |  |  |
| SU4 |  |  |  |  |
| SU3 |  |  |  |  |
| SU2 |  |  |  |  |
| SU1 |  |  |  |  |
| SU0 |  |  |  |  |

FIG. 39

|  | PB0 | PB1 | PB2 | PB3 |
|---|---|---|---|---|
| SU11 | BSC |  |  |  |
| SU10 | BSC |  |  |  |
| SU9 |  |  |  |  |
| SU8 |  |  |  |  |
| SU7 |  |  |  |  |
| SU6 |  |  |  |  |
| SU5 | BSC |  |  |  |
| SU4 |  |  |  |  |
| SU3 |  |  |  |  |
| SU2 | BSC |  |  |  |
| SU1 |  |  |  |  |
| SU0 | BSC |  |  |  |

| | PB0 | PB1 | PB2 | PB3 |
|---|---|---|---|---|
| SU11 | BSC | | | |
| SU10 | BSC | | | |
| SU9 | BSM | | | |
| SU8 | BSM | | | |
| SU7 | Failed | | | |
| SU6 | BSM | | | |
| SU5 | BSC | | | |
| SU4 | BSM | | | |
| SU3 | BSM | | | |
| SU2 | BSC | Sel | Sel | |
| SU1 | BSM | BSM | Failed | Sel |
| SU0 | BSC | Failed | BSM | Passed |

FIG. 45

| | PB0 | PB1 | PB2 | PB3 |
|---|---|---|---|---|
| SU11 | BSC | | | |
| SU10 | BSC | | | |
| SU9 | BSM | | | |
| SU8 | BSM | | | |
| SU7 | Failed | | | |
| SU6 | BSM | | | |
| SU5 | BSC | | | |
| SU4 | BSM | Passed | Passed | |
| SU3 | BSM | Failed | Passed | Failed |
| SU2 | BSC | Failed | Passed | Passed |
| SU1 | BSM | BSM | Failed | Passed |
| SU0 | BSC | Failed | BSM | Passed |

FIG. 60
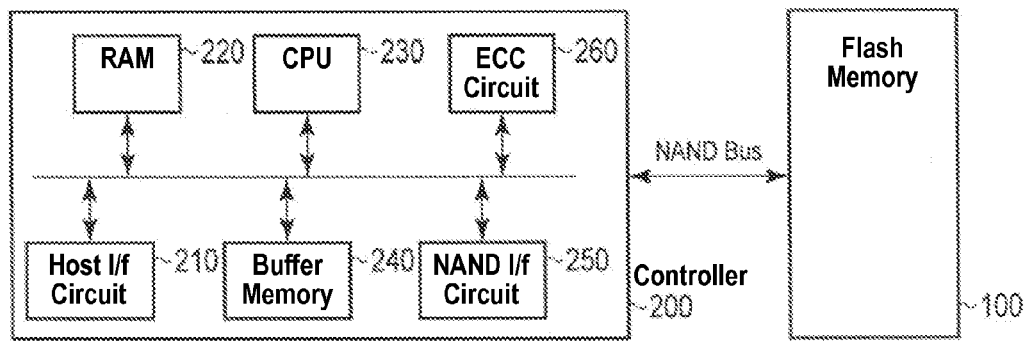
FIG. 61
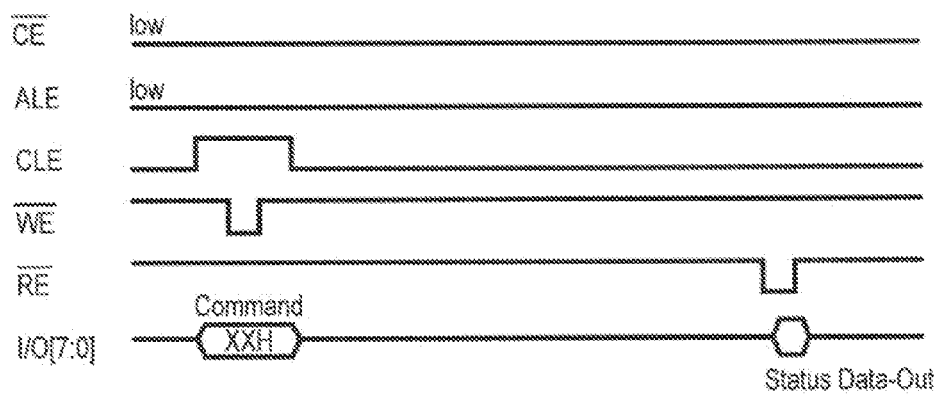
FIG. 62
CMD 70
| I/O | Status | Output |
|---|---|---|
| I/O[0] | Pass/Fail | Pass : '0'  Fail : '1' |
| I/O[5:1] | Not used | '0' |
| I/O[6] | Ready/Busy | Ready : '1'  Busy : '0' |
| I/O[7] | Write protect | Protect : '0'  Not Protect '1' |

FIG. 63

CMD 71

| I/O | Status | Output |
|---|---|---|
| I/O[0] | Pass/Fail | Pass : '0'  Fail : '1' |
| I/O[1] | PB0 current status | Pass : '0' Fail : '1' |
| I/O[2] | PB1 current status | Pass : '0' Fail : '1' |
| I/O[3] | PB0 previous status | Pass : '0' Fail : '1' |
| I/O[4] | PB1 previous status | Pass : '0'  Fail : '1' |
| I/O[5] | Not used | '0' |
| I/O[6] | Ready/Busy | Ready : '1'   Busy : '0' |
| I/O[7] | Write protect | Protect : '0'   Not Protect '1' |

FIG. 64

CMD X;pass string status

| I/O | Status | Output |
|---|---|---|
| I/O[0] | PB0 string0 pass status | Pass : "1" Not Pass : "0" |
| I/O[1] | PB0 string1 pass status | Pass : "1" Not Pass : "0" |
| I/O[2] | PB0 string2 pass status | Pass : "1" Not Pass : "0" |
| I/O[3] | PB0 string3 pass status | Pass : "1" Not Pass : "0" |
| I/O[4] | PB1 string0 pass status | Pass : "1" Not Pass : "0" |
| I/O[5] | PB1 string1 pass status | Pass : "1" Not Pass : "0" |
| I/O[6] | PB1 string2 pass status | Pass : "1" Not Pass : "0" |
| I/O[7] | PB1 string3 pass status | Pass : "1" Not Pass : "0" |

FIG. 65

CMD Y:fail string status

| I/O | Status | Output |
|---|---|---|
| I/O[0] | PB0 string0 fail status | Fail : "1" Not Fail : "0" |
| I/O[1] | PB0 string1 fail status | Fail : "1" Not Fail : "0" |
| I/O[2] | PB0 string2 fail status | Fail : "1" Not Fail : "0" |
| I/O[3] | PB0 string3 fail status | Fail : "1" Not Fail : "0" |
| I/O[4] | PB1 string0 fail status | Fail : "1" Not Fail : "0" |
| I/O[5] | PB1 string1 fail status | Fail : "1" Not Fail : "0" |
| I/O[6] | PB1 string2 fail status | Fail : "1" Not Fail : "0" |
| I/O[7] | PB1 string3 fail status | Fail : "1" Not Fail : "0" |

FIG. 66

CMD Z:bad string status

| I/O | Status | Output |
|---|---|---|
| I/O[0] | PB0 string0 bad status | Bad : "1" Not Bad : "0" |
| I/O[1] | PB0 string1 bad status | Bad : "1" Not Bad : "0" |
| I/O[2] | PB0 string2 bad status | Bad : "1" Not Bad : "0" |
| I/O[3] | PB0 string3 bad status | Bad : "1" Not Bad : "0" |
| I/O[4] | PB1 string0 bad status | Bad : "1" Not Bad : "0" |
| I/O[5] | PB1 string1 bad status | Bad : "1" Not Bad : "0" |
| I/O[6] | PB1 string2 bad status | Bad : "1" Not Bad : "0" |
| I/O[7] | PB1 string3 bad status | Bad : "1" Not Bad : "0" |

FIG. 68

CMD X:pass string status

| ADD[1:0] | I/O | Status | Output |
|---|---|---|---|
| 00 | I/O[0] | PB0 string0 pass status | Pass : "1" Not Pass : "0" |
| 00 | I/O[1] | PB0 string1 pass status | Pass : "1" Not Pass : "0" |
| 00 | I/O[2] | PB0 string2 pass status | Pass : "1" Not Pass : "0" |
| 00 | I/O[3] | PB0 string3 pass status | Pass : "1" Not Pass : "0" |
| 00 | I/O[4] | PB0 string4 pass status | Pass : "1" Not Pass : "0" |
| 00 | I/O[5] | PB0 string5 pass status | Pass : "1" Not Pass : "0" |
| 00 | I/O[6] | Not used | "0" |
| 00 | I/O[7] | PB0 string0 to 11 accumulative pass status | Pass : "1" Not Pass : "0" |
| 01 | I/O[0] | PB0 string6 pass status | Pass : "1" Not Pass : "0" |
| 01 | I/O[1] | PB0 string7 pass status | Pass : "1" Not Pass : "0" |
| 01 | I/O[2] | PB0 string8 pass status | Pass : "1" Not Pass : "0" |
| 01 | I/O[3] | PB0 string9 pass status | Pass : "1" Not Pass : "0" |
| 01 | I/O[4] | PB0 string10 pass status | Pass : "1" Not Pass : "0" |
| 01 | I/O[5] | PB0 string11 pass status | Pass : "1" Not Pass : "0" |
| 01 | I/O[6] | Not used | "0" |
| 01 | I/O[7] | PB0 string0 to 11 accumulative pass status | Pass : "1" Not Pass : "0" |
| 10 | I/O[0] | PB1 string0 pass status | Pass : "1" Not Pass : "0" |
| 10 | I/O[1] | PB1 string1 pass status | Pass : "1" Not Pass : "0" |
| 10 | I/O[2] | PB1 string2 pass status | Pass : "1" Not Pass : "0" |
| 10 | I/O[3] | PB1 string3 pass status | Pass : "1" Not Pass : "0" |
| 10 | I/O[4] | PB1 string4 pass status | Pass : "1" Not Pass : "0" |
| 10 | I/O[5] | PB1 string5 pass status | Pass : "1" Not Pass : "0" |
| 10 | I/O[6] | Not used | "0" |
| 10 | I/O[7] | PB1 string0 to 11 accumulative pass status | Pass : "1" Not Pass : "0" |
| 11 | I/O[0] | PB1 string6 pass status | Pass : "1" Not Pass : "0" |
| 11 | I/O[1] | PB1 string7 pass status | Pass : "1" Not Pass : "0" |
| 11 | I/O[2] | PB1 string8 pass status | Pass : "1" Not Pass : "0" |
| 11 | I/O[3] | PB1 string9 pass status | Pass : "1" Not Pass : "0" |
| 11 | I/O[4] | PB1 string10 pass status | Pass : "1" Not Pass : "0" |
| 11 | I/O[5] | PB1 string11 pass status | Pass : "1" Not Pass : "0" |
| 11 | I/O[6] | Not used | "0" |
| 11 | I/O[7] | PB1 string0 to 11 accumulative pass status | Pass : "1" Not Pass : "0" |

FIG. 69

CMD Y:fail string status

| ADD[1:0] | I/O | Status | Output |
|---|---|---|---|
| 00 | I/O[0] | PB0 string0 fail status | Fail : "1" Not Fail : "0" |
| 00 | I/O[1] | PB0 string1 fail status | Fail : "1" Not Fail : "0" |
| 00 | I/O[2] | PB0 string2 fail status | Fail : "1" Not Fail : "0" |
| 00 | I/O[3] | PB0 string3 fail status | Fail : "1" Not Fail : "0" |
| 00 | I/O[4] | PB0 string4 fail status | Fail : "1" Not Fail : "0" |
| 00 | I/O[5] | PB0 string5 fail status | Fail : "1" Not Fail : "0" |
| 00 | I/O[6] | Not used | "0" |
| 00 | I/O[7] | PB0 string0 to 11 accumulative fail status | Fail : "1" Not Fail : "0" |
| 01 | I/O[0] | PB0 string6 fail status | Fail : "1" Not Fail : "0" |
| 01 | I/O[1] | PB0 string7 fail status | Fail : "1" Not Fail : "0" |
| 01 | I/O[2] | PB0 string8 fail status | Fail : "1" Not Fail : "0" |
| 01 | I/O[3] | PB0 string9 fail status | Fail : "1" Not Fail : "0" |
| 01 | I/O[4] | PB0 string10 fail status | Fail : "1" Not Fail : "0" |
| 01 | I/O[5] | PB0 string11 fail status | Fail : "1" Not Fail : "0" |
| 01 | I/O[6] | Not used | "0" |
| 01 | I/O[7] | PB0 string0 to 11 accumulative fail status | Fail : "1" Not Fail : "0" |
| 10 | I/O[0] | PB1 string0 fail status | Fail : "1" Not Fail : "0" |
| 10 | I/O[1] | PB1 string1 fail status | Fail : "1" Not Fail : "0" |
| 10 | I/O[2] | PB1 string2 fail status | Fail : "1" Not Fail : "0" |
| 10 | I/O[3] | PB1 string3 fail status | Fail : "1" Not Fail : "0" |
| 10 | I/O[4] | PB1 string4 fail status | Fail : "1" Not Fail : "0" |
| 10 | I/O[5] | PB1 string5 fail status | Fail : "1" Not Fail : "0" |
| 10 | I/O[6] | Not used | "0" |
| 10 | I/O[7] | PB1 string0 to 11 accumulative fail status | Fail : "1" Not Fail : "0" |
| 11 | I/O[0] | PB1 string6 fail status | Fail : "1" Not Fail : "0" |
| 11 | I/O[1] | PB1 string7 fail status | Fail : "1" Not Fail : "0" |
| 11 | I/O[2] | PB1 string8 fail status | Fail : "1" Not Fail : "0" |

FIG. 70

CMD Z:bad string status

| ADD[1:0] | I/O | Status | Output |
|---|---|---|---|
| 00 | I/O[0] | PB0 string0 bad status | Bad : "1" Not Bad : "0" |
| 00 | I/O[1] | PB0 string1 bad status | Bad : "1" Not Bad : "0" |
| 00 | I/O[2] | PB0 string2 bad status | Bad : "1" Not Bad : "0" |
| 00 | I/O[3] | PB0 string3 bad status | Bad : "1" Not Bad : "0" |
| 00 | I/O[4] | PB0 string4 bad status | Bad : "1" Not Bad : "0" |
| 00 | I/O[5] | PB0 string5 bad status | Bad : "1" Not Bad : "0" |
| 00 | I/O[6] | Not used | "0" |
| 00 | I/O[7] | PB0 string0 to 11 accumulative bad status | Bad : "1" Not Bad : "0" |
| 01 | I/O[0] | PB0 string6 bad status | Bad : "1" Not Bad : "0" |
| 01 | I/O[1] | PB0 string7 bad status | Bad : "1" Not Bad : "0" |
| 01 | I/O[2] | PB0 string8 bad status | Bad : "1" Not Bad : "0" |
| 01 | I/O[3] | PB0 string9 bad status | Bad : "1" Not Bad : "0" |
| 01 | I/O[4] | PB0 string10 bad status | Bad : "1" Not Bad : "0" |
| 01 | I/O[5] | PB0 string11 bad status | Bad : "1" Not Bad : "0" |
| 01 | I/O[6] | Not used | "0" |
| 01 | I/O[7] | PB0 string0 to 11 accumulative bad status | Bad : "1" Not Bad : "0" |
| 10 | I/O[0] | PB1 string0 bad status | Bad : "1" Not Bad : "0" |
| 10 | I/O[1] | PB1 string1 bad status | Bad : "1" Not Bad : "0" |
| 10 | I/O[2] | PB1 string2 bad status | Bad : "1" Not Bad : "0" |
| 10 | I/O[3] | PB1 string3 bad status | Bad : "1" Not Bad : "0" |
| 10 | I/O[4] | PB1 string4 bad status | Bad : "1" Not Bad : "0" |
| 10 | I/O[5] | PB1 string5 bad status | Bad : "1" Not Bad : "0" |
| 10 | I/O[6] | Not used | "0" |
| 10 | I/O[7] | PB1 string0 to 11 accumulative bad status | Bad : "1" Not Bad : "0" |
| 11 | I/O[0] | PB1 string6 bad status | Bad : "1" Not Bad : "0" |
| 11 | I/O[1] | PB1 string7 bad status | Bad : "1" Not Bad : "0" |
| 11 | I/O[2] | PB1 string8 bad status | Bad : "1" Not Bad : "0" |
| 11 | I/O[3] | PB1 string9 bad status | Bad : "1" Not Bad : "0" |
| 11 | I/O[4] | PB1 string10 bad status | Bad : "1" Not Bad : "0" |
| 11 | I/O[5] | PB1 string11 bad status | Bad : "1" Not Bad : "0" |
| 11 | I/O[6] | Not used | "0" |
| 11 | I/O[7] | PB1 string0 to 11 accumulative bad status | Bad : "1" Not Bad : "0" |

FIG. 71

CMD W:dummy status

| I/O | Status | Output |
|---|---|---|
| I/O[0] | PB0 string0 dummy status | Dummy : "1" Not Dummy : "0" |
| I/O[1] | PB0 string1 dummy status | Dummy : "1" Not Dummy : "0" |
| I/O[2] | PB0 string2 dummy status | Dummy : "1" Not Dummy : "0" |
| I/O[3] | PB0 string3 dummy status | Dummy : "1" Not Dummy : "0" |
| I/O[4] | PB1 string0 dummy status | Dummy : "1" Not Dummy : "0" |
| I/O[5] | PB1 string1 dummy status | Dummy : "1" Not Dummy : "0" |
| I/O[6] | PB1 string2 dummy status | Dummy : "1" Not Dummy : "0" |
| I/O[7] | PB1 string3 dummy status | Dummy : "1" Not Dummy : "0" |

SEMICONDUCTOR MEMORY DEVICE

CROSS-REFERENCE TO RELATED APPLICATION

This application is based upon and claims the benefit of priority from Japanese Patent Application No. 2014-052991, filed Mar. 17, 2014, the entire contents of which are incorporated herein by reference.

FIELD

Embodiments described herein relate generally to a semiconductor memory device.

BACKGROUND

NAND flash memory in which memory cells are arranged three-dimensionally is known.

DESCRIPTION OF THE DRAWINGS

FIG. 38 is a conceptual diagram of the various registers according to the first embodiment.

FIG. 39 is a conceptual diagram of the various registers according to the first embodiment.

FIG. 42 is a conceptual diagram of the various registers according to the first embodiment.

FIG. 43 is a conceptual diagram of the various registers according to the first embodiment.

FIG. 44 is a conceptual diagram of the various registers according to the first embodiment.

FIG. 45 is a conceptual diagram of the various registers according to the first embodiment.

FIG. 46 is a conceptual diagram of the various registers according to the first embodiment.

FIG. 47 is a conceptual diagram of the various registers according to the first embodiment.

FIG. 60 is a block diagram of a memory system according to a fifth embodiment.

FIG. 61 is a timing chart of the various signals during reading of a status according to the fifth embodiment.

FIG. 62 is a diagram showing the content of a command according to the fifth embodiment.

FIG. 63 is a diagram showing the content of a command according to the fifth embodiment.

FIG. 64 is a diagram showing the content of a command according to the fifth embodiment.

FIG. 65 is a diagram showing the content of a command according to the fifth embodiment.

FIG. 66 is a diagram showing the content of a command according to the fifth embodiment.

FIG. 68 is a diagram showing the content of a command according to the fifth embodiment.

FIG. 69 is a diagram showing the content of a command according to the fifth embodiment.

FIG. 70 is a diagram showing the content of a command according to the fifth embodiment.

FIG. 71 is a diagram showing the content of a command according to the fifth embodiment.

DETAILED DESCRIPTION

Figure 1:
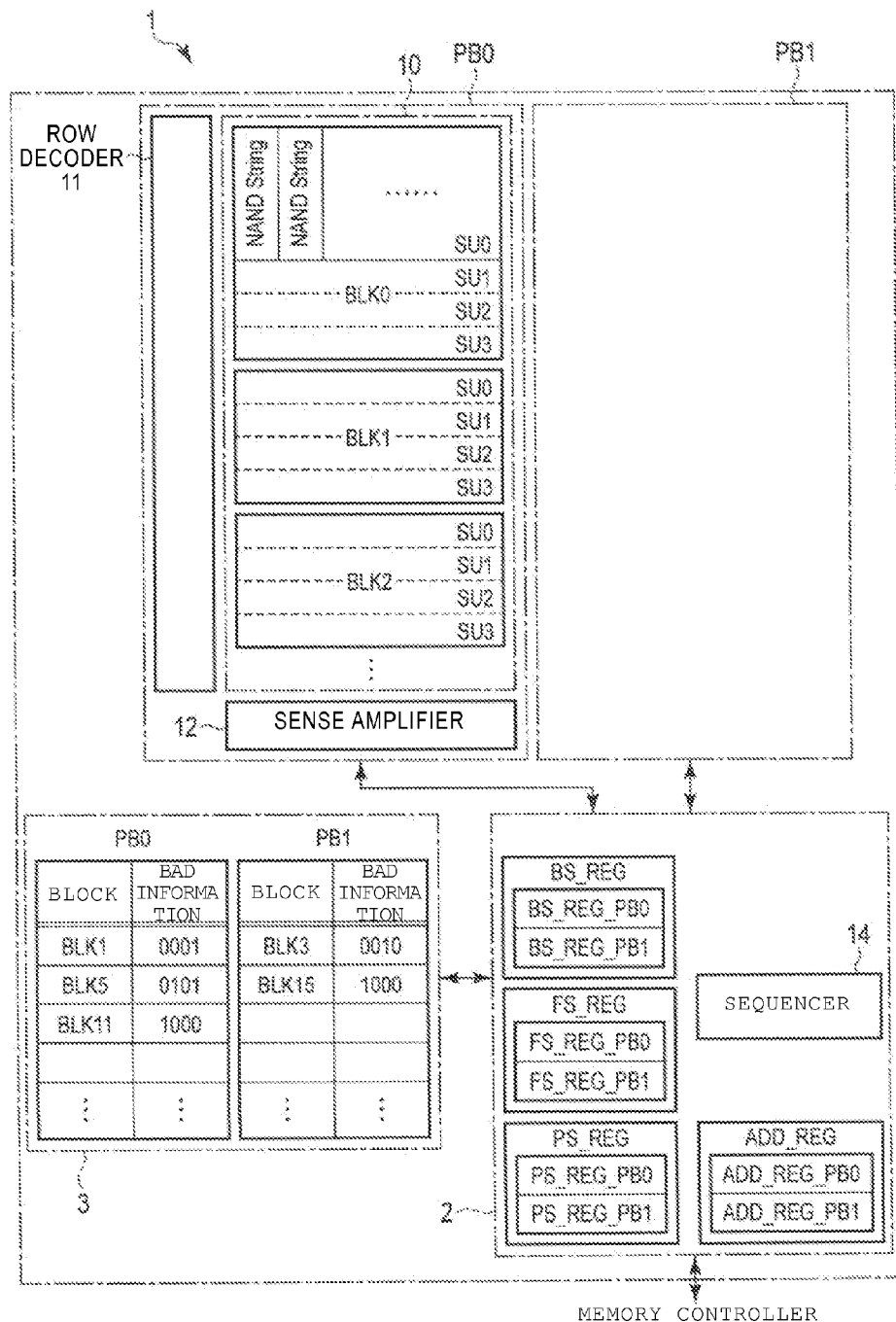
FIG. 1 is a block diagram of a semiconductor memory device according to a first embodiment.

The present embodiment now will be described more fully hereinafter with reference to the accompanying drawings, in which various embodiments are shown. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompass both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" may, therefore, encompass both an orientation of above and below.

Embodiments are described herein with reference to cross sections and perspective illustrations that are schematic illustrations of embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

A semiconductor memory device capable of an increased operation speed is provided.

In general, according to one embodiment, a semiconductor memory device includes a block including a plurality of string units, each including a plurality of memory cells electrically connected in series, a bad string register in which information indicating which of the string units is a bad string is stored, and a control circuit. The control circuit controls an erase operation on the memory cells, the erase operation including a first erase operation followed by a first verify operation and as needed a subsequent erase operation followed by a subsequent verify operation. During the erase operation, the control circuit skips a verify operation for a string unit if the information in the bad string register indicates the string unit is a bad string.

Hereinafter, the embodiments will be described with reference to the drawings. For the description, like components are given like reference numerals across all of the drawings.

1. First Embodiment

Description will be given of the semiconductor memory device according to a first embodiment. Hereinafter, description will be given using a three-dimensional stacked NAND flash memory in which memory cells are stacked on a semiconductor substrate as an example of the semiconductor memory device.

1.1 Configuration

1.1.1 Overall Configuration of Semiconductor Memory Device

FIG. 1 is a block diagram of the semiconductor memory device according to the present embodiment. As illustrated, a semiconductor memory device 1 is provided with a logic circuit 2, a partial bad information register 3, and a plurality of planes PB (the present example shows a case in which two planes, PB0 and PB1, are used).

Each plane PB is a unit provided with memory cells that store data, which performs writing of data to the memory cells and reading of data from the memory cells. The planes PB0 and PB1 may operate independently of one another, and may also operate at the same time.

Each plane PB is provided with a memory cell array 10, a row decoder 11, and a sense amplifier 12.

The memory cell array 10 is provided with a plurality of blocks BLK (BLK0, BLK1, BLK2, . . . ), each of which is a collection of a plurality of nonvolatile memory cells that are each associated with a word line and a bit line. Data is erased in block BLK units, and all the data in the same block BLK is erased collectively. Each of the blocks BLK is provided with a plurality of string units SU (SU0 to SU3), each of which is a collection of NAND strings 13 in which memory cells are connected in series. Naturally, the number of blocks BLK and the number of string units SU in one block BLK are arbitrary.

The row decoder 11 decodes a block address and a page address, and selects one of the word lines of the corresponding block. The row decoder 11 applies the appropriate voltages to the selected word line, the unselected word lines and the like.

During the reading of data, the sense amplifier 12 senses and amplifies the data that is read from the memory cell to the bit line. During the writing of data, the sense amplifier transfers the write data to the memory cell. The reading and writing of data from and to the memory cell array 10 is performed in units of a plurality of memory cell units, referred to as a "page."

The reading of data from the memory cell and the writing of data to the memory cell are performed by the row decoder 11 and the sense amplifier 12.

Next, description will be given of the logic circuit 2. The logic circuit 2 is capable of communicating with a memory controller that controls the semiconductor memory device 1. The logic circuit 2 controls the overall operation of the semiconductor memory device 1 according to the commands from the memory controller.

As shown in FIG. 1, the logic circuit 2 is provided with a sequencer 14, an address register ADD_REG, a bad string register BS_REG, a failed string register FS_REG, and a passed string register PS_REG.

The address register ADD_REG holds addresses (block addresses and page addresses) that are received from the memory controller. The address register ADD_REG is provided with a register ADD_REG_PB0 for the plane PB0, and a register ADD_REG_PB1 for the plane PB1. In other words, when accessing the plane PB0, an address is stored in the register ADD_REG_PB0, and when accessing the plane PB1, an address is stored in the register ADD_REG_PB1.

The bad string register BS_REG holds bad string information of each block. The bad string information is information relating to each block that indicates whether each string unit SU is a good string or an unusable bad string. In the example of FIG. 1, each block contains four string units SU. Therefore, the bad string information corresponding to each block is 4-bit data, for example, and indicates whether or not the string units SU0 to SU3, in order from the lower bit, are bad strings. For example, when the bad string information is "0010", this indicates that the string unit SU1 is a bad string. The bad string register BS_REG is also provided with a register BS_REG_PB0 for the plane PB0, and a register BS_REG_PB1 for the plane PB1. In other words, the register BS_REG_PB0 holds the bad string information of the plane PB0, and the register BS_REG_PB1 holds the bad string information of the plane PB1.

The failed string register FS_REG holds failed string information of each block. The term "failed string information" refers to information that indicates whether each string unit passed or failed the erase verification in the erase operation (described hereinafter), or in the dummy programming verification (described hereinafter). In other words, the failed string information indicates that some operation in the erase operation has been failed, and indicates the failure of the string unit SU. Similarly to the bad string information in the example of FIG. 1, the failed string information is also 4-bit data, and each bit corresponds to the string units SU0 to SU3, in order from the lower bit. For example, when the failed string information is "0100", this indicates that the string unit SU2 has been failed. The failed string register FS_REG is also provided with a register FS_REG_PB0 for the plane PB0, and a register FS_REG_PB1 for the plane PB1. In other words, the register FS_REG_PB0 holds the failed string information of the plane PB0, and the register FS_REG_PB1 holds the failed string information of the plane PB1.

The passed string register PS_REG holds passed string information of each block. The passed string information is information that indicates whether each string unit SU has been passed the erase verification. In the example of FIG. 1, the passed string information is also 4-bit data, and each bit corresponds to the string units SU0 to SU3, in order from the lower bit. When the passed string information is "1000", this indicates that the string unit SU3 has passed. The passed string register PS_REG holds the address of the string unit SU (the passed string). The passed string register PS_REG is also provided with a register PS_REG_PB0 for the plane PB0, and a register PS_REG_PB1 for the plane PB1. In other words, the register PS_REG_PB0 holds the passed string information of the plane PB0, and the register PS_REG_PB1 holds the passed string information of the plane PB1.

It is possible to reference the information that is held in the bad string register BS_REG, the failed string register FS_REG, and the passed string register PS_REG from the memory controller. In other words, by issuing commands, the memory controller may read the data in each register BS_REG, FS_REG, and PS_REG. Detailed description of the operation of the memory controller will be given in the fifth embodiment (described hereinafter).

The sequencer 14 controls the operations of the planes PB0 and PB1 according to the commands received from the memory controller. In other words, when a read, write, or erase command is transmitted from the memory controller, the command is stored in a command register (not shown). The access target address is stored in the address register ADD_REG. The sequencer 14 controls the operations of the plane PB0 and/or the plane PB1 according to the information, and executes reading, writing, or erasure of data. The sequencer 14 also performs the writing of information to the bad string register BS_REG, the failed string register FS_REG, and the passed string register PS_REG.

Next, description will be given of the partial bad information register 3. The partial bad information register 3 holds known bad string information. In other words, during manufacture, the semiconductor memory device 1 includes blocks which contain partial defects but are not classified as bad blocks. The partial bad information register 3 holds the partial positional information of the defects.

In the example of FIG. 1, registers are provided for each of the planes PB0 and PB1, and an example is shown of a case in which the registers hold the bad string information. The 4-digit defect information of FIG. 1 indicates the statuses of SU0 to SU3, in order from the lower bit, and indicates that "1" is a bad string and that "0" is a good string. Accordingly, in the example of FIG. 1, in the plane PB0, the string unit SU0 of the block BLK1, SU0 and SU3 of BLK5, and SU3 of BLK11 are bad strings. Note that, the partial positional information of the defects is registered in this manner in units of string units, but may be registered in other units.

During manufacture, the partial positional information of the defects is stored in the partial bad information register in a volatile manner, and when testing during the manufacturing is completed, the information may be written to a specific region (a ROM fuse region) of the memory cell array 10, for example. When powering on the semiconductor memory device 1, the information is automatically read from the ROM fuse region by the sequencer 14 without receiving a command from the memory controller (power-on read), and is stored in the partial bad information register 3. The function that stores the identified positional information of the defects in the register 3 before shipping will be referred to as a first registration function hereinafter. The first registration function is optional, and the NAND flash memory 1 may not include the first registration function. The first registration function may be provided together with a type of function that does not use a register to hold the defect information, such as a second registration function (described hereinafter). Detailed description will be given of the second registration function in the sections 1.1.3 and 1.1.4 described hereinafter.

Note that, the semiconductor memory device 1 and the memory controller may be integrated into a single semiconductor device by the combination thereof, for example. Examples of such a configuration include a memory card such as an SD™ card and a solid state drive (SSD).

1.1.2 Details of Memory Cell Array 10

Figure 2:
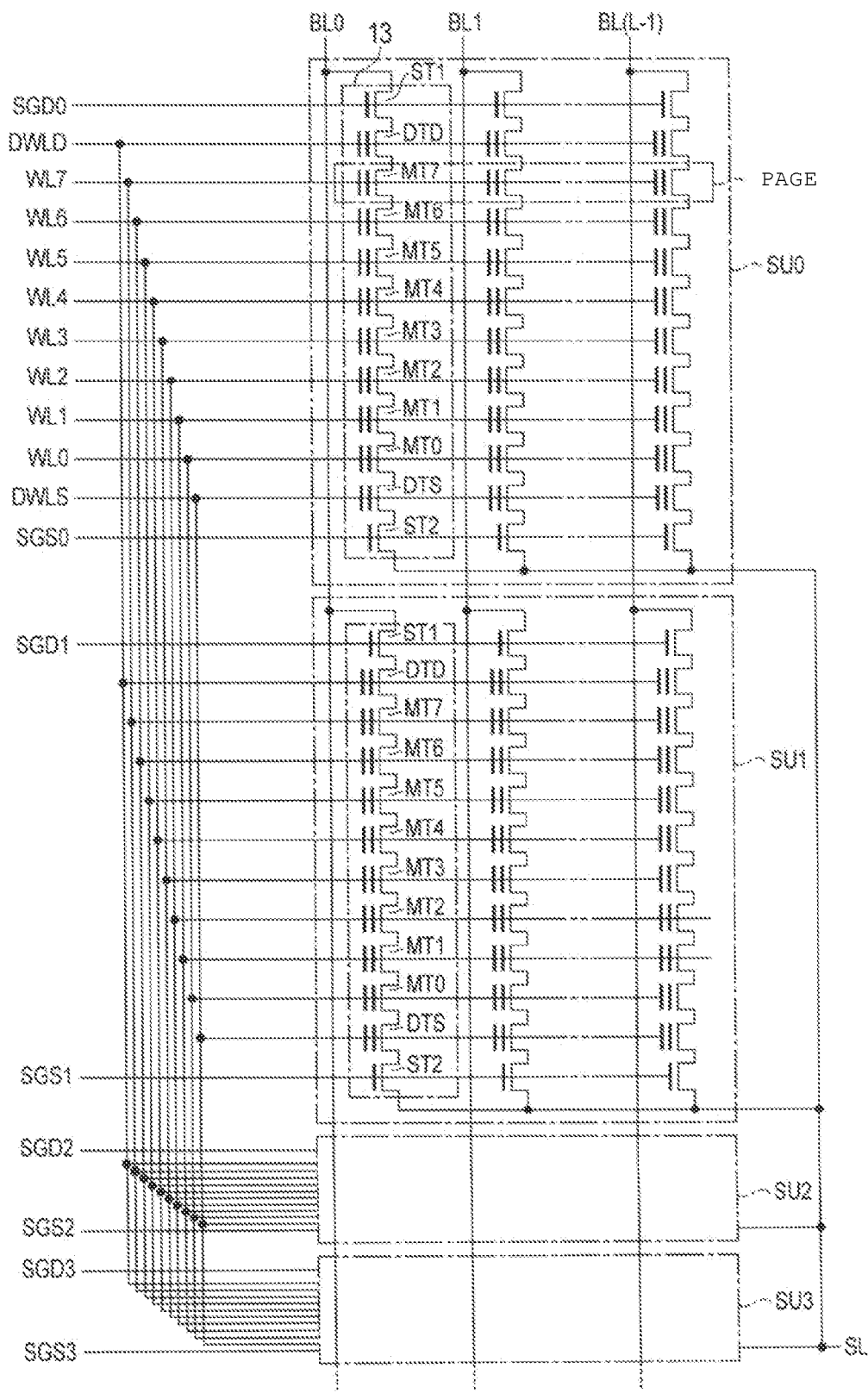
FIG. 2 is a circuit diagram of a memory cell array according to the first embodiment.

Next, detailed description will be given of the memory cell array 10. FIG. 2 is a circuit diagram of a block BLK. The other blocks BLK are also configured in the same manner. As illustrated, the block BLK contains four string units SU (SU0 to SU3), for example. Each of the string units SU contains a plurality of (L, where L is a natural number of 2 or greater) NAND strings 13.

Each of the NAND strings 13 contains eight memory cell transistors MT (MT0 to MT7), for example, dummy transistors DTD and DTS, and select transistors ST1 and ST2. Each of the memory cell transistors MT is provided with a stacked gate containing a control gate and a charge storage layer, and holds data in a nonvolatile manner. Note that the number of memory cell transistors MT is not limited to 8, may also be 16, 32, 64, 128 or the like, and may be any number. In the same manner as the memory cell transistors MT, each of the dummy transistors DTD and DTS is provided with a stacked gate containing a control gate and a charge storage layer. However, the dummy transistors DTD and DTS are not for holding data, and function as simple current paths during reading, writing, and erasing of data. The memory cell transistors MT and the dummy transistors DTD and DTS are arranged such that the current path thereof is connected in series between the select transistors ST1 and ST2. The dummy transistor DTD is provided between the memory cell transistor MT7 and the select transistor ST1, and the dummy transistor DTS is provided between the memory cell transistor MT0 and the select transistor ST2.

The gates of each of the select transistors ST1 of the string units SU0 to SU3 are connected in common with select gate lines SGD0 to SGD3, respectively. The gates of the select transistors ST2 are connected in common with the select gate lines SGS0 to SGS3, respectively. Whereas the control gates of the memory cell transistors MT0 to MT7 that are in the same block BLK are connected in common with the word lines WL0 to WL7, respectively. The control gates of the dummy transistors DTD and DTS are connected in common with dummy word lines DWLD and DWLS.

In other words, while the word lines WL0 to WL7 and the dummy word lines DWLD and DWLS are connected in common between the plurality of string units SU0 to SU3 in the same block BLK, even if the select gate lines SGD and SGS are in the same block BLK, the select gate lines SGD and SGS are independent in relation to each of the string units SU0 to SU3. In alternative embodiments, the select gate lines SGS may be connected in common, in the same manner as the word lines WL and the like, without being independent.

The current paths (the drains) of the select transistors ST1 of the NAND strings 13 that are in the same column, of the NAND strings 13 arranged in a matrix in the memory cell array 10, are connected in common with one of the bit lines BL (BL0 to BL(L−1)). That is, the bit line BL connects in common with the NAND strings 13 between a plurality of string units SU within the same block BLK. The current paths (the sources) of the select transistors ST2 within the same string unit SU are connected in common with the source line SL. In addition, the source line SL connects in common with the NAND string 13 between a plurality of string units SU within the same block BLK.

As described above, the data of the memory cell transistors MT in the same block BLK is erased at once. In contrast, the reading and the writing of the data is performed at once for each of a plurality of memory cell transistors MT connected in common with one of the word lines WL in one of the string units SU of one of the blocks BLK. The unit thereof is referred to as a "page".

The configuration of the memory cell array 10 is disclosed in U.S. patent application Ser. No. 12/407,403, filed on 19 Mar. 2009 under the title "Three dimensional stacked nonvolatile semiconductor memory". Such configurations are also disclosed in U.S. patent application Ser. No. 12/406,524, filed on 18 Mar. 2009 under the title "Three dimensional stacked nonvolatile semiconductor memory", U.S. patent application Ser. No. 12/679,991, filed on 25 Mar. 2010 under the title "Non-volatile semiconductor storage device and method of manufacturing the same", and U.S. patent application Ser. No. 12/532,030, filed on 23 Mar. 2009 under the title "Semiconductor memory and method for manufacturing same". The entire contents of the above patent applications are incorporated by reference herein.

Figure 3:
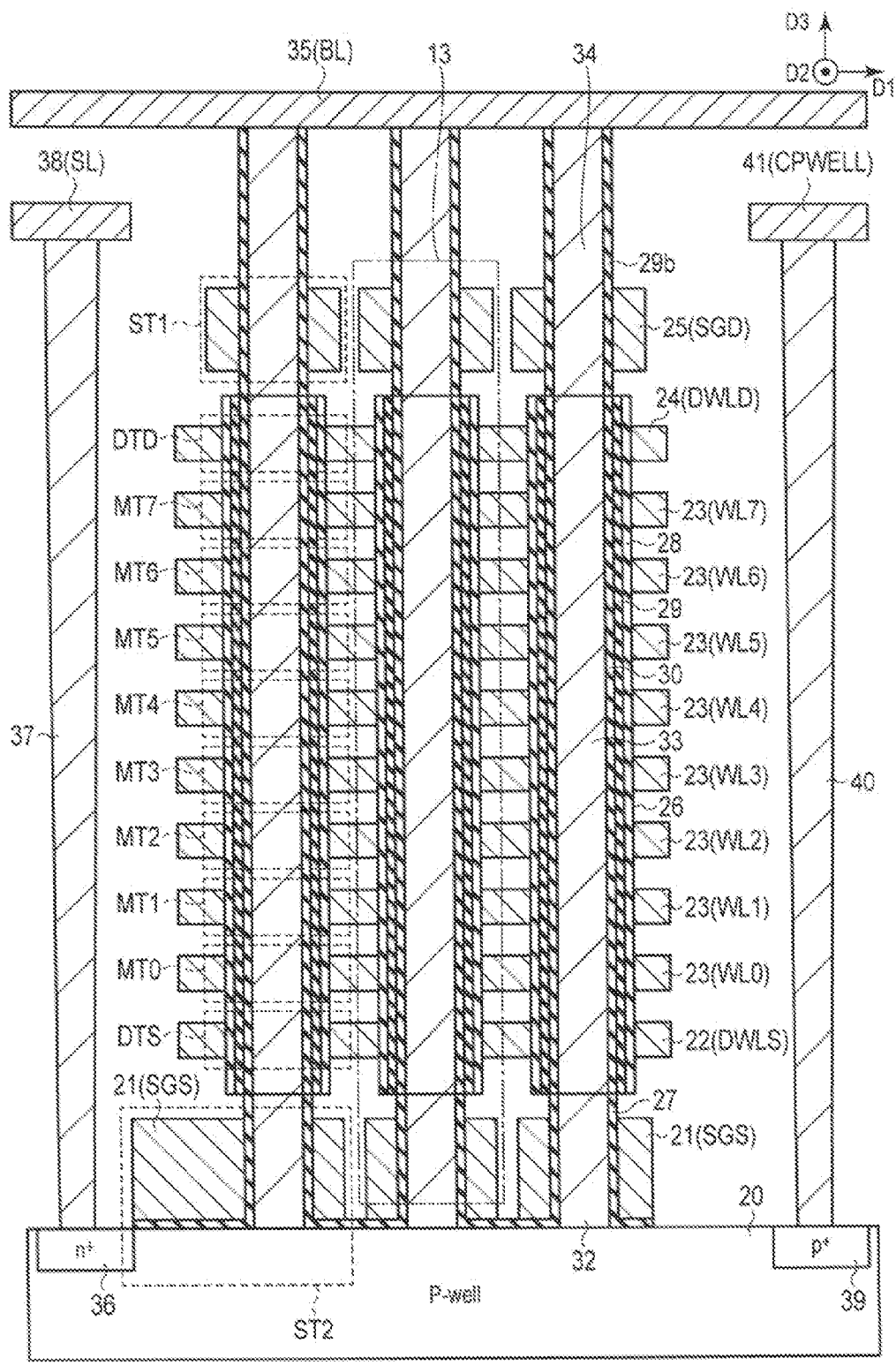
FIG. 3 is a cross-sectional diagram of the memory cell array according to the first embodiment.

A simplified description will be given of a configuration example of the memory cell array 10 using FIG. 3. FIG. 3 is a cross-sectional diagram of the NAND string 13. The string unit SU is formed in a depth direction (D2) of the surface of the paper on which FIG. 3 is illustrated, where the word lines WL, the dummy word lines DWLD and DWLS, and the select gate lines SGD and SGS are common to the string unit SU. Due to limitations of the surface of the paper, only three string units SU are shown in the D1 direction in FIG. 3.

The peripheral circuits such as the sense amplifier 12 and the row decoder 11, for example, are formed on the semiconductor substrate (not shown). An interlayer insulating film is formed so as to cover the peripheral circuits, and the memory cell array 10 is formed on the interlayer insulating film. In other words, as shown in FIG. 3, a p type semiconductor layer 20 is formed on the interlayer insulating film (not shown), for example. The semiconductor layer 20 functions as a well region.

A wiring layer 21 that functions as the select gate line SGS, a wiring layer 22 that functions as the dummy word line DWLS, wiring layers 23 that function as the word lines WL0 to WL7, a wiring layer 24 that functions as the dummy word line DWLD, and a wiring layer 25 that functions as the select gate line SGD are stacked sequentially on the semiconductor layer 20. The wiring layers 21 to 25 are formed of a conductive material. Interlayer insulating films are formed between the wiring layers.

A cylindrical hole (a memory hole) 26 is formed to extend through the wiring layers 21 to 25 and reach the semiconductor layer (the p type well region) 20. A gate insulating film 27 of the select transistor ST2 is formed in the periphery of the memory hole 26 on a region abutting the wiring layer 21. A block layer 28, a charge storage layer 29, and a gate insulating film 30 are formed sequentially on a region abutting the wiring layers 22 to 24. A gate insulating film 31 of the select transistor ST1 is formed on a region abutting the wiring layer 25. The inner portion of the memory hole 26 is sequentially filled with semiconductor layers 32 to 34.

According to the above description, the select transistor ST2, the dummy transistor DTS, the memory cell transistors MT0 to MT7, the dummy transistor DTD, and the select transistor ST1 are formed sequentially on the well region 20.

A metal wiring layer 35 is formed on the semiconductor layer 34 along a first direction. The wiring layer 35 functions as a bit line BL, and is connected to the semiconductor layers 34 in a plurality of the memory holes 26.

An n+ type impurity diffusion layer 36 is formed within the surface of the well region 20. The diffusion layer 36 is connected to a metal wiring layer 38 by a contact plug 37. The wiring layer 38 functions as the source line SL. A p+ type impurity diffusion layer 39 is also formed within the surface of the well region 20. The diffusion layer 39 is connected to a metal wiring layer 41 by a contact plug 40. The wiring layer 41 functions as well wiring CPWELL. The wiring layers 38 and 41 are upper layers in relation to the select gate line SGD, and are formed in lower layers than the wiring layer 35.

In the configuration described above, the wiring layers 22 to 24 are connected across adjacent string units SU, and the wiring layers 21 and 25 are separate for each string unit SU. In the string unit SU adjacent to the contact plug 37, the gate insulating film 27 and wiring layer 21 (the select gate line SGS) are provided up to a region near the diffusion layer 36. Accordingly, a channel formed in the select transistor ST2 is connected to the diffusion layer 36. Accordingly, during the reading of data, a channel is formed, not only in the semiconductor layer 32, but also in the surface of the well region 20, and due to the channel, the NAND string is electrically connected to the source line SL via the diffusion layer 36 and the contact plug 37.

1.1.3 Threshold Distribution of Transistors

Figure 4:
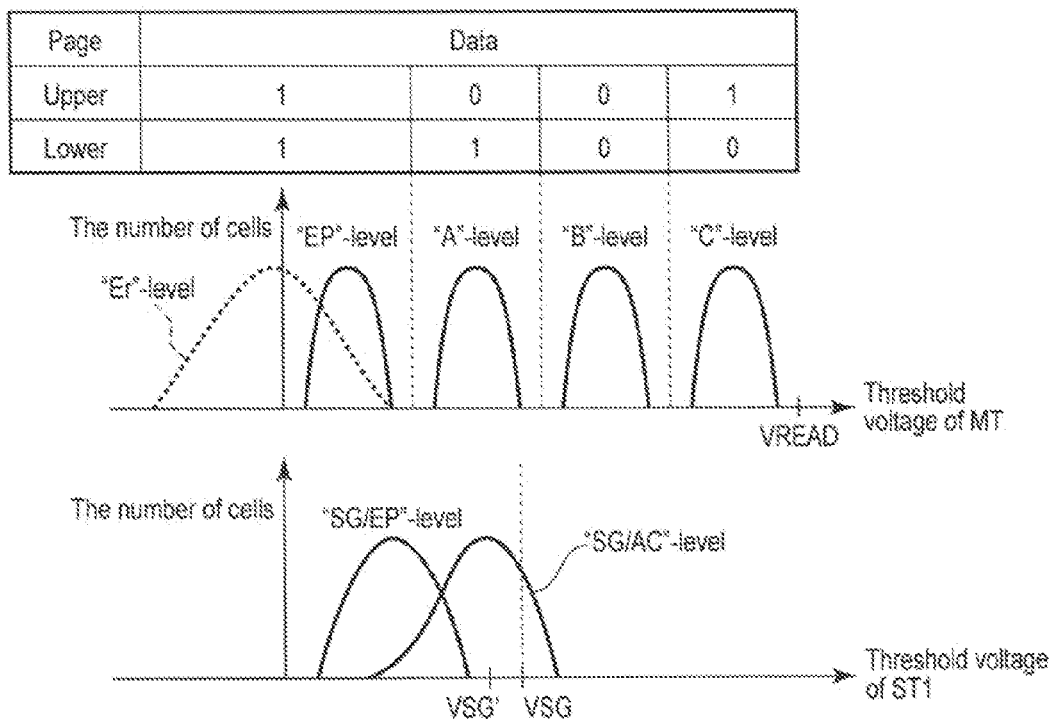
FIG. 4 is a graph showing a threshold distribution of memory cells according to the first embodiment.

FIG. 4 shows the data and threshold distribution that may be assumed by the memory cell transistors MT and the select transistor ST1 according to the present embodiment.

As illustrated, each of the memory cell transistors MT may hold, for example, two bits of data according to the threshold thereof. In order from the lowest threshold, the 2-bit data is, for example, "11", "01", "00", and "10".

The threshold of the memory cells holding the "11" data is an "Er" level or an "EP" level. The Er level is the threshold in a state in which the charge is drawn from the charge storage layer and the data is erased, and may assume not only a positive value, but also a negative value. The EP level is the threshold of a state in which the charge is injected into the charge storage layer, is equal to or greater than the Er level, and has a positive value.

The "01", "00", and "10" data are also thresholds of a state in which the charge is injected into the charge storage layer. The threshold of the memory cells holding the "01" data is an "A" level, which is higher than the Er level and the EP level. The threshold of the memory cells holding the "00" data is a "B" level, which is higher than the A level. The threshold of the memory cells holding the "10" data is a "C" level, which is higher than the B level. Naturally, the relationship between the 2-bit data and the threshold is not limited to this relationship. For example, a case may be adopted in which the "11" data corresponds to the "C" level, and the relationship between the two may be selected as appropriate.

The dummy transistors DTD and DTS hold the thresholds of the "Er" level or the "EP" level.

The threshold of the select transistor ST1 is generally set to the "SG/EP" level. This threshold is the level at which, when the select gate line SGD is selected and a voltage VSG is applied thereto in a normal read or write operation, all of the select transistors ST1 in the selected string unit SU turn on. The voltage is a value in the range from the EP level to the A level, for example. The threshold of the select transistor ST2 is also the "SG/EP" level.

Meanwhile, there is a case in which the threshold of the select transistor ST1 is set to the "SG/AC" level. The level is obtained by shifting the "SG/AC" level in the high voltage direction, and a portion of the threshold distribution is higher than VSG. Therefore, when the voltage VSG is applied to the select gate line SGD, within the selected page, a fixed number of the select transistors ST1 enter the off state. In the present embodiment, when the string unit SU is defective (a bad string), information indicating this may be written to the select transistor ST1 in the corresponding string unit SU. That is, by setting the threshold of the select transistor ST1 to be relatively high, marking is carried out to indicate that the corresponding string unit SU is a bad string. As a result of the marking being carried out, the threshold of the select transistor ST1 of the corresponding string unit SU is set to the "SG/AC" level.

The select transistor ST1 is marked during pre-shipping testing of the NAND flash memory 1, for example. The testing is performed using a tester, for example. The tester tests whether or not the memory cell transistors MT in the memory cell arrays 10 operate normally. When a defective page is discovered in the writing of the string unit SU, the tester injects a charge to the charge storage layer of all the select transistors ST1 of the corresponding string unit SU, and causes the thresholds thereof to rise from the "SG/EP" level to the "SG/AC" level.

As described above, marking the select transistors ST1 will be referred to as a second registration function hereinafter. It is possible to determine whether or not each string unit SU is a bad string by using a determination read that uses the second registration function. In the same manner as the first registration function, the second registration function is optional, and the NAND flash memory 1 may not include the second registration function.

As described above, the second registration function does not include a dedicated register group as the first registration function does, and is a method based on the marking information in the memory cell array. When the die sorting is completed, the locations to be marked are detected using the determination read (described hereinafter), and the defective string unit information is written to a ROM fuse or a management block in the chip in advance.

When the first registration function is employed, since the bad string unit information is registered together with the bad information in the registers in the chip, control may be easily performed such that the driving of the cell array is stopped even when a bad string unit is unintentionally accessed. Therefore, blocks which contain a short between the select gate lines of a string unit are not marked as bad blocks, and it is possible to treat just the string unit as being defective. However, since it is necessary to arrange multiple registers, there is a disadvantage in terms of the chip surface area.

In contrast, in the second registration function, since it is not particularly necessary to prepare registers or the like, there is no disadvantage in terms of the chip surface area. Since an operation such as setting the information in the registers is not necessary in POR (Power on Read; this operation is a reading operation from ROM data for example, when power is supplied to the semiconductor memory device 1), it is unnecessary to register the information to the ROM fuse, and there is no upper limit to the number of registrations. In other words, there is a limit to the information that may be registered to the ROM fuse; however, information may be written thereto to indicate that the information of the defective string units according to the second registration function will be written to one of the pages of one of the blocks BLK when the device is to be shipped.

Since there are pros and cons to the first and second registration functions, one or both may be implemented to meet the demands of the semiconductor memory device.

Next, description will be given hereinafter of the determination read when using the second registration function.

1.1.4 Details of Determination Read

Next, detailed description will be given of the determination read. The determination read is performed in a state in which the voltage VSG or VSG' which is lower than VSG (see FIG. 4), is applied to the select gate line SGD in the selected string unit, 0 V, for example, is applied to the select gate lines SGD in the unselected string units, the voltage VSG is applied to the select gate line SGS, and the voltage VREAD is applied to all the word lines WL (and the dummy word lines DWLD and DWLS). The voltage VREAD is a voltage which sets the memory cell transistors MT to an on state regardless of the data held therein.

Case without Marking

Figure 5:
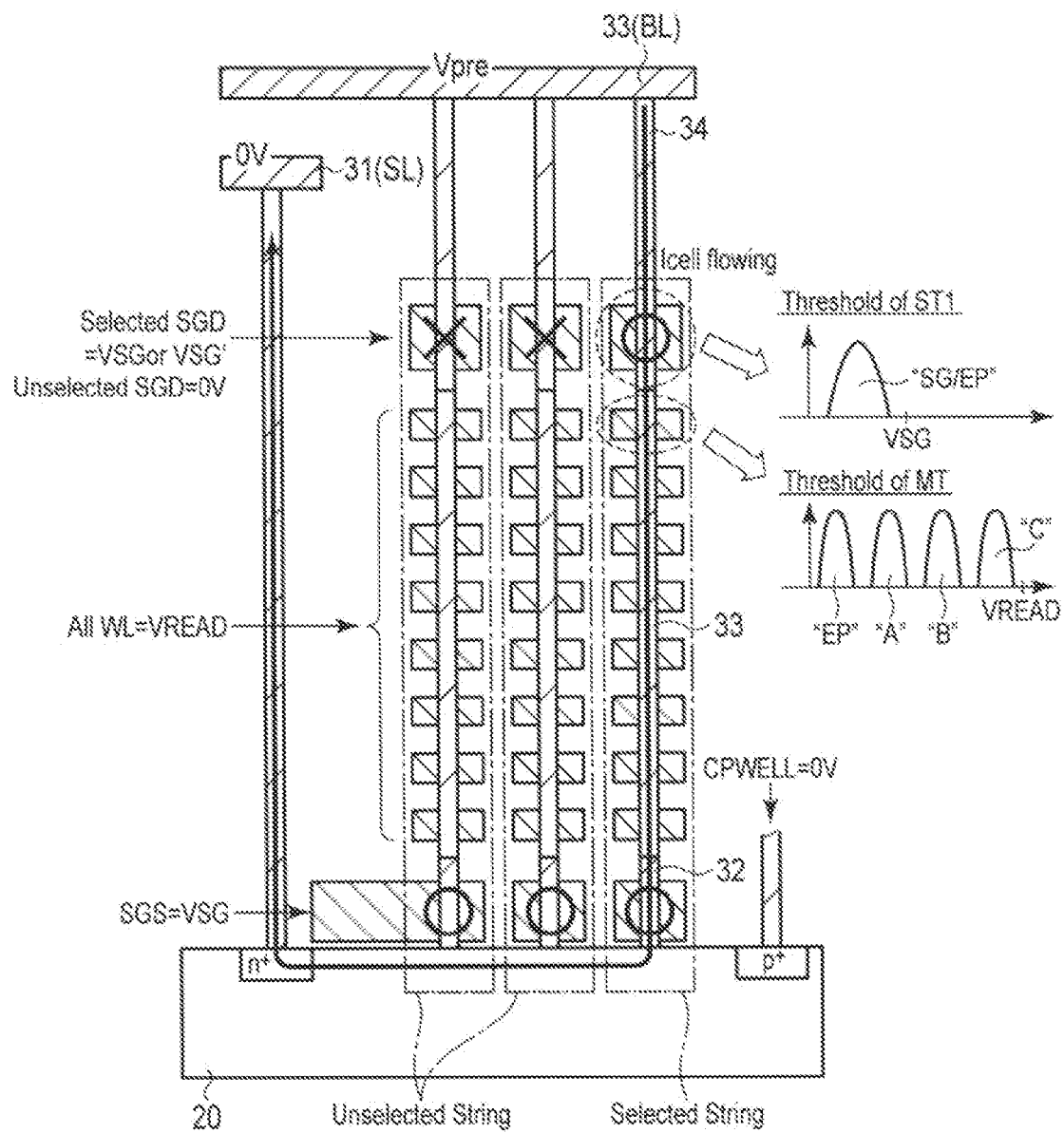
FIG. 5 is a cross-sectional diagram of the memory cell array according to the first embodiment.

First, description will be given of a case in which the select transistor ST1 of the selected string unit SU is not marked, using FIG. 5. FIG. 5 is a cross-sectional diagram taken across the bit line direction in which a partial region of the block BLK is simplified. Illustration of the dummy word lines DWLD and DWLS is omitted. In FIG. 5, the circular symbols given to the select transistors ST1 and ST2 indicate the on state, and the X symbols indicate the off state.

As illustrated, if the selected string unit SU is a good string, the threshold of the select transistor ST1 in the string unit SU is the SG/EP level. Therefore, the select transistors ST1 and ST2 are set to the on state by the voltages VSG or VSG' being applied thereto. All the memory cell transistors MT are set to the on state regardless of the held data by the voltage VREAD being applied thereto.

As a result, a cell current Icell flows from the bit line BL to the source line SL in all the NAND strings 13 in the corresponding string unit SU (the state of the bit line BL when Icell flows is defined as the "0" state (BL is the logical "L" level)).

In other words, when VREAD is applied to all the word lines WL and the data is read, if all the bit lines BL or a predetermined number or more of the bit lines BL are "0", it is possible to determine that the selected string unit SU is not marked as a bad string.

Case with Marking

Figure 6:
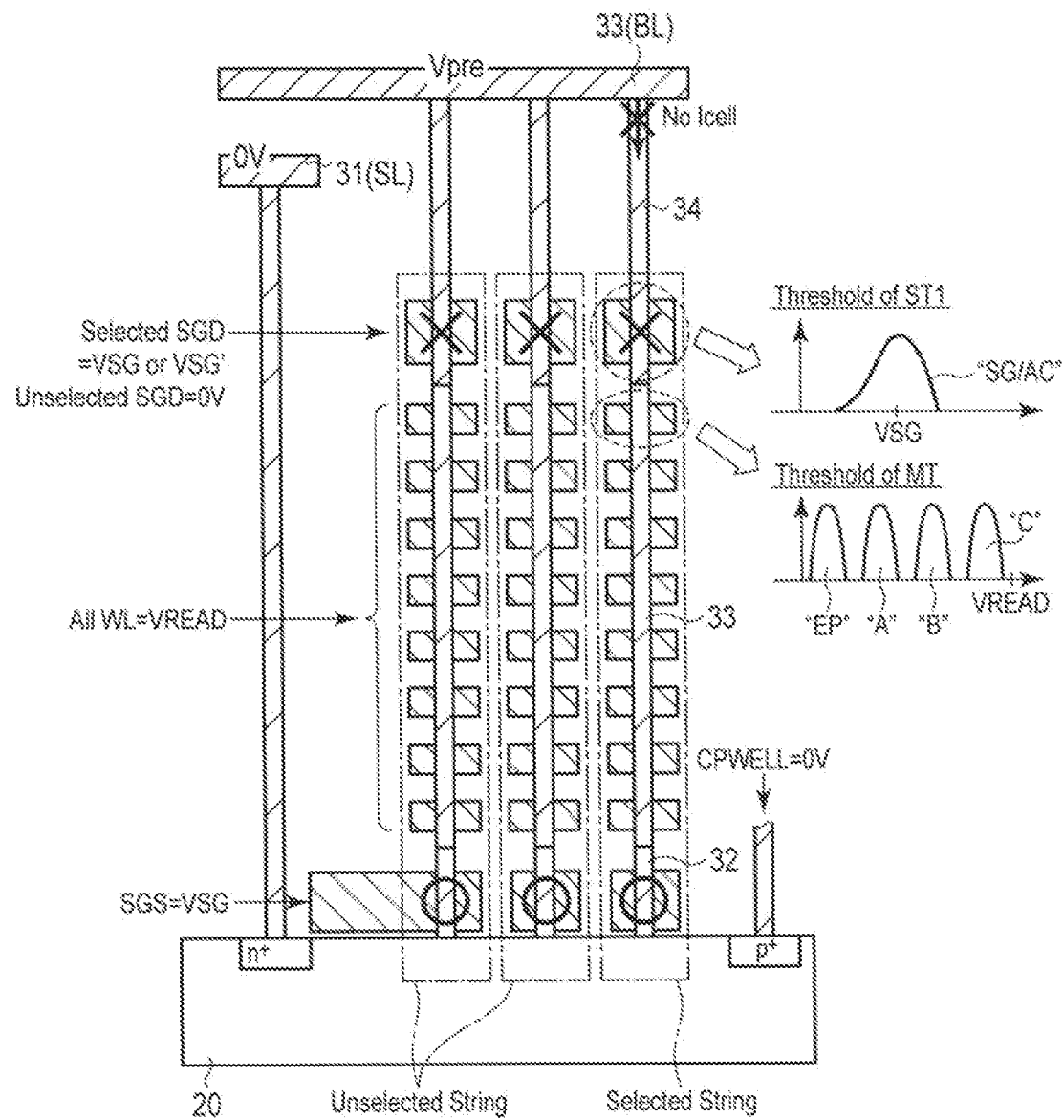
FIG. 6 is a cross-sectional diagram of the memory cell array according to the first embodiment.

Next, description will be given of a case in which the select transistor ST1 of the selected string unit SU is marked, using FIG. 6. In the same manner as FIG. 5, FIG. 6 is a cross-sectional diagram of a partial region of the block BLK taken across the bit line direction.

As illustrated, if the selected string unit is marked as a bad string, the threshold of the select transistor ST1 is the SG/AC level. Therefore, a predetermined number or more of the select transistors ST1 maintain the off state even if the voltages VSG or VSG' are applied thereto. A NAND string that is set to the off state is shown in FIG. 6.

As a result of the select transistor ST1 maintaining the off state, a cell current Icell does not flow in all the NAND strings 13 in the corresponding string unit SU (the state of the bit line BL in this case is defined as the "1" state (BL is the logical "H" level)).

In other words, when VREAD is applied to all the word lines WL and the data is read, if a predetermined number or more of the bit lines BL are "1", it is possible to determine that the selected string unit SU is marked as a bad string. For example, assuming that one page is 256 bytes, if 8 Kbyte or 16 Kbyte or more are in the off state, it is possible to determine that the page is marked as a bad string.

1.2 Erase Operation

Next, description will be given of the data erasure method of the NAND flash memory 1 according to the present embodiment.

1.2.1 Overall Flow of Erase Operation

Figure 7A:
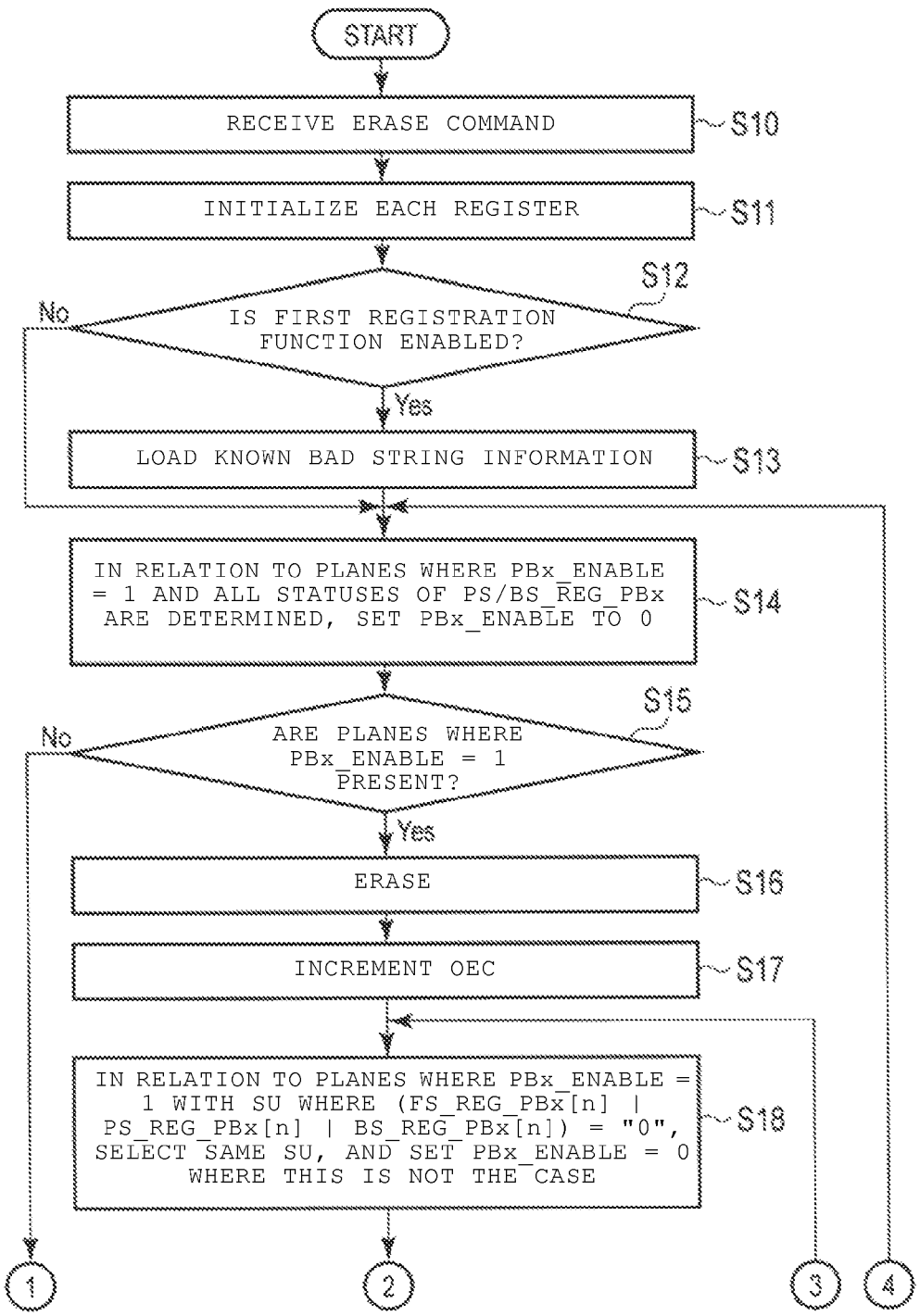
FIG. 7A is a flowchart of an erase operation according to the first embodiment.
Figure 7B:
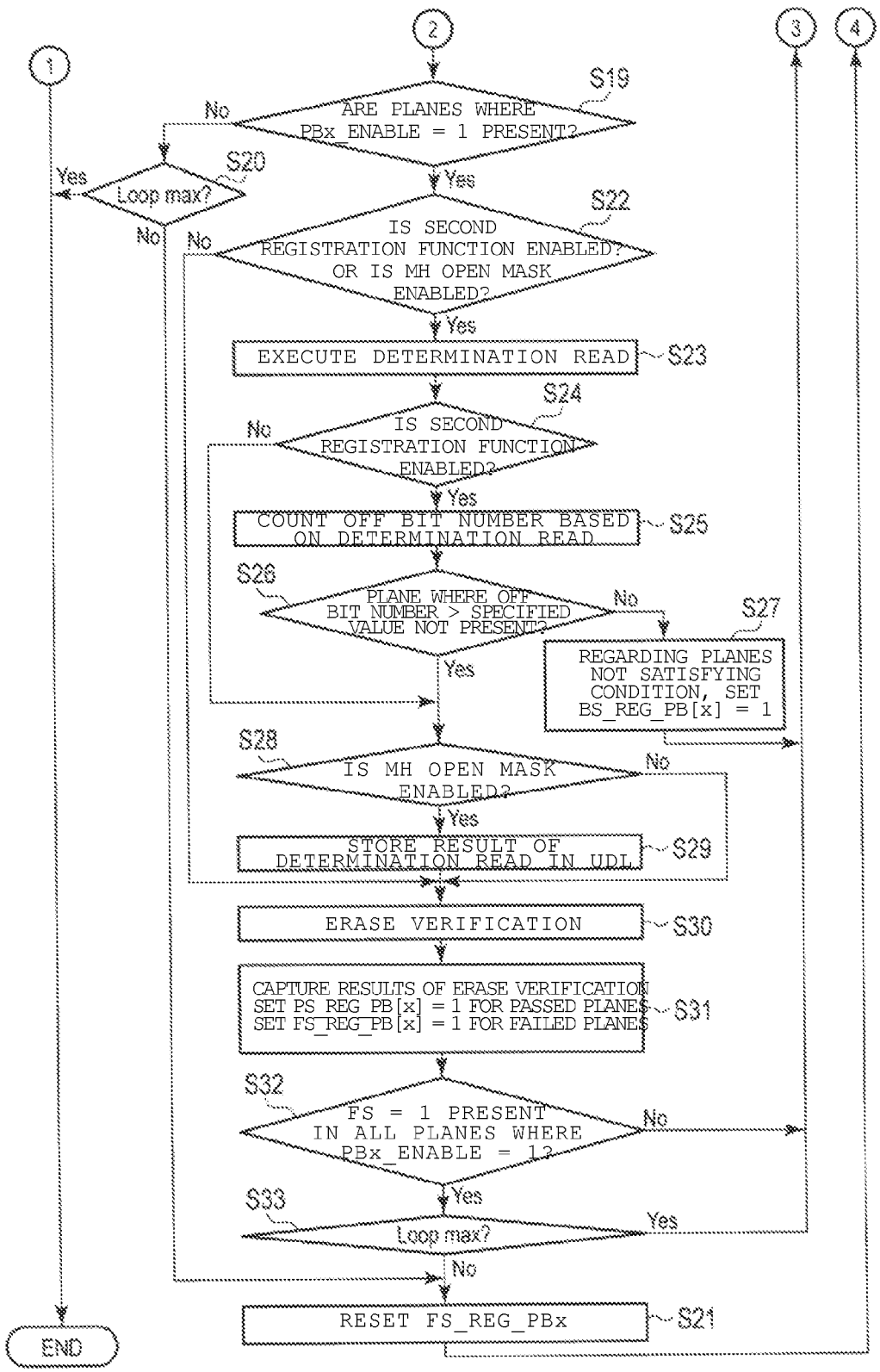
FIG. 7B is a flowchart continuing from FIG. 7A.

First, description will be given of the overall flow of the erase operation using FIGS. 7A and 7B. FIGS. 7A and 7B are a flow chart of the erase operation, FIG. 7B shows the processes continuing from FIG. 7A, and the processes in each step are mainly performed by the sequencer 14.

First, the logic circuit 2, receives the address of the plane and the block to be erased together with the erase command from the memory controller (step S10). The erase command that is received is stored in the command register (not shown).

The sequencer 14 initializes each register in response to the erase command (step S11). The initialization target register is the bad string register BS_REG, the failed string register FS_REG, the passed string register PS_REG or the like shown in FIG. 1.

Next, when the first registration function is enabled (YES in step S12), the sequencer 14 determines whether or not the block address received from the memory controller is registered in the partial bad information register 3. When the block address is registered, the bad string information thereof is loaded into the bad string register BS_REG (step S13). When the first registration function is disabled (NO in step S12), the sequencer 14 omits the process of step S13.

Next, the sequencer 14 confirms the signal PBx_ENABLE. In the present example, x=0 or 1 and is the plane number. The signal PBx_ENABLE corresponding to the plane address that is received in step S10 is asserted ("1" in the present example). When a plurality of planes are selected, a plurality of the signals PBx_ENABLE are asserted, and multi-plane operation ensues. The sequencer 14 confirms whether or not the statuses of all the passed string registers PS_REG_PBx, which correspond to planes where PBx_ENABLE="1", and all the bad string registers BS_REG_PBx are determined. When the registers PS_REG_PBx and BS_REG_PBx are determined, the signal PBx_ENABLE corresponding to the plane PBx is set to "0" (step S14). The signal PBx_ENABLE is a signal that is output by the sequencer 14, for example, and is a signal for enabling or disabling the plane PBx. In other words, when the plane PB0 is to be enabled, the sequencer 14 sets PB0_ENABLE="1", and when the plane PB1 is to be enabled, the sequencer 14 sets PB1_ENABLE="1".

Subsequently, the sequencer 14 confirms whether or not a plane PBx where PBx_ENABLE="1" is present (step S15). If such a plane PBx is not present (NO in step S15), the sequencer 14 ends the erase operation.

If PBx_ENABLE="1" in one of the planes PBx, the sequencer executes the erase operation in relation to the corresponding plane PBx (step S16). In other words, the sequencer 14 controls the row decoder 11 to draw the charge from the charge storage layer of the memory cell transistor MT of the selected plane PBx into the semiconductor layer 33 (detailed description will be given of step S16 in the second embodiment). As a result, the threshold voltage of the memory cell transistors MT is lowered.

The sequencer 14 increments a signal OEC indicating an erasure loop number (step S17). The erasure of the data is carried out using a combination of an operation of drawing out the charge from the charge storage layer in step S16, and an erase verification operation of confirming whether or not the threshold of the memory cell transistor MT has been changed to a predetermined value due to the operation of drawing out the charge from the charge storage layer. The threshold gradually approaches the predetermined value due to this combination of operation being repeated a plurality of times. The signal OEC is a signal indicating the repetition number. The step S17 is not limited to incrementing, and may decrement, for example, and as long as the signal OEC is a value indicating the erasure number, the signal OEC is not limited.

Next, the sequencer 14 confirms whether or not a string unit SUn is present where (FS_REG_PBx[n]|PS_REG_PBx[n]|BS_REG_PBx[n])="0" in planes where PBx_ENABLE="1" (where n is one of 0 to 3 and indicates one of the string units SU0 to SU3). The "|" symbol represents the logical OR operation. If such a string unit SU is present, the sequencer 14 selects the string unit SU, and if not present, the sequencer 14 sets the corresponding signal PBx_ENABLE to "0" (step S18).

The failed string register FS_REG, the passed string register PS_REG, and the bad string register BS_REG, are all data formed of at least the same number of bits as the string unit SU, in the same manner as the defect information held in the block register 3 of FIG. 1, for example. Each bit indicates whether or not the corresponding string unit SU is a bad string. For example, in the example of FIG. 1, since one block BLK contains four string units SU, each register FS_REG, PS_REG, and BS_REG holds at least four bits of data. In the case of the present example, the bits in each register indicate the states of the string units SU0 to SU3, in order from the lower bit of the four bits, when the string unit SU failed, passed, or is a bad string, the respective register is set to "1". Therefore, when the string unit SUn is not a bad string and is neither failed or passed in the erase verification, (FS_REG_PBx[n]|PS_REG_PBx[n]|BS_REG_PBx[n])="0" is satisfied.

Subsequently, the sequencer 14 confirms whether or not a plane where PBx_ENABLE="1" is present (step S19). If such a plane is not present (NO in step S19), the sequencer 14 determines whether or not the signal OEC has been reached the maximum repetition number (step S20). If the maximum repetition number is reached (YES in step S20), the sequencer ends the erase operation. Meanwhile, if the maximum repetition number is not reached (NO in step S20), the sequencer 14 resets the failed string register FS_REG_PBx (step S21). In other words, the sequencer 14 sets all the bits of the data relating to the string unit SU held in the FS_REG_PBx to "0". The sequencer 14 returns to the process of step S14.

When a plane where PBx_ENABLE="1" is present in step S19 (YES in step S19), the sequencer 14 determines whether or not the second registration function is enabled and whether or not a memory hole open mask function is enabled (step S22). The memory hole open mask function is an optional function of the NAND flash memory 1, for example, and is described in detail in the third embodiment. When at least one of the functions is enabled (YES in step S22), the sequencer 14 performs the determination read as illustrated in FIGS. 5 and 6 (step S23). When the second registration function is enabled (YES in step S24), the sequencer 14 counts the number of bits that are determined to be in the off state (the off bit number) based on the results of the determination read in step S23 (step S25).

Subsequently, the sequencer 14 determines if a plane that satisfies "off bit number>specified value which is determined in advance" is not present (step S26). In other words, in the two plane operation, when the plane PB0 satisfies "off bit number>specified value", the signal STR_FIXED_PB0 applies to the plane PB1, and the determination read is carried out once more in relation to the plane PB0 where the erase verification target string unit SU is not determined. In other words, if the above conditions are not satisfied, the bit corresponding to the string unit SU of the bad string register BS_REG_PBx relating to the corresponding plane is set to "1" (step S27). The sequencer 14 returns to the process of step S18.

If the conditions of step S24 are satisfied, the sequencer 14 subsequently determines whether or not the memory hole open mask function is enabled (step S28). If the memory hole open mask function is enabled (YES in step S28), the sequencer 14 stores the result of the determination read in step S23 in a latch circuit UDL of the sense amplifier 12 (step S29). If the memory hole open mask function is disabled (NO in step S28), step S29 is omitted.

Next, the sequencer 14 executes the erase verification (step S30). In step S22, when the second registration function and the memory hole open mask function are both disabled (NO in step S22), the sequencer 14 proceeds to the process of step S30. In other words, the sequencer 14 confirms whether or not the threshold of the memory cell transistor MT in one of the selected string units SU has been dropped to a predetermined level. Detailed description will be given of the erase verification in the second embodiment.

Subsequently, the sequencer 14 captures the results of the erase verification on the inner portion thereof (step S31). The sequencer 14 sets the bit of the PS_REG_PBx corresponding to the string unit SU of the plane which passed the erase verification to "1". Meanwhile, the sequencer 14 sets the bit of the FS_REG_PBx corresponding to the string unit SU of the plane that failed to "1".

Subsequently, the sequencer 14 determines whether or not one of the bits of FS_REG is "1" in relation to all the planes where PBx_ENABLE="1" (step S32). When FS_REG="1" in one of the planes, that is, when a plane that continues to pass is present among the planes where PBx_ENABLE="1" (NO in step S32), the sequencer 14 returns to the process of step S18. Meanwhile, when one of the bits of FS_REG is "1" in all of the planes where PBx_ENABLE="1" (YES in step S32), the sequencer 14 determines whether or not the signal OEC has been reached the maximum repetition number (step S33). If the signal OEC has been reached the maximum repetition number (YES in step S33), the sequencer 14 returns to the process of step S18. Meanwhile, if the maximum repetition number is not reached (NO in step S33), the sequencer 14 proceeds to the process of step S21.

The processes of steps S18, S19 and S22 to S29 are performed in relation to a plane where the signal STR_FIXED_PBx (described hereinafter) is the "L" level. That is, the processes are performed on the planes where the erase verification target is not determined. In other words, the processes of steps S18, S19 and S22 to S27 are performed in order to determine the string unit SU to be the erase verification target, and are repeated until the erase verification target is determined. When both the first and second registration functions are disabled, the string unit SU with the smallest string address is set to the erase verification target, of the string units SU where FS_REG, PS_REG, and BS_REG are all "0". When the first registration function is enabled, the string unit SU that is determined not to be marked in the determination read and which has the smallest string address is set to the erase verification target, of the string units SU where FS_REG, PS_REG, and BS_REG are all "0".

The processes that follow step S16 are only executed in relation to planes where PBx_ENABLE="1".

1.2.2 Specific Example 1 of Erase Operation

Figure 8A:
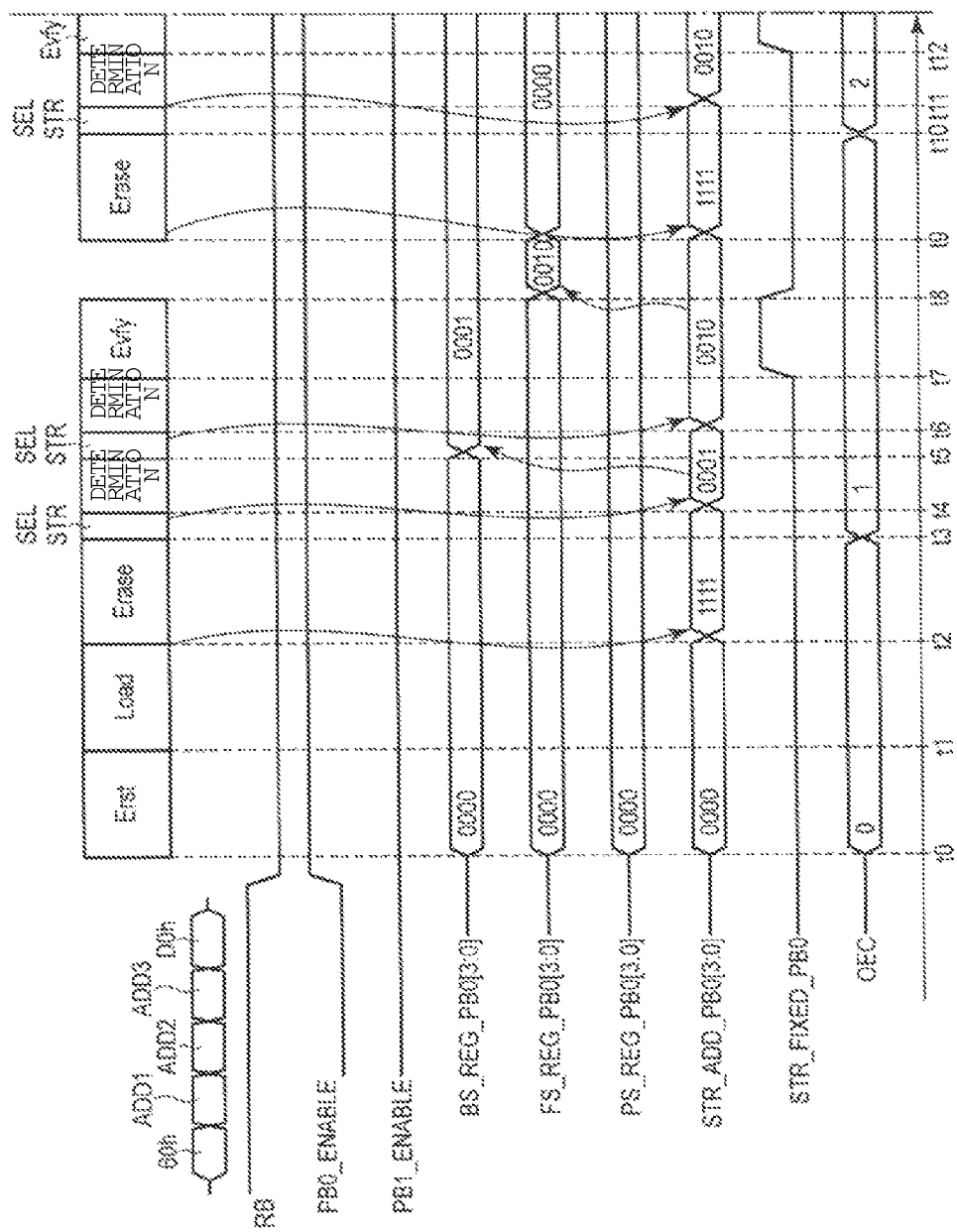
FIG. 8A is a timing chart of the erase operation according to the first embodiment.
Figure 8B:
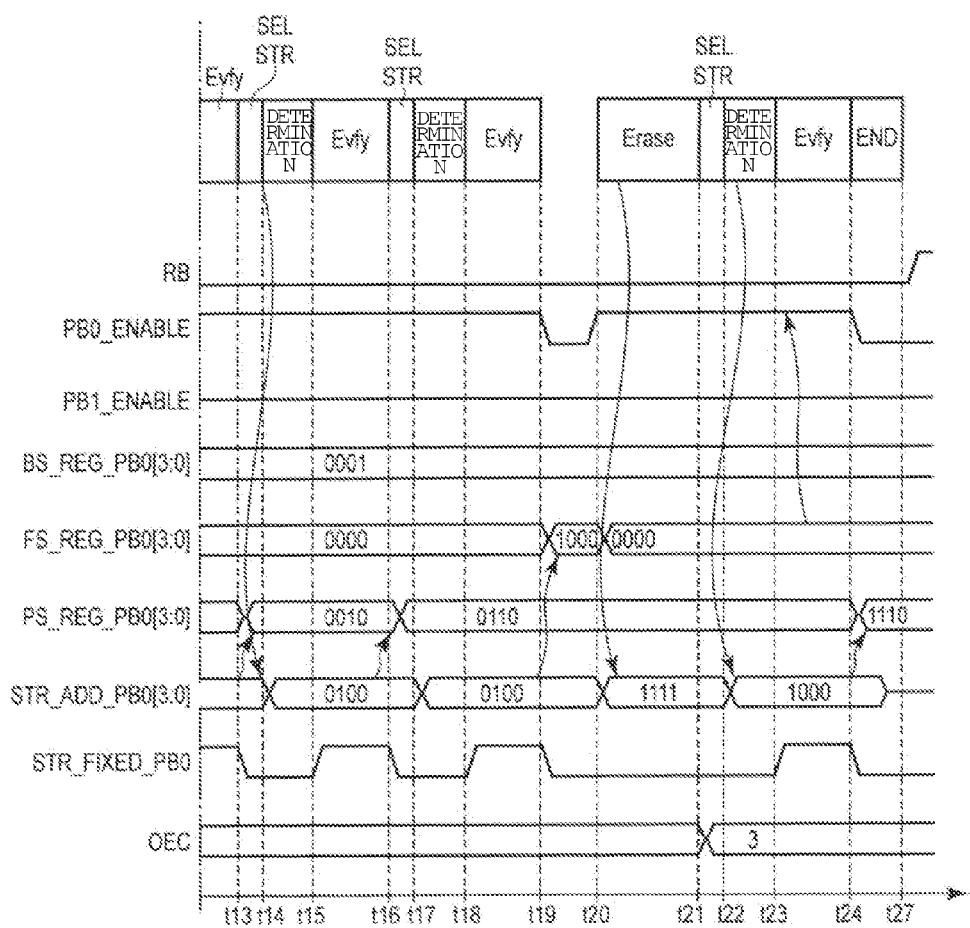
FIG. 8B is a timing chart continuing from FIG. 8A.

First, description will be given of the single plane operation in the specific example of the erase operation, using FIGS. 8A, 8B and 9 to 23. FIGS. 8A and 8B are each a timing chart showing the changes of the various signals during the erase operation in a sequential manner. FIGS. 9 to 23 are schematic diagrams showing the state of the selected block BLK, and the selected string units SU are shaded with diagonal lines. Hereinafter, description will be given exemplifying a case in which one of the blocks BLK of the plane PB0 is the erasure target, and both the first registration function and the second registration function are enabled.

The NAND flash memory 1 outputs a ready-or-busy signal RB that indicates whether the NAND flash memory 1 is in a ready state, in which a command may be received from the memory controller, or a busy state, in which a command may not be received. In the present example, in the ready state, RB="H", and in the busy state, RB="L".

When the NAND flash memory 1 is in the ready state, the memory controller issues the erase command. In other words, the memory controller issues a block erase command "60h", subsequently issues the block addresses ADD1 to ADD3 indicating the blocks BLK to be the erasure target, and finally issues the command "D0h".

The sequencer 14 receives these commands and starts the erase operation, and the NAND flash memory 1 enters the busy state. The sequencer 14 sets the signal PB0_ENABLE of the plane PB0, which is the erasure target, to an "H" level, and maintains the signal PB1_ENABLE of the plane PB1, which is not an erasure target, at an "L" level.

Figure 9:
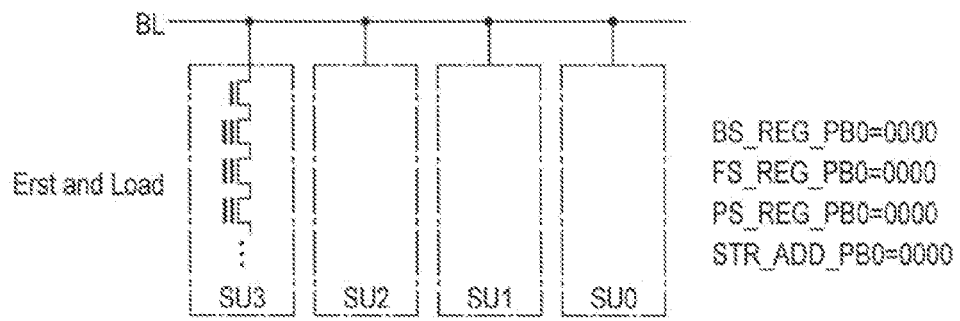
FIG. 9 is a schematic diagram showing a block during erasure according to the first embodiment.

First, the sequencer 14 resets each register (times t0 to t1). As a result, the data of each register BS_REG_PB0, FS_REG_PB0, and PS_REG_PB1 is set to "0000". The 4-bit data indicates the states of the string units SU0 to SU3, in order from the lower bit. This state is shown in FIG. 9. The sequencer 14 resets the string address register STR_ADD_PB0 of the logic circuit to "0000". A register STR_ADD_ is provided for each plane, and bits of the 4-bit data are set to "1" when selecting the string units SU0 to SU3, in order from the lower bit. The sequencer 14 sets the signal STR_FIXED_PB0 to the "L" level. A signal STR_FIXED_is also provided for each plane, the target string to undergo erase verification is determined by the signal STR_FIXED_being set to the "H" level, and it is possible to execute the erase verification. The sequencer 14 sets the signal OEC to "0".

Next, the sequencer 14, loads the positional information of the defects from the partial bad information register 3 (times t1 to t2). In the present example, a case is illustrated in which the partial bad information register 3 holds information indicating that none of the string units SU of the selected block are defective. Therefore, the data of the register BS_REG_PB0 is still "0000".

Figure 10:
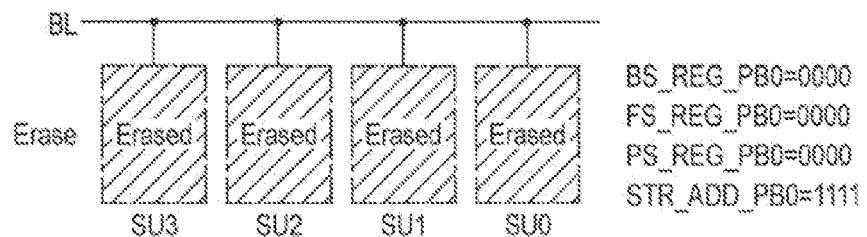
FIG. 10 is a schematic diagram showing a block during erasure according to the first embodiment.

Next, the sequencer 14 erases the data of the selected block BLK (times t2 to t3). This state is shown in FIG. 10. The sequencer 14 sets the data of the register STR_ADD_PB0 to "1111". As a result, the data of all the string units SU0 to SU3 is erased at once. The sequencer 14 increments the signal OEC to "1".

Next, the sequencer 14 selects one of the string units SU in order to perform the determination read of the second registration function (times t3 to t4). In the present example, the bits corresponding to the registers BS_REG, FS_REG, and PS_REG are "0", and are selected in order from the string unit with the smallest string address. Therefore, in order to select the string unit SU0, the sequencer 14 sets the register STR_ADD_PB0 to "0001".

Figure 11:
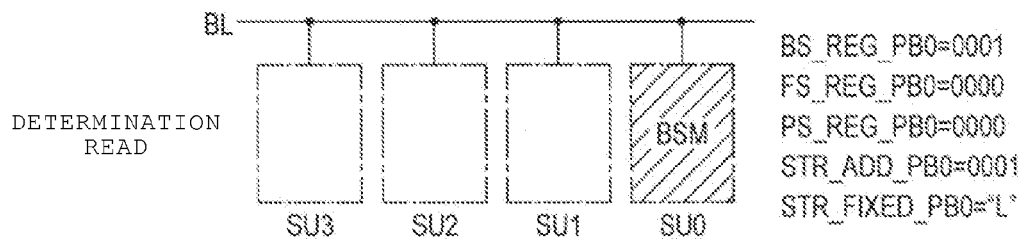
FIG. 11 is a schematic diagram showing a block during erasure according to the first embodiment.

The sequencer 14 performs the determination read (times t4 to t5). This state is shown in FIG. 11. In other words, the determination read is performed on the string unit SU0. In the present example, a case is illustrated in which the select transistor ST1 of the string unit SU0 is marked (such string units SU are assigned the symbol "BSM"). Therefore, the sequencer 14 updates the register BS_REG_PB0 from "0000" to "0001" (time t5). In this state, since the string unit SU to be the erase verification target is yet to be determined, the signal STR_FIXED_PB0 is still the "L" level.

Since the determination read is to be performed again, the sequencer 14 sets the register STR_ADD_PB0 to "0010" and selects the string unit SU1 (times t5 to t6).

Figure 12:
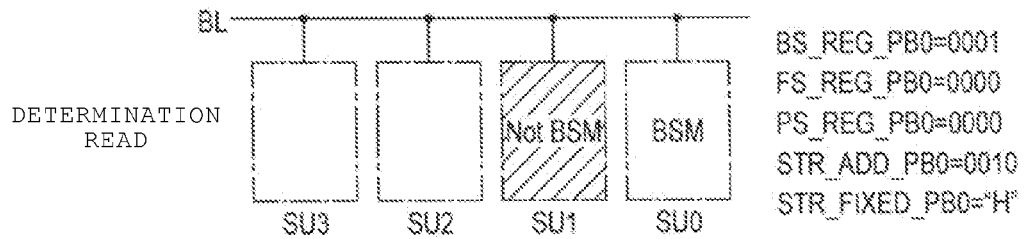
FIG. 12 is a schematic diagram showing a block during erasure according to the first embodiment.

The sequencer 14 performs the determination read (times t6 to t7). This state is shown in FIG. 12. As illustrated, in the present example, it is assumed that the string unit SU1 is not marked in the determination read (such string units SU are assigned the symbol "not BSM").

Therefore, the sequencer 14 sets the signal STR_FIXED_PB0 to the "H" level (time t7).

Figure 13:
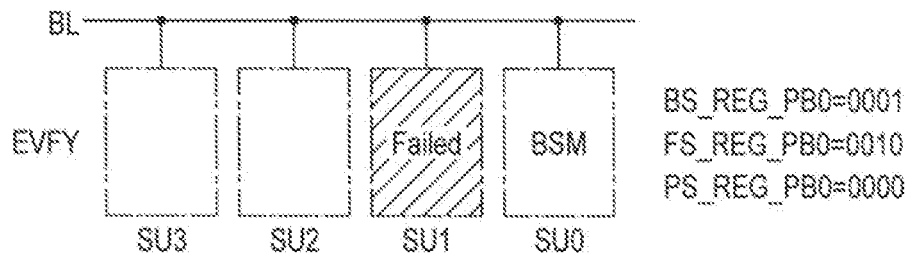
FIG. 13 is a schematic diagram showing a block during erasure according to the first embodiment.

The sequencer 14 executes the erase verification by setting the signal STR_FIXED_PB0 to the "H" level (times t7 to t8). This state is shown in FIG. 13. Since the register STR_ADD_PB0="0010", SU1 is the erase verification target string unit. As shown in FIG. 13, it is assumed that the string unit SU1 failed the erase verification. Thus, the sequencer 14 updates the register FS_REG_PB0 from "0000" to "0010" (time t8).

Since the bit of FS_REG is raised to "1" (YES in step S32), the sequencer 14 resets the FS_REG to "0000" (step S21), and returns to step S14 (BS_REG is maintained at "0001").

Figure 14:
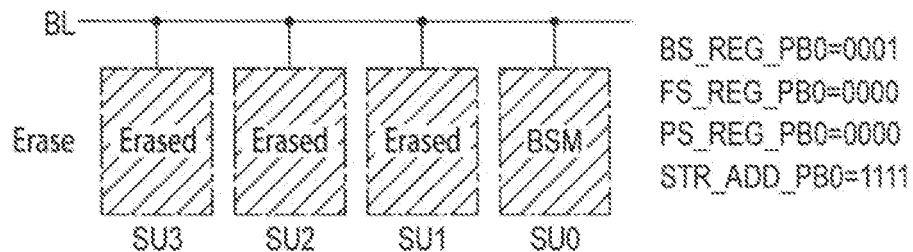
FIG. 14 is a schematic diagram showing a block during erasure according to the first embodiment.

The sequencer 14 erases the data of the selected block BLK (times t9 to t10). This state is shown in FIG. 14. The sequencer 14 sets the data of the register STR_ADD_PB0 to "1111". As a result, the data of all the string units SU0 to SU3 is erased at once. The sequencer 14 increments the signal OEC to "2".

Next, the sequencer 14 selects one of the string units SU in order to perform the determination read (times t10 to t11). At this time, since the string unit SU is determined to be a bad string, the sequencer 14 sets the register STR_ADD_PB0 to "0010" in order to select the string unit SU1.

Figure 15:
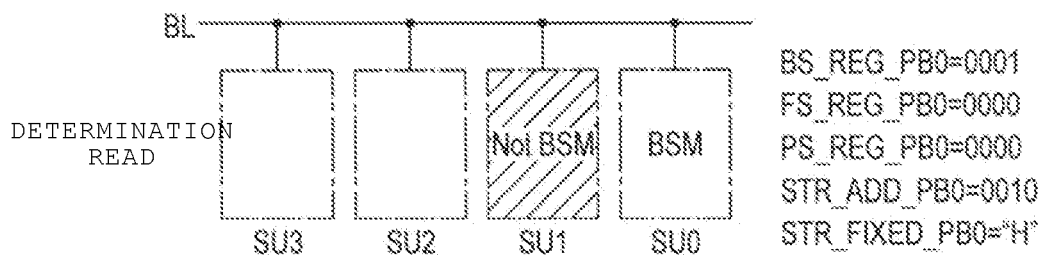
FIG. 15 is a schematic diagram showing a block during erasure according to the first embodiment.

The sequencer 14 performs the determination read (times t11 to t12). This state is shown in FIG. 15. As illustrated, in the present example, it is assumed that the string unit SU1 is not marked in the determination read.

Figure 16:
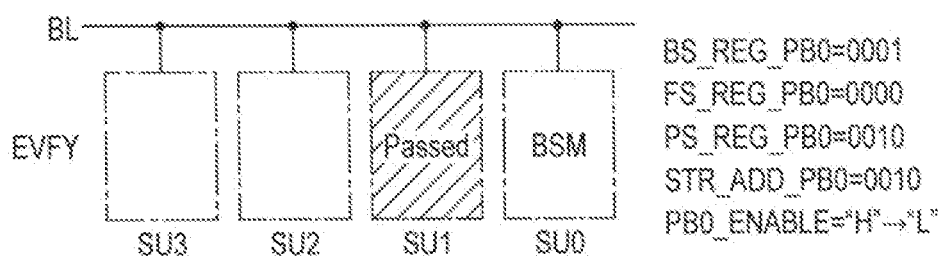
FIG. 16 is a schematic diagram showing a block during erasure according to the first embodiment.

Therefore, the sequencer 14 sets the signal STR_FIXED_PB0 to the "H" level (time t12), and executes the erase verification (times t12 to t13). This state is shown in FIG. 16. Since the register STR_ADD_PB0="0010", SU1 is the erase verification target string unit. As shown in FIG. 16, it is assumed that the string unit SU1 passed the erase verification. Thus, the sequencer 14 updates the register FS_REG_PB0 from "0000" to "0010" (time t13).

At this time, since the bit of FS_REG is not raised to "1" (NO in step S32), the sequencer 14 subsequently performs the determination read. In other words, since the statuses of the string units SU0 and SU1 are determined at this time, the sequencer 14 sets the register STR_ADD_PB0 to "0100" and selects the string unit SU2 (time t14).

Figure 17:
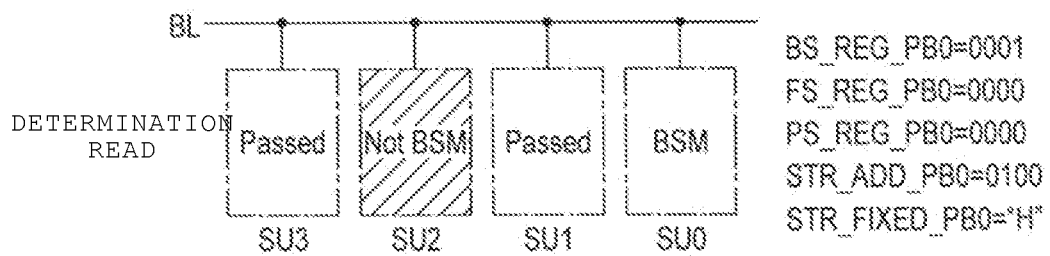
FIG. 17 is a schematic diagram showing a block during erasure according to the first embodiment.

The sequencer 14 performs the determination read (times t14 to t15). This state is shown in FIG. 17. As illustrated, in the present example, it is assumed that the string unit SU1 is not marked in the determination read.

Figure 18:
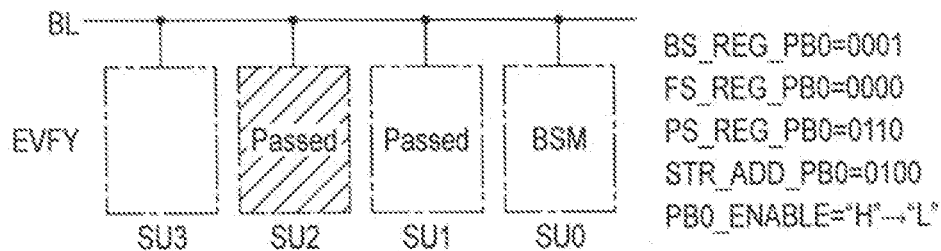
FIG. 18 is a schematic diagram showing a block during erasure according to the first embodiment.

Therefore, the sequencer 14 sets the signal STR_FIXED_PB0 to the "H" level (time t15), and executes the erase verification (times t15 to t16). This state is shown in FIG. 18. Since the register STR_ADD_PB0="0100", SU2 is the erase verification target string unit. As shown in FIG. 18, it is assumed that the string unit SU2 passed the erase verification. Thus, the sequencer 14 updates the register PS_REG_PB0 from "0010" to "0110" (time t16).

At this time, since the bit of FS_REG is not raised to "1" (NO in step S32), the sequencer 14 subsequently performs the determination read. In other words, the sequencer 14 sets the register STR_ADD_PB0 to "1000" and selects the string unit SU3 (time t17).

Figure 19:
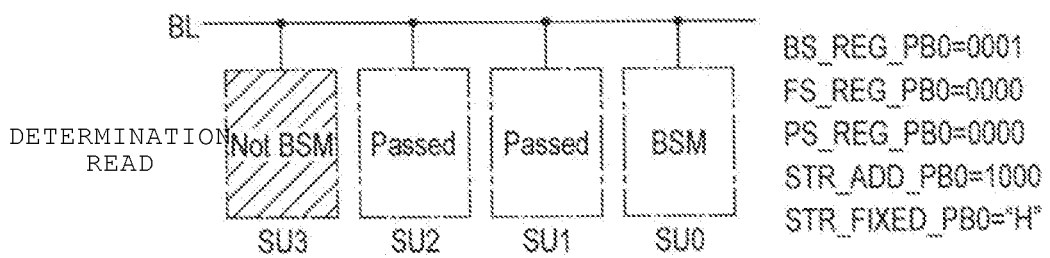
FIG. 19 is a schematic diagram showing a block during erasure according to the first embodiment.

The sequencer 14 performs the determination read (times t17 to t18). This state is shown in FIG. 19. As illustrated, in the present example, it is assumed that the string unit SU1 is not marked in the determination read.

Figure 20:
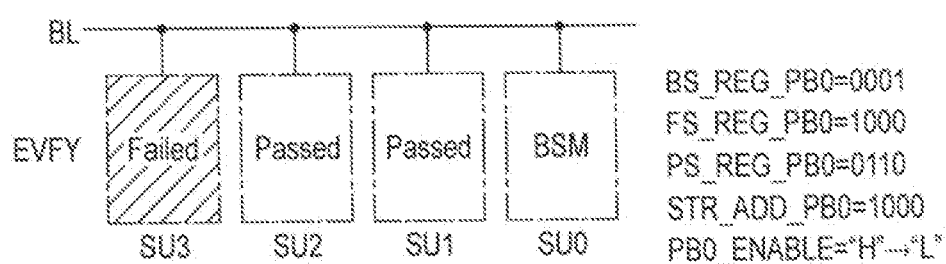
FIG. 20 is a schematic diagram showing a block during erasure according to the first embodiment.

Therefore, the sequencer 14 sets the signal STR_FIXED_PB0 to the "H" level (time t18), and executes the erase verification (times t18 to t19). This state is shown in FIG. 20. Since the register STR_ADD_PB0="1000", SU3 is the erase verification target string unit. As shown in FIG. 20, it is assumed that the string unit SU3 failed the erase verification. Thus, the sequencer 14 updates the register FS_REG_PB0 from "0000" to "1000" (time t19).

Since the bit of FS_REG is raised to "1" (YES in step S32), the sequencer 14 resets the FS_REG to "0000" (step S21), and returns to step S14 (BS_REG is maintained at "0001" and PS_REG is maintained at "0110").

Figure 21:
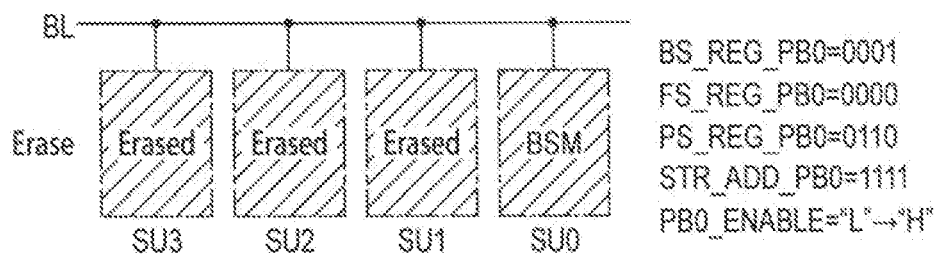
FIG. 21 is a schematic diagram showing a block during erasure according to the first embodiment.

The sequencer 14 erases the data of the selected block BLK (times t20 to t21). This state is shown in FIG. 21. The sequencer 14 sets the data of the register STR_ADD_PB0 to "1111". As a result, the data of all the string units SU0 to SU3 is erased at once. The sequencer 14 increments the signal OEC to "3".

Next, the sequencer 14 selects one of the string units SU in order to perform the determination read (times t21 to t22). At this time, since the statuses of the string units SU0 to SU2 are determined, the sequencer 14 sets the register STR_ADD_PB0 to "1000" in order to select the string unit SU3.

Figure 22:
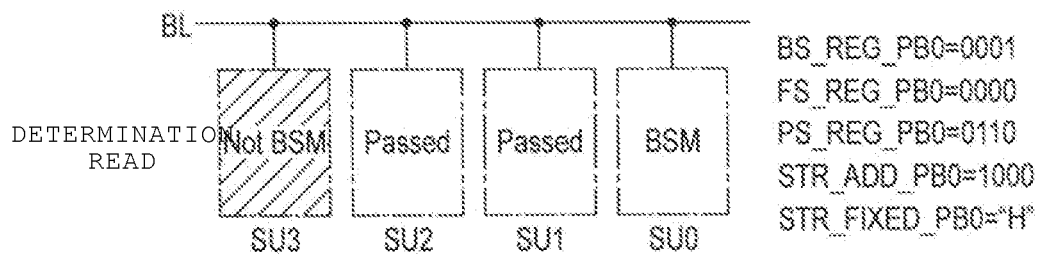
FIG. 22 is a schematic diagram showing a block during erasure according to the first embodiment.

The sequencer 14 performs the determination read (times t22 to t23). This state is shown in FIG. 22. In other words, the determination read is performed on the string unit SU3. As illustrated, in the present example, it is assumed that the string unit SU1 is not marked in the determination read.

Figure 23:
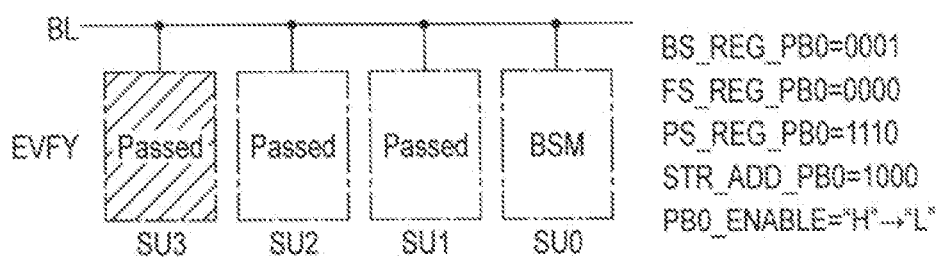
FIG. 23 is a schematic diagram showing a block during erasure according to the first embodiment.

Therefore, the sequencer 14 sets the signal STR_FIXED_PB0 to the "H" level (time t23), and executes the erase verification (times t23 to t24). This state is shown in FIG. 23. Since the register STR_ADD_PB0="1000", SU3 is the erase verification target string unit. As shown in FIG. 23, it is assumed that the string unit SU1 passed the erase verification. Thus, the sequencer 14 updates the register PS_REG_PB0 from "0110" to "1110" (time t24).

Thereby, all the statuses of PS_REG and BS_REG are determined in the plane PB0 at this time. Therefore, the sequencer 14 sets the PB0_ENABLE to "0" and ends the process.

1.2.3 Specific Example 2 of Erase Operation

Figure 24A:
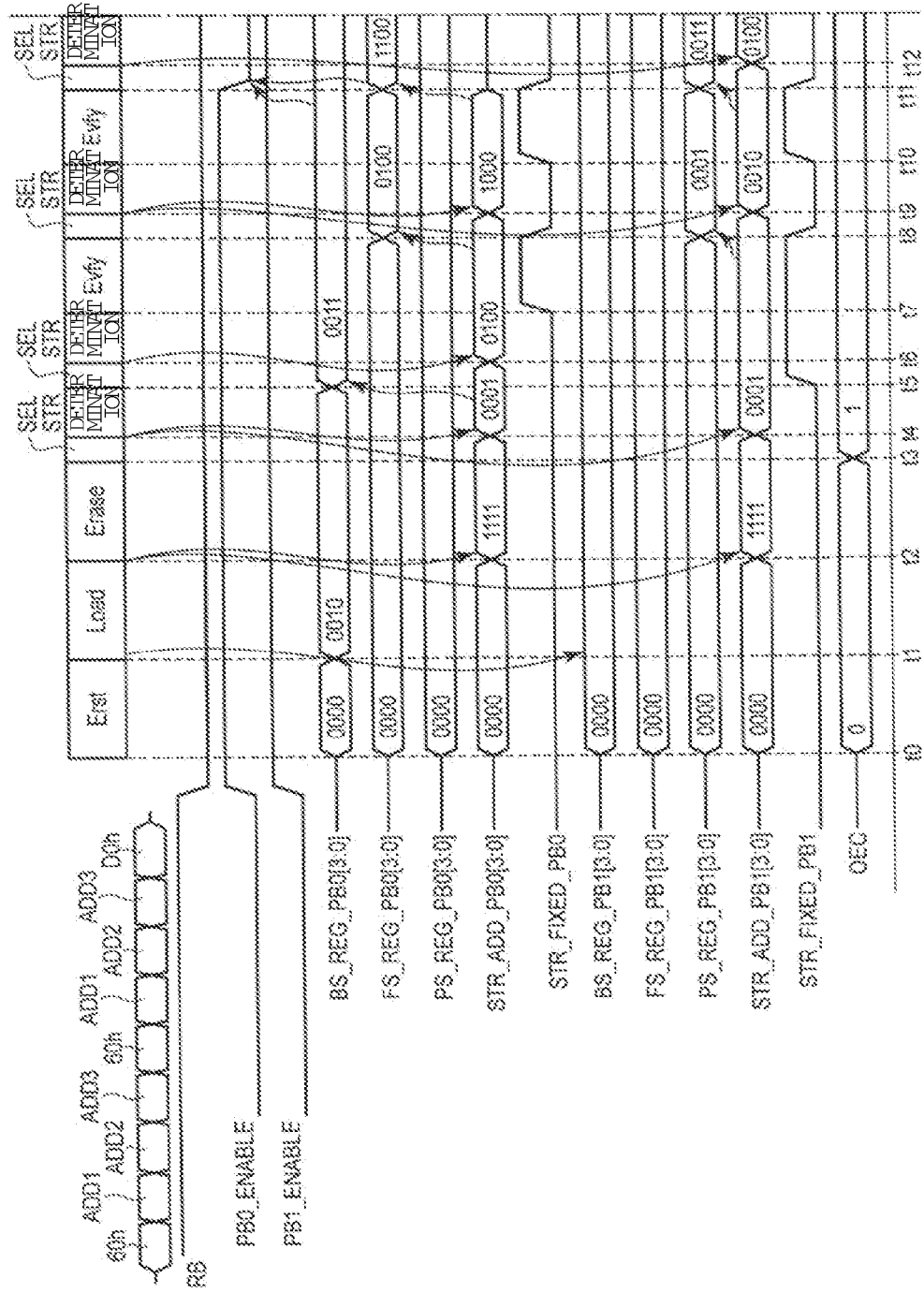
FIG. 24A is a timing chart of the erase operation according to the first embodiment.
Figure 24B:
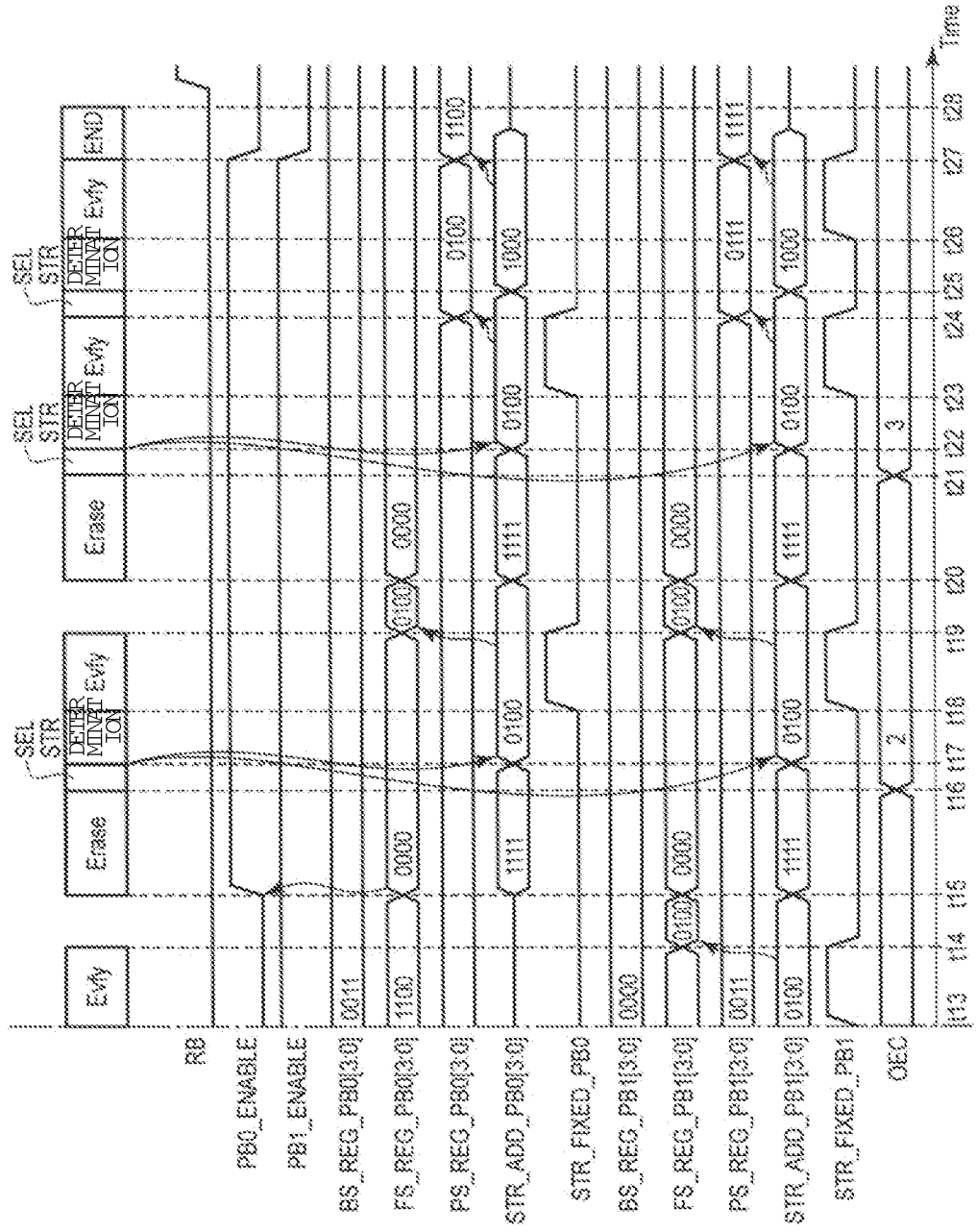
FIG. 24B is a timing chart continuing from FIG. 24A.

Next, description will be given of the multi-plane operation in the specific example of the erase operation. Hereinafter, description will be given of a case in which the erase operation is executed at the same time in relation to the two planes PB0 and PB1, using FIGS. 24A, 24B and 25 to 36. FIGS. 24A and 24B are each a timing chart showing the changes of the various signals during the erase operation in a sequential manner. FIGS. 25 to 36 are schematic diagrams showing the state of the selected blocks BLK in the two planes PB0 and PB1. Hereinafter, description will be given with a particular focus on points that differ from the single-plane operation. The same is true of a case in which the erase operation is executed at the same time in relation to three or more planes.

As illustrated, first, the memory controller issues the block erase command "60h". Subsequently, the memory controller issues the block addresses ADD1 to ADD3 specifying the blocks BLK of the plane PB0, further issues the block addresses ADD1 to ADD3 specifying the blocks BLK of the plane PB1, and finally issues the command "D0h".

The sequencer 14 receives the command "D0h" and sets the signals PB0_ENABLE and PB1_ENABLE to the "H" level.

Figure 25:
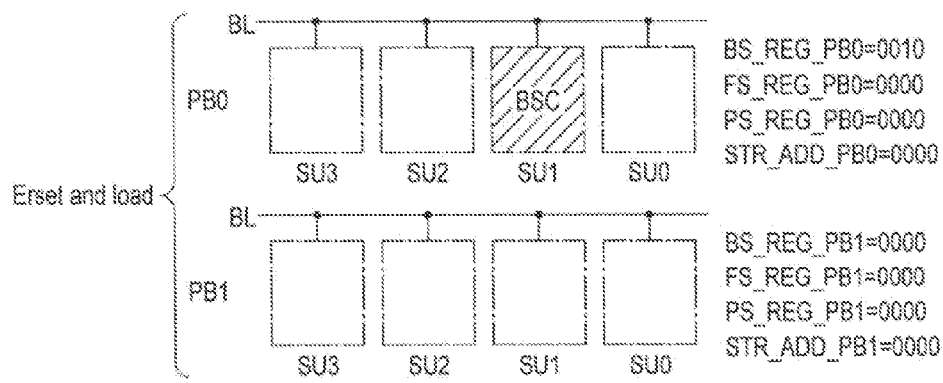
FIG. 25 is a schematic diagram showing a block during erasure according to the first embodiment.

In the same manner as during the single-plane operation, the sequencer 14 first resets each register (times t0 to t1), and next loads the positional information of the defects from the partial bad information register 3 (times t1 to t2). This state is shown in FIG. 25. In the present example, the partial bad information register 3 holds information indicating that the string unit SU1 in the selected block of the plane PB0 is a bad string (such string units are assigned the symbol "BSC"). Therefore, the sequencer 14 sets the register BS_REG_PB0 to "0010".

Figure 26:
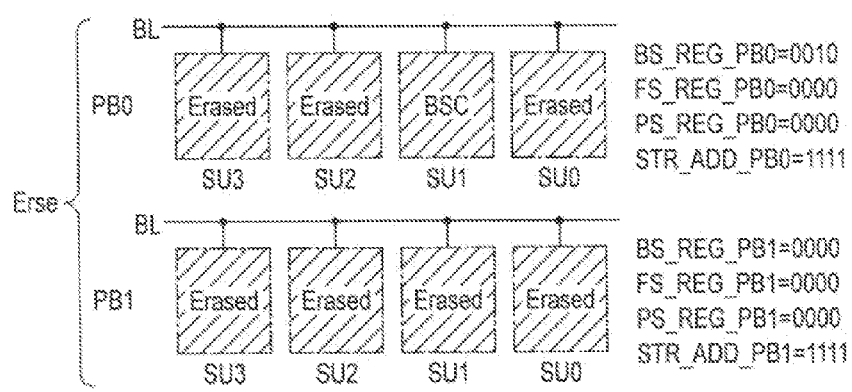
FIG. 26 is a schematic diagram showing a block during erasure according to the first embodiment.

Next, the sequencer 14 erases the data of the planes PB0 and PB1 at the same time (times t2 to t3). This state is shown in FIG. 26.

Figure 27:
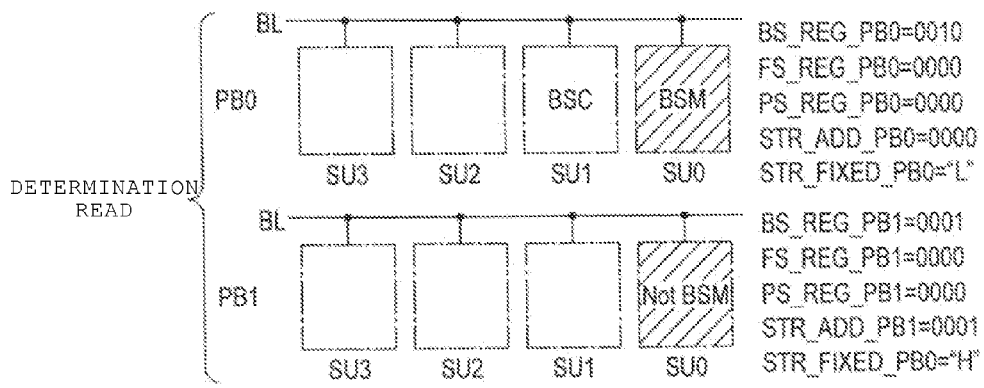
FIG. 27 is a schematic diagram showing a block during erasure according to the first embodiment.

Next, the sequencer 14 performs the determination read in relation to the string units SU0 of the planes PB0 and PB1 (times t3 to t5). This state is shown in FIG. 27. As illustrated, since the select transistor ST1 of the string unit SU0 of the plane PB0 is marked, the sequencer 14 updates the BS_REG_PB0 from "0010" to "0011" (time t5). The signal STR_FIXED_PB0 stays at the "L" level. Meanwhile, in the determination read of the string unit SU0 of the plane PB1, the string unit SU0 is determined not to be marked. Therefore, the sequencer 14 sets the signal STR_FIXED_PB1 to the "H" level (time t5).

Figure 28:
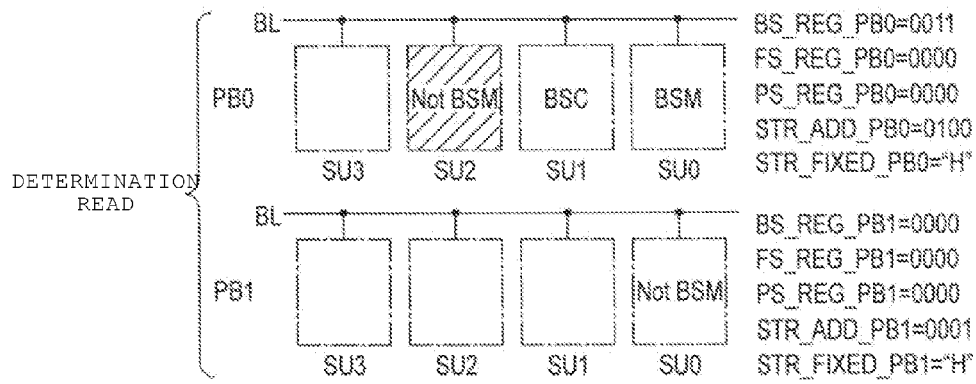
FIG. 28 is a schematic diagram showing a block during erasure according to the first embodiment.

At this time, the string unit to be the erase verification target is determined in the plane PB1; however, the string unit is yet to be determined in the plane PB0. Therefore, next, the sequencer 14 performs the determination read only on the plane PB0 (times t5 to t7). This state is shown in FIG. 28. As illustrated, in the determination read of the string unit SU0 of the plane PB0, the string unit SU0 is determined not to be marked. Accordingly, the signal STR_FIXED_PB0 is set to the "H" level.

Figure 29:
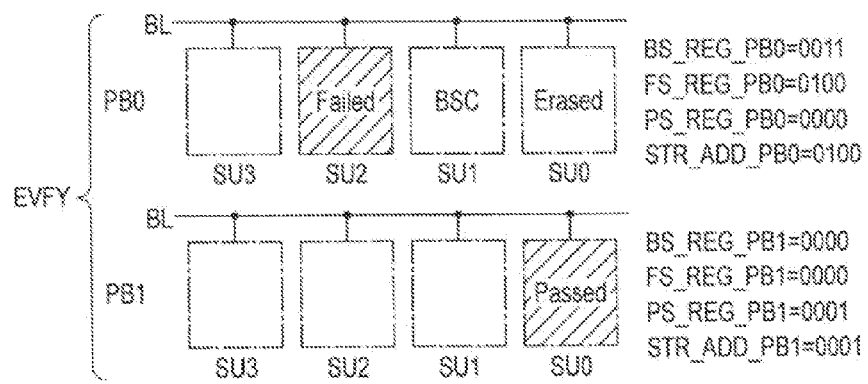
FIG. 29 is a schematic diagram showing a block during erasure according to the first embodiment.

In response to the signals STR_FIXED_PB0 and STR_FIXED_PB1 both being set to the "H" level, the sequencer 14 executes the erase verification on the planes PB0 and PB1 (times t7 to t8). This state is shown in FIG. 29. As illustrated, in the plane PB0, the string unit SU2 fails the erase verification, and in the plane PB1, the string unit SU0 passes. Accordingly, the sequencer 14 updates the register FS_REG_PB0 to "0100", and PS_REG_PB1 to "0001".

Figure 30:
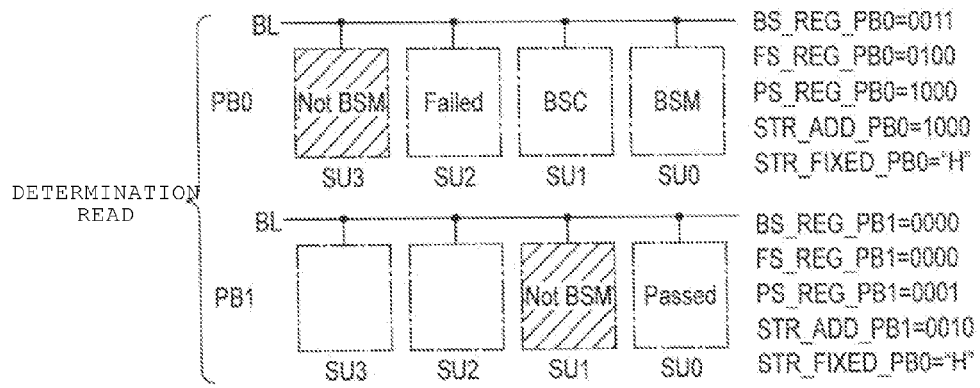
FIG. 30 is a schematic diagram showing a block during erasure according to the first embodiment.

Subsequently, the sequencer 14 performs the determination read (times t8 to t10). This state is shown in FIG. 30. As illustrated, in the plane PB0, the string unit SU3 is determined not to be marked in the determination read, and in the plane PB1, the string unit SU1 is determined not to be marked. Accordingly, the sequencer 14 sets the signals STR_FIXED_PB0 and STR_FIXED_PB1 to the "H" level (time t10).

Figure 31:
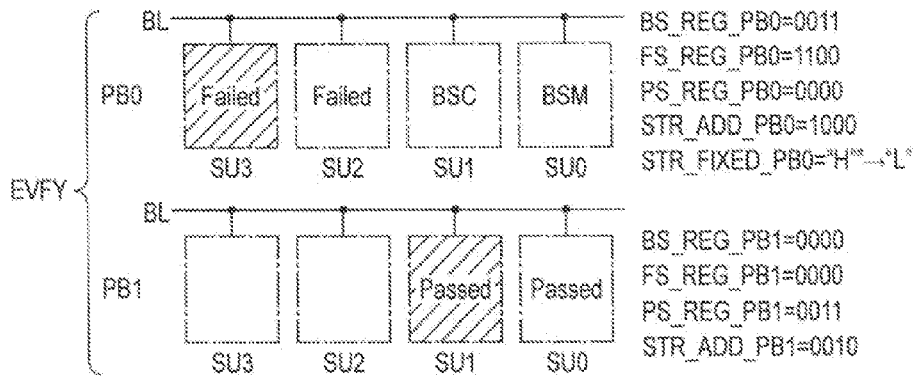
FIG. 31 is a schematic diagram showing a block during erasure according to the first embodiment.

In response to the signals STR_FIXED_PB0 and STR_FIXED_PB1 both being set to the "H" level, the sequencer 14 executes the erase verification on the planes PB0 and PB1 (times t10 to t11). This state is shown in FIG. 31. As illustrated, in the plane PB0, the string unit SU3 fails the erase verification, and in the plane PB1, the string unit SU1 passes. Accordingly, the sequencer 14 updates the register FS_REG_PB0 from "0100" to "1100", and PS_REG_PB1 from "0001" to "0011".

At this time, in the plane PB0, the states of all the string units SU0 to SU3 in the selected block BLK are set to one of the registers BS_REG, FS_REG, and PS_REG. Therefore, the sequencer 14 sets PB0_ENABLE to the "L" level (time t11). Meanwhile, in the plane PB1, PB1_ENABLE is maintained at the "H" level, all the bits of the 4-bit data of FS_REG_PB1 are "0" (NO in step S30). Therefore, the sequencer 14 performs the determination read on the plane PB1 (times t11 to t13). In other words, from the time t11 onward, single-plane operation is adopted.

Figure 32:
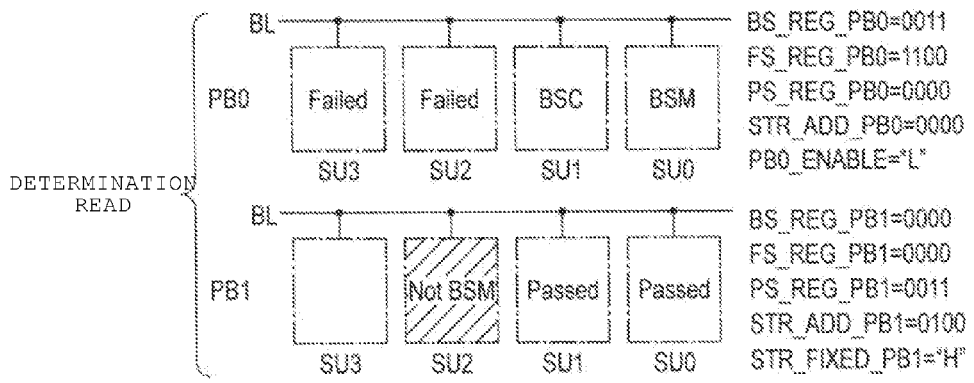
FIG. 32 is a schematic diagram showing a block during erasure according to the first embodiment.

The state of the determination read is shown in FIG. 32. As illustrated, the string unit SU2 of the plane PB1 is determined not to be marked in the determination read. Accordingly, the sequencer 14 sets the signal STR_FIXED_PB1 to the "H" level (time t13).

Figure 33:
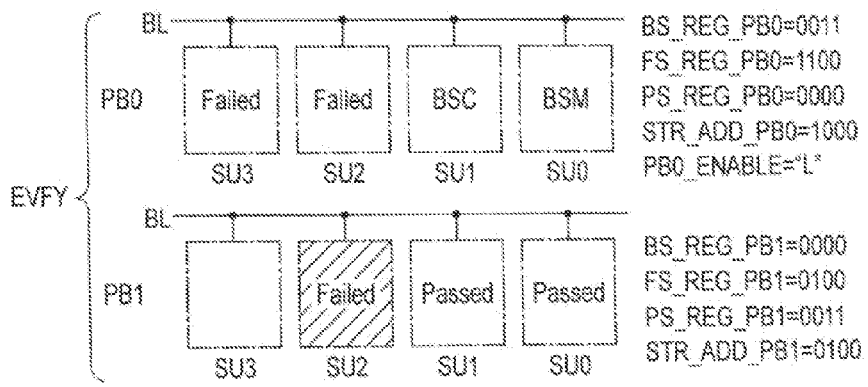
FIG. 33 is a schematic diagram showing a block during erasure according to the first embodiment.

In response to the signal STR_FIXED_PB1 being set to the "H" level, the sequencer 14 executes the erase verification only on the plane PB1 (times t13 to t14). This state is shown in FIG. 33. As illustrated, the string unit SU2 of the plane PB1 fails the erase verification. Therefore, the sequencer 14 updates the register FS_REG_PB1 to "0100" (time t14).

Due to the "1" data being written to FS_REG_PB1 (YES in step S30), the sequencer 14 resets FS_REG_PB0 and FS_REG_PB1 (step S21, time t15).

The sequencer 14 sets PB0_ENABLE to the "H" level by resetting FS_REG_PB0. Accordingly, the multi-plane operation is started again.

Figure 34:
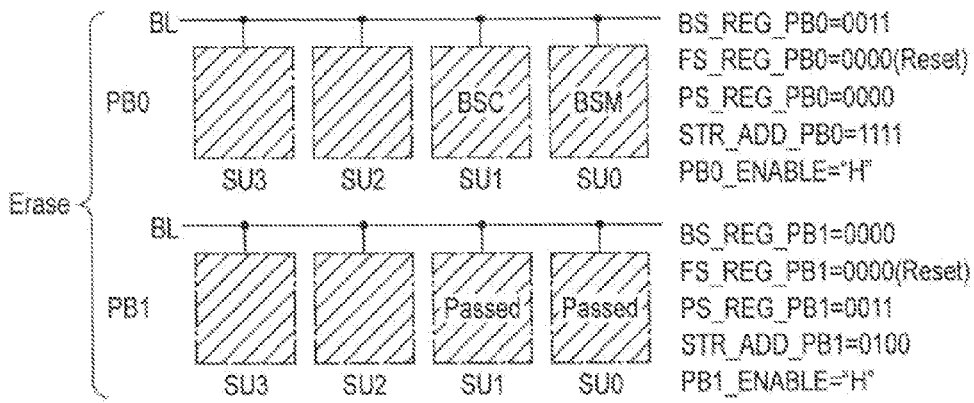
FIG. 34 is a schematic diagram showing a block during erasure according to the first embodiment.

The sequencer 14 erases the data of the planes PB0 and PB1 at the same time (times t15 to t16). This state is shown in FIG. 34.

Next, the sequencer 14 selects the string unit SU in order to perform the determination read. At this time, in the plane PB0, the string units SU0 and SU1 are determined to be bad strings, and in the plane PB1, the string units SU0 and SU1 are determined to be good strings. Therefore, the string unit SU2 is selected in both the planes PB0 and PB1. In other words, STR_ADD_PB0=STR_ADD_PB1="0100" is satisfied (time t17).

Figure 35:
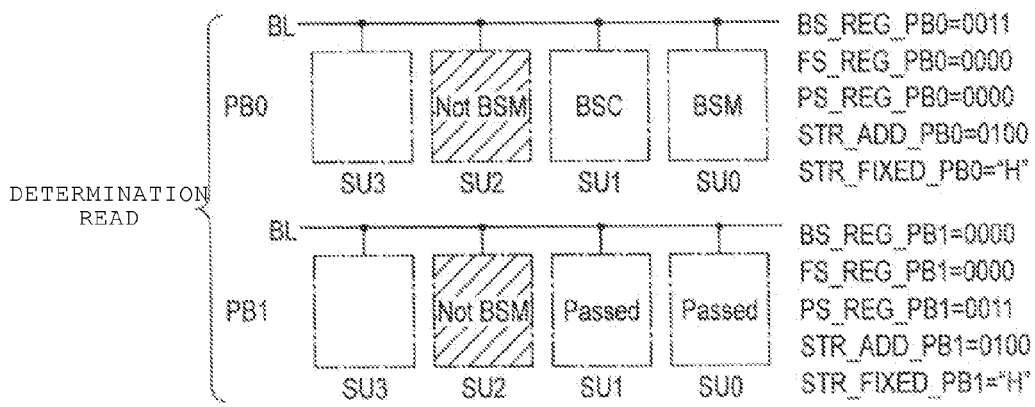
FIG. 35 is a schematic diagram showing a block during erasure according to the first embodiment.

The sequencer 14 performs the determination read (times t17 to t18). This state is shown in FIG. 35. As illustrated, the planes PB0 and PB1 are both determined not to be marked in the determination read. Therefore, the sequencer 14 sets the signals STR_FIXED_PB0 and STR_FIXED_PB1 to the "H" level (time t18).

Figure 36:
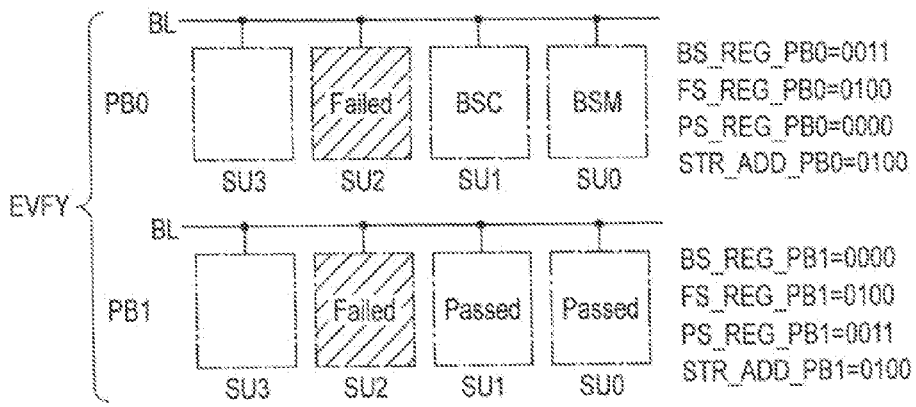
FIG. 36 is a schematic diagram showing a block during erasure according to the first embodiment.

In response to the signals STR_FIXED_PB0 and STR_FIXED_PB1 both being set to the "H" level, the sequencer 14 executes the erase verification on the planes PB0 and PB1 (times t18 to t19). This state is shown in FIG. 36. As shown in FIG. 36, the planes PB0 and PB1 both fail the erase verification. Accordingly, the sequencer 14 updates FS_REG_PB0 and FS_REG_PB1 each from "0000" to "0100" (time t19).

Due to the "1" data being set in FS_REG at time t19 (YES in step S30), the sequencer 14 resets FS_REG_PB0 and FS_REG_PB1 to "0000" (step S21, time t20 of FIG. 24).

Subsequently, as shown in FIG. 24, the erase operation and the two erase verifications are performed and the erase operation is completed.

1.3 Effects of Present Embodiment

When the configuration according to the present embodiment is adopted, first, it is possible to increase the speed of the erase operation. Hereinafter, detailed description will be given of this effect.

Figure 37:
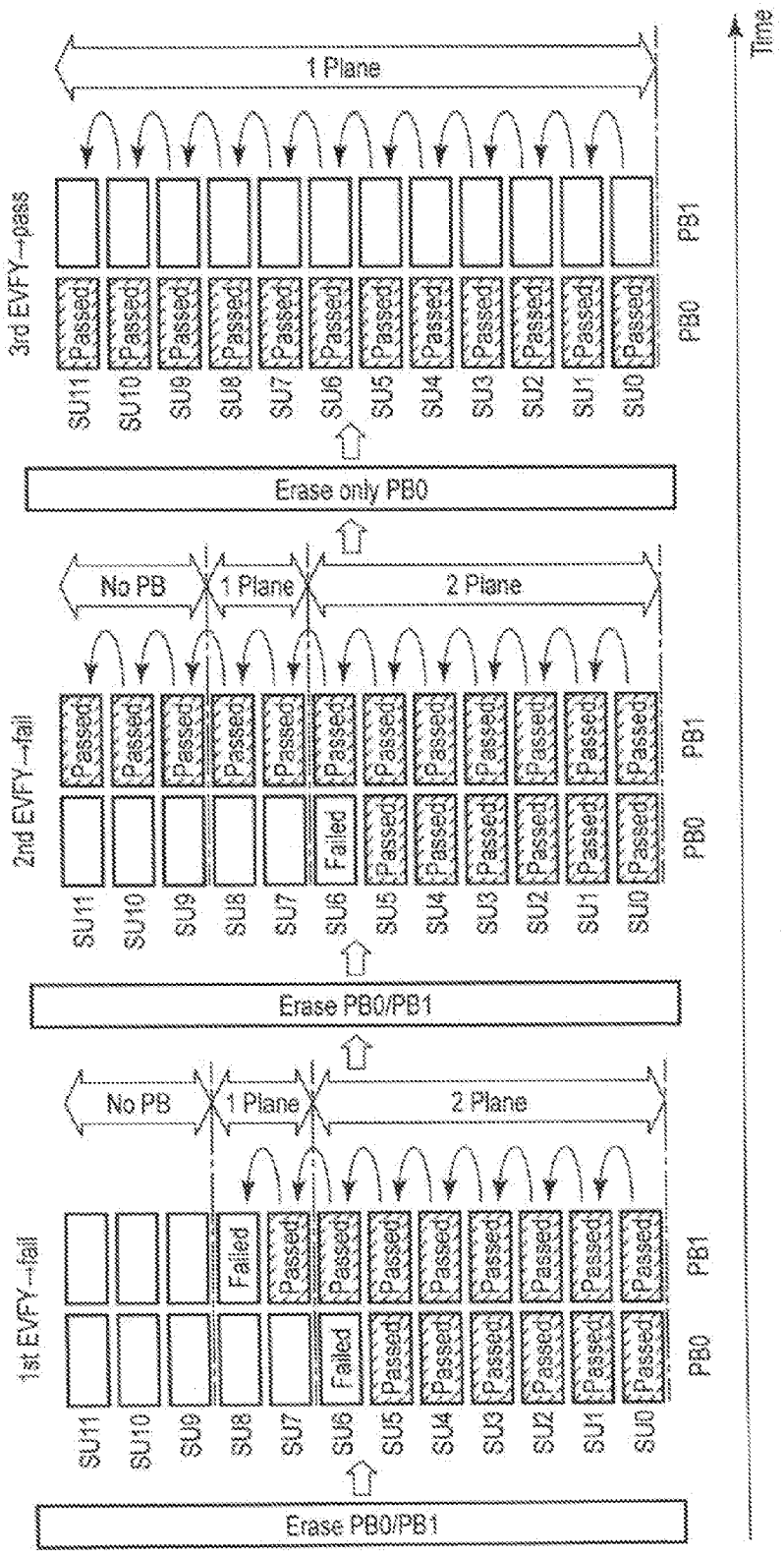
FIG. 37 is a conceptual diagram of the erase operation.

FIG. 37 is a schematic diagram showing an example (a comparative example) of the data erasure method in multi-plane operation, and showing an example in which one plane contains 12 string units SU0 to SU11.

As illustrated, first, the data of the planes PB0 and PB1 are erased, and the first erase verification is performed. The erase verification is performed in order from the string unit SU0, and in the plane PB0, the string units SU0 to SU5 pass, and SU6 fails. Meanwhile, in the plane PB1, the string units SU0 to SU7 pass, and SU8 fails.

When a failed string is detected in the multi-plane operation, the plane is determined to be failed from that time, and is unselected from then onward. That is, in the example of FIG. 37, in the first erase verification, the multi-plane operation is adopted for the string units SU0 to SU6; whereas, the single-plane operation is adopted for the erase verification of the string units SU7 and SU8 of the plane PB1. When failed strings are also detected in the plane PB1, the erase verification is ended, and the data of the planes PB0 and PB1 is erased again.

The second erase verification, in the same manner as the first, is performed in order from the string unit SU0. In the second erase verification, in the plane PB0, the string units SU0 to SU5 pass, and SU6 fails. Meanwhile, in the plane PB1, and the string units SU0 to SU11 pass. Even in this case, the single-plane operation is adopted for the erase verification of the string units SU7 to SU11 of the plane PB1.

Since the plane PB1 passed the erase verification, next, only the data of the plane PB0 is erased. In the plane PB0, the erase verification is performed in order from the string unit SU0.

When the above method is adopted, it takes time to perform the erase operation. This is because, during the second erase verification onward, even in relation to the string units SU that already passed the verification, the verification is executed again. For example, in the example of FIG. 37, when the second erase verification is executed, in the plane PB0, it is already known that the string units SU0 to SU5 have been passed. Accordingly, the erase verification in relation to the string units SU0 to SU5 is wasteful. The same applies to the plane PB1.

When the configuration according to the present embodiment is adopted, the NAND flash memory 1 is provided with the registers PS_REG, FS_REG, and BS_REG that hold the statuses of each string unit. Therefore, it is possible to hold the passed/failed information for each string unit, and it is possible to increase the speed of the erase operation by omitting wasteful operations such as those shown in FIG. 37.

More specifically, the string units SU where the statuses of the registers PS_REG, FS_REG, and BS_REG are not determined are selected, and the erase verification is performed. At this time, even if one of the planes fails the erase verification, if no failed strings are present in the other plane, the erase verification is continued without setting the corresponding plane to be unselected (in the example of FIG. 37, in the first erase verification, the verification of the plane PB0 continues to the string unit SU8). The verification continues until when at least one failed string is detected in relation to all of the planes, or until the erase verification of all the string units is completed.

Description will be given of the operation according to the present embodiment using FIGS. 38 to 47. FIGS. 38 to 47 are schematic diagrams showing the states of the string units SU contained in four planes.

As shown in FIG. 38, each plane PB0 to PB3 contains 12 string units SU0 to SU11. First, the positional information of the defects that is registered in the partial bad information register 3 is checked. In the present example, as shown in FIG. 39, it is assumed that the string units SU0, SU2, SU5, SU10, and SU11 of the plane PB0 are registered in the partial bad information register 3 as bad strings. The information is registered in the register BS_REG_PB0 (BS_REG_PB0="12b1100_0010_0101"). Subsequently, the erase operation is executed in the following manner.

First, the data of all the planes is erased at once.

Figure 40:
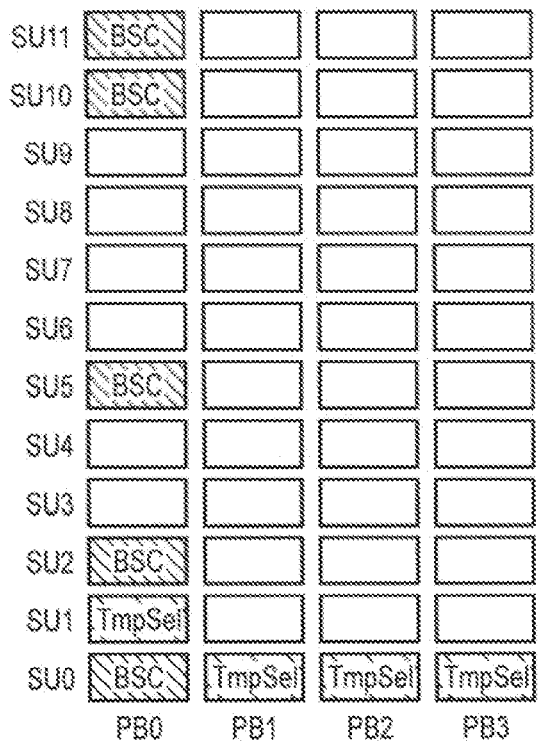
FIG. 40 is a conceptual diagram of the various registers according to the first embodiment.

(1-1) Next, as shown in FIG. 40, in each plane PB, the string unit with the smallest address, of the string units where BS_REG, PS_REG, and FS_REG are all "0", is temporarily selected (the string unit indicated by "TmpSel" in FIG. 40).

Figure 41:
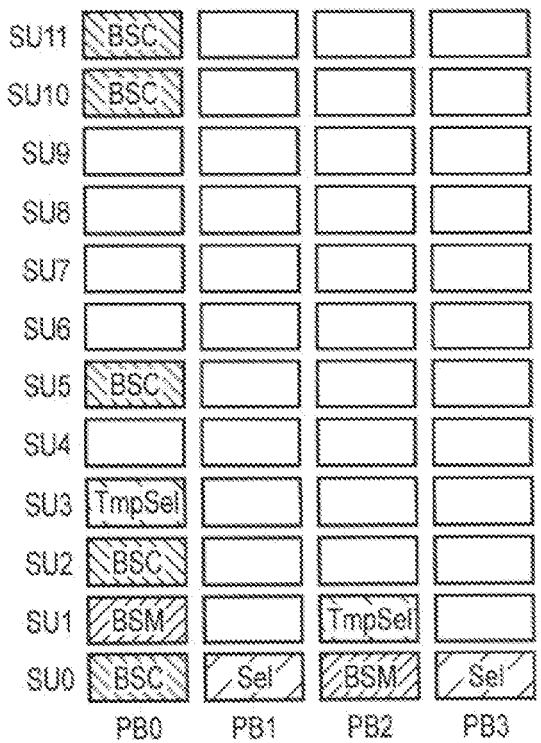
FIG. 41 is a conceptual diagram of the various registers according to the first embodiment.

(1-2) Next, as shown in FIG. 41, the determination read is performed, and BS_REG is set to "1" for the string units SU that are determined to be bad strings. In FIG. 41, BS_REG_PB0[1] and BS_REG PB2[0] are set to "1".

(1-3) As a result of the determination read, the string unit that is determined not to be the bad string is actually selected as the erase verification target string (the string unit indicated by "Sel" in FIG. 41). That is, transitioning from "TempSel" to "Sel" corresponds to the signal STR_FIXED_PB assuming the "H" level for the corresponding string unit SU.

(1-4) In the plane PB2 that does not include a string unit that is actually selected, one of the string units is temporarily selected based on the rule of (1-1) described above.

Figures 42, 43:
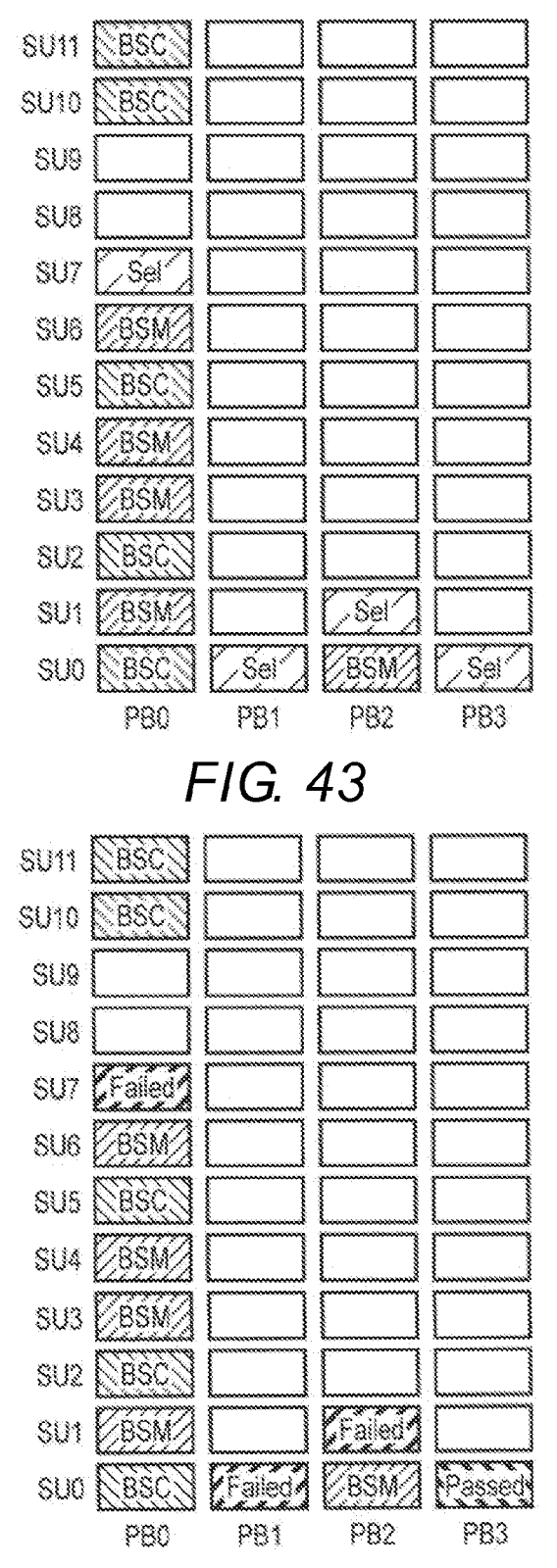

(1-5) The processes described above in (1-1) to (1-4) are repeated until the actually selected string unit is determined in each plane. In the example of FIG. 42, while in the planes PB1 and PB3, the string unit that is selected first is actually selected, in the plane PB0, the string unit SU7 that is selected fifth is actually selected (all of the string units temporarily selected in the first to fourth times already have information indicating that the string unit is a bad string written in the select transistor ST1). During this period, the planes that include an actually selected string unit enter the unselected state, and the determination read or the like is not performed.

(2-1) Next, the erase verification is performed on the actually selected string units. When a string unit fails the erase verification, FS_REG is set to "1", and when a string unit passes, PS_REG is set to "1". In the example of FIG. 43, FS_REG_PB0[7], FS_REG_PB1[0], FS_REG PB2[1], and PS_REG_PB3[0] are set to "1".

(2-2) When a plane where none of FS_REG[11:0] is set to "1" is present, that is, when a plane that continues to pass the erase verification is present, another string unit is selected and the erase verification continues. In the example of FIG. 43, since FS_REG of the plane PB3 is not set to "1", the erase verification continues.

(2-3) When the erase verification continues, in regard to a plane where FS_REG is set to "1", when a string unit which is yet to be subjected to erase verification is present, the actually selected string is determined using the method described above in (1-1) to (1-5). In the example of FIG. 44, in regard to the plane PB0, since the string units SU8 and SU9 are bad strings, the plane PB0 is unselected. Accordingly, three-plane operation of the planes PB1 to PB3 is adopted.

(2-4) The erase verification continues for each plane until at least one bit of FS_REG is set to "1". In FIG. 44, the plane PB3 is the only plane where FS_REG is not set to "1"; however, at the stage of FIG. 45, FS_REG="1" emerges in the string unit SU3 of the plane PB3. Therefore, the second data erasure is executed.

Figures 46, 47:
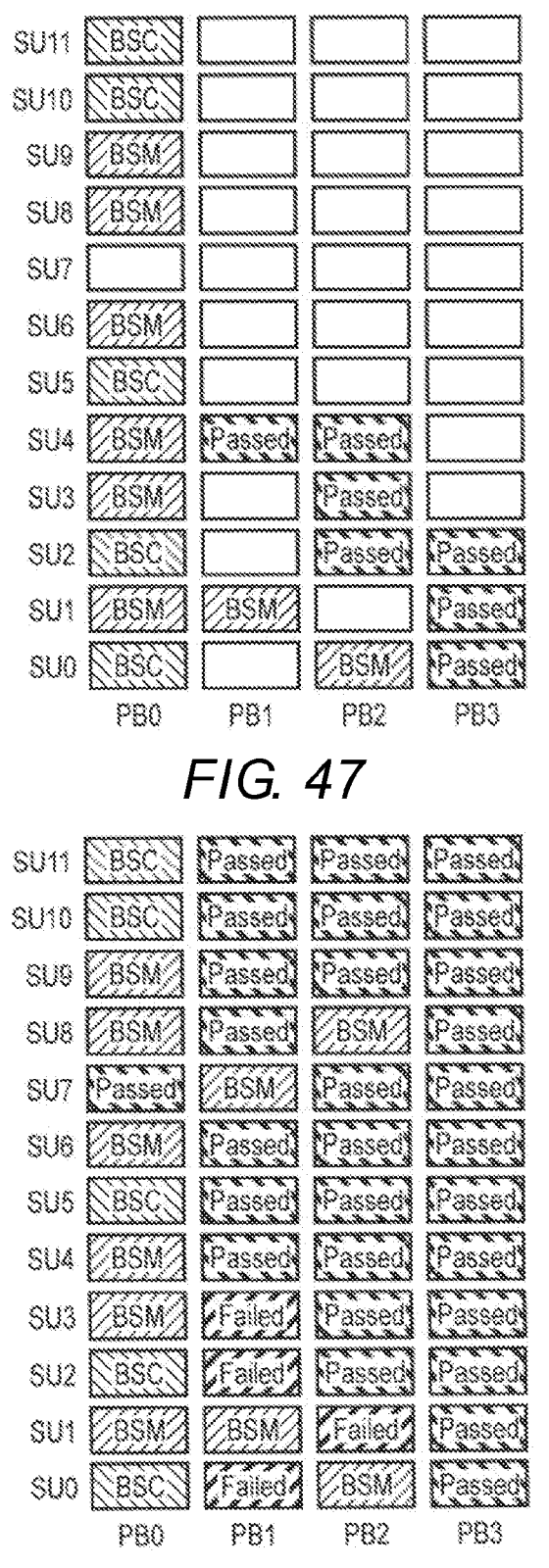

(3-1) After the second data erasure, in regard to all the planes PB0 to PB3, only FS_REG is reset and the processes of (1-1) to (2-4) described above are repeated. FIG. 46 shows the state of only FS_REG being reset.

(4-1) Subsequently, the erase verification continues until the statuses of all the string units SU are determined to be PS_REG or BS_REG. FIG. 47 shows the states of the registers when the erase verification is completed for all the string units SU.

According to the present embodiment described above, the states of the string units SU are held in the registers. Unnecessary erase verification is skipped based on this information. Accordingly, it is possible to increase the speed of the erase operation.

According to the present embodiment, it is possible to output the information held in the registers PS_REG, FS_REG, and BS_REG to an external memory controller. Accordingly, the memory controller may better ascertain the state of the NAND flash memory 1. For example, the memory controller may write information indicating the string units that are bad strings after shipping to the select transistor ST1 according to the state of FS_REG, for example.

Thus, it is possible to greatly improve the degree of freedom in controlling the NAND flash memory 1 using the memory controller. Naturally, it is possible to output the states of each string unit as necessary to the host device via the memory controller. This will be described in detail in the fifth embodiment.

2. Second Embodiment

Next, description will be given of the semiconductor memory device according to the second embodiment. The present embodiment relates to the details of the voltages during the erase operation in the first embodiment described above. Hereinafter, description will be given of points that differ from the first embodiment.

2.1 First Example

Figure 48:
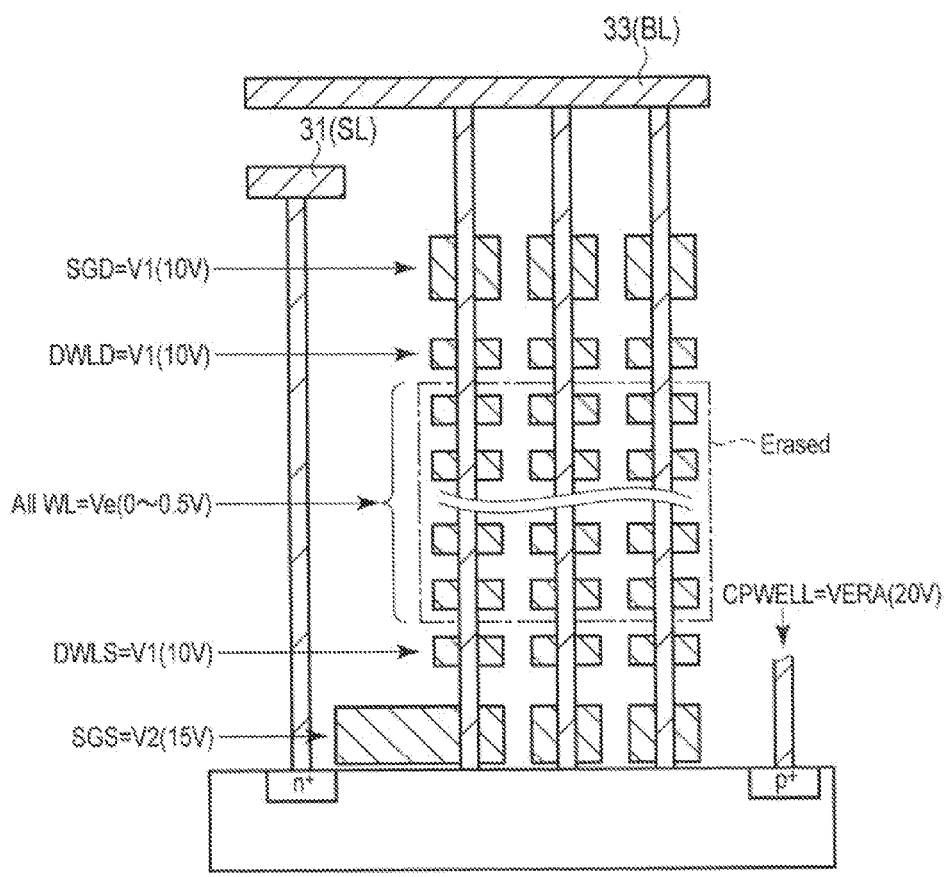
FIG. 48 is a cross-sectional diagram of a memory cell array according to a second embodiment.
Figure 49:
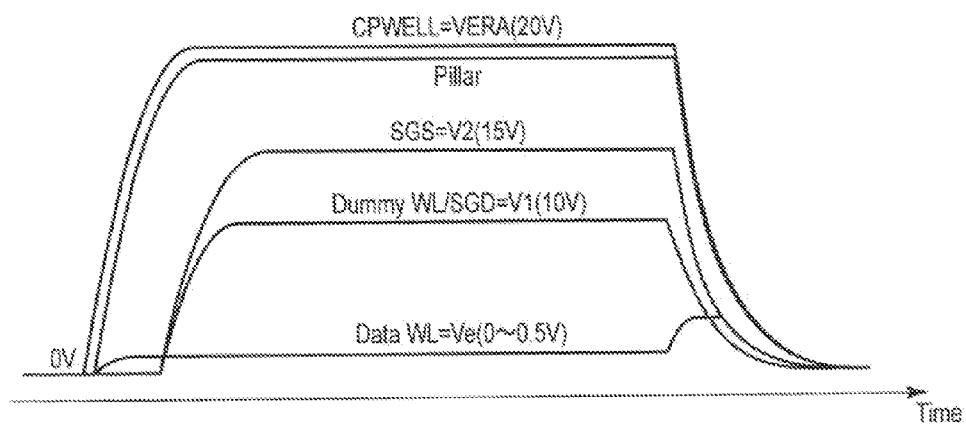
FIG. 49 is a timing chart of an erase operation according to the second embodiment.

First, description will be given of the first example of the erase operation. FIG. 48 is a cross-sectional diagram of the selected block BLK, and FIG. 49 is a timing chart of the voltages applied to each wiring. Both FIGS. 48 and 49 show the state of when a charge is drawn from the charge storage layer and the thresholds of the memory cell transistors MT are reduced.

As illustrated, a well driver, for example, applies an erasure voltage VERA (for example, 20 V) to the well wiring CPWELL. Therefore, the potentials of the pillars 33 in each NAND string also rise to approximately VERA. A voltage Ve (for example, 0 V to 0.5 V) is applied to the word lines WL by the row decoder 11. As a result, in each memory cell transistor MT, the charge in the charge storage layer is drawn out by the pillar 33 and the threshold voltage of the corresponding memory cell transistor is reduced.

A voltage V1 (for example, 10 V) is applied to the select gate line SGD, and the dummy word lines DWLD and DWLS by the row decoder 11. Accordingly, in the select transistor ST1, and the dummy transistors DTD and DTS, the potential difference between the gate and the pillar 33 is reduced. Thus, in these transistors, drawing out of the charge into the pillar 33 from the charge storage layer is suppressed, and the previous threshold is substantially maintained.

A voltage V2 (for example, 15 V) which is greater than the voltage V1, for example, is applied to the select gate line SGS by the row decoder 11. Accordingly, the pillar 33 is saturated by the voltage of the well wiring CPWELL.

Figure 50:
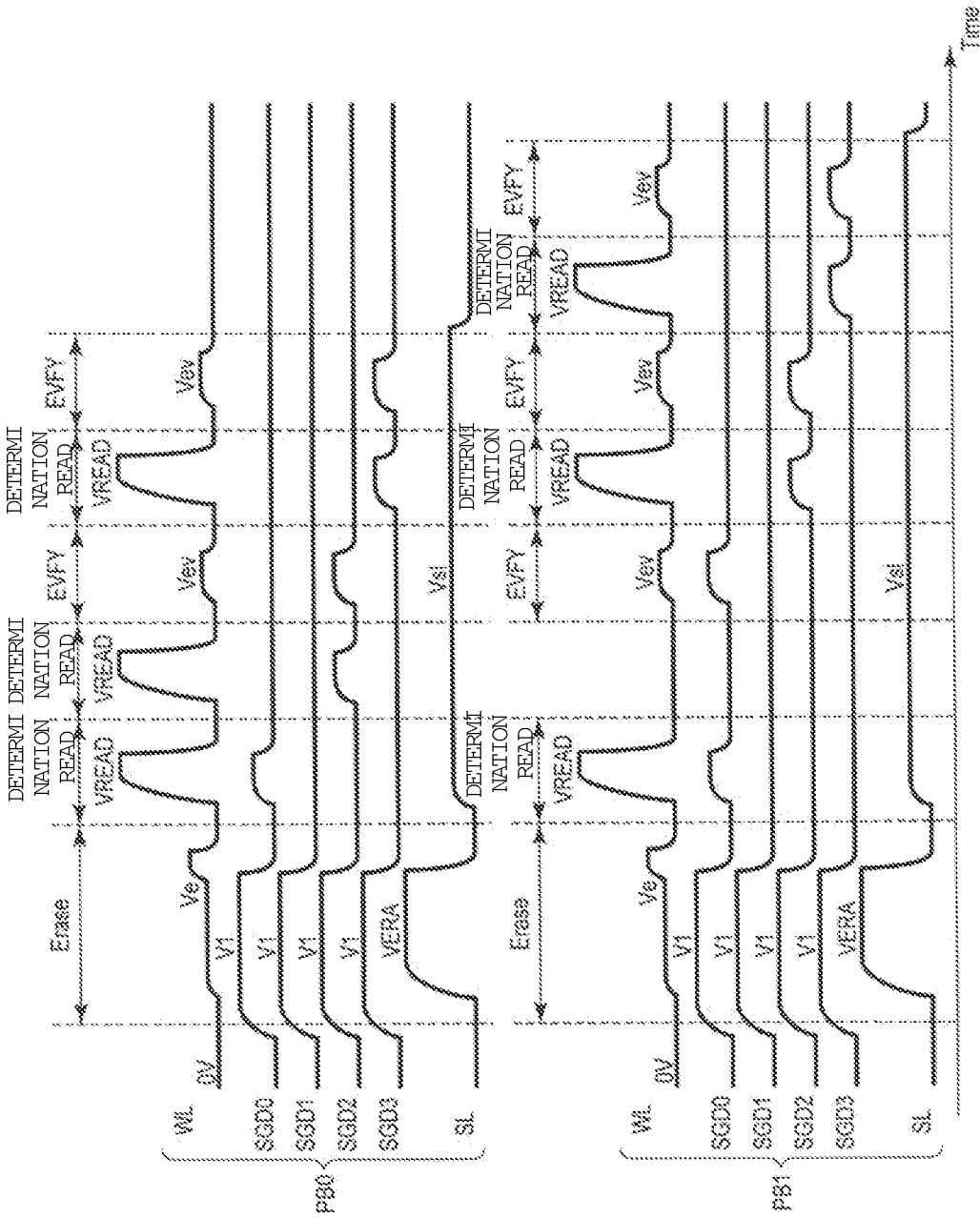
FIG. 50 is a timing chart of the erase operation according to the second embodiment.

FIG. 50 is a timing chart showing the voltages of the various wirings during the data erasure. FIG. 50 shows a case in which the string unit SU0 of the plane PB0 is marked by the second registration function (BSM), and the string unit SU1 is registered as defective by the first registration function (BSC). FIG. 50 shows a case in which the first erase pulse is applied, in the plane PB0, the string units SU2 and SU3 fail the subsequent erase verification, and in the plane PB1, the string units SU0 and SU1 pass and the string unit SU2 fails.

As illustrated, the erasure voltage VERA (for example, 20 V) is applied to the source line SL (and the well wiring CPWELL), and the voltage Ve (for example, 0 V to 0.5V) is applied to the word lines WL. Accordingly, the data of the memory cell transistors MT0 to MT7 is erased, and the thresholds thereof are reduced. At this time, the voltage V1 is applied to the select gate line SGD, and the voltage V2 (<V1) is applied to the select gate line SGS and the dummy word line DWL (neither shown). Accordingly, reduction in the thresholds of the select transistors ST1 and ST2 and the dummy transistor DT is suppressed.

Next, the determination read is performed. As illustrated, during the determination read, the voltage VREAD is applied to the word lines WL. In the plane PB0, since the string unit SU2 to be the erase verification target is discovered in the second determination read, VREAD is applied twice. Meanwhile, in the plane PB1, since the string unit SU0 to be the erase verification target is discovered in the first determination read, VREAD is applied once. Subsequently, in the planes PB0 and PB1, the erase verification is applied at the same time. In other words, the verification voltage Vev is applied to the word lines WL. During the determination read, the potential change of the select gate line SGS is the same as that of SGD.

Subsequently, the determination read and the erase verification are repeated until failed strings emerge in both the planes PB0 and PB1, or until the statuses of all the string units SU are determined. During the determination read and the erase verification, the voltage Vs1 (>0 V) is applied to the source line SL.

As described above, when the second registration function is enabled, even during the erase operation, there is a period during which the voltage VREAD is applied to the word line WL.

2.2 Second Example

Figure 51:
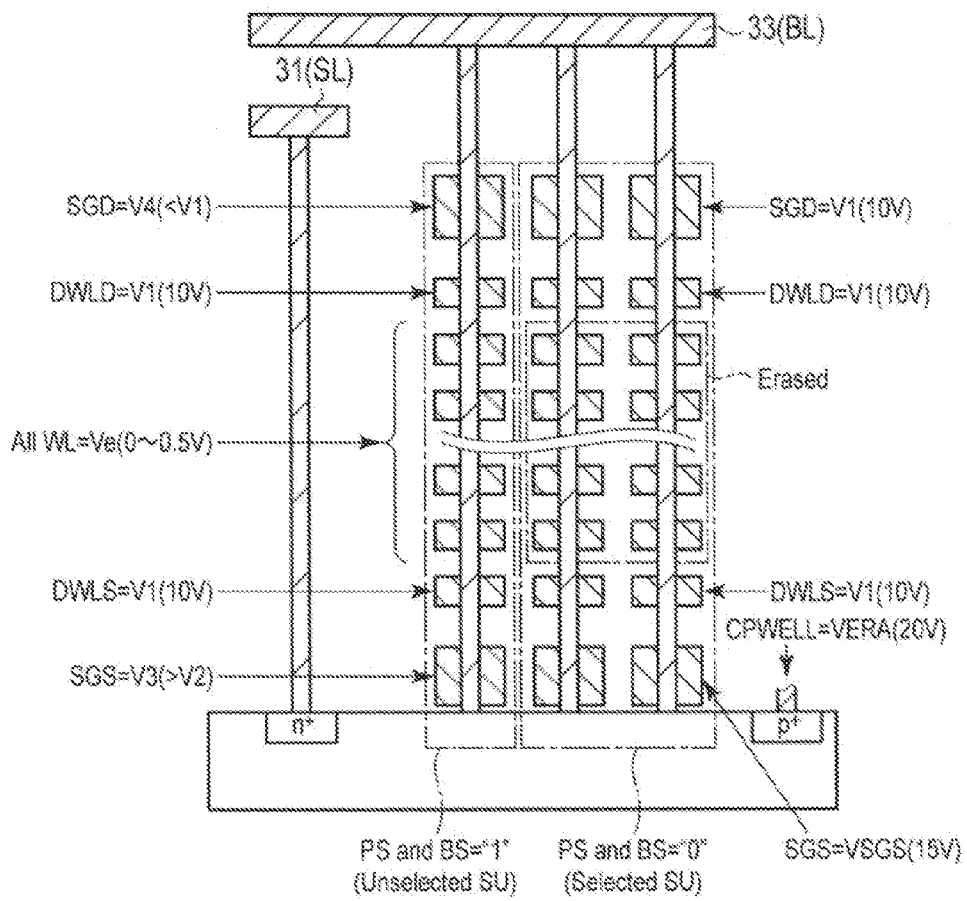
FIG. 51 is a cross-sectional diagram of a memory cell array according to a second embodiment.
Figure 52:
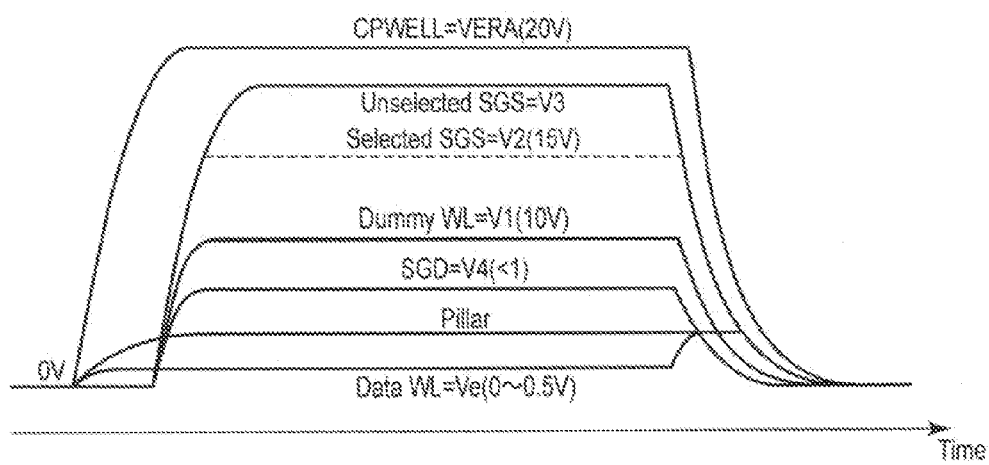
FIG. 52 is a timing chart of the erase operation according to the second embodiment.

Next, description will be given of the second example of the erase operation. FIG. 51 is a cross-sectional diagram of the selected block BLK, and FIG. 52 is a timing chart of the voltages applied to each wiring. Both FIGS. 51 and 52 show the state of when a charge is drawn out from the charge storage layer and the threshold voltages of the memory cell transistors MT are reduced.

In the present example, the string units SU which passed the erase verification (PS_REG="1") or are determined to be bad strings (BS_REG="1") are set not to be erasure targets. Therefore, as shown in FIG. 52, the plurality of select gate lines SGS in the same string unit SU may be controlled independently of one another. In other words, the gates of the select transistors ST2 of the string units SU0 to SU3 are connected to the select gate lines SGS0 to SGS3, respectively, and are controlled by the row decoder 11.

The second example differs from the case of FIGS. 48 and 49 described in the first example in that a voltage V3 is applied to the select gate lines SGS of the unselected string units SU. The voltage V3 is a higher voltage than the voltages V2 and V1. Therefore, when the voltage V3 is applied to the gate, the pillar 32 of the select transistor ST2 is depleted. Thus, the voltage VERA that is applied to the p type well region 20 is not transferred to the pillar 33 due to the depleted pillar 32. Therefore, it is possible to suppress the rising of the potential of the pillar 33. As a result, it is possible to suppress the application of voltage stress to the memory cell transistors MT, the dummy transistors DTD and DTS, and the select transistors ST1 of the unselected string units SU.

In the example of FIGS. 51 and 52, a voltage V4 is applied to the select gate line SGD of the unselected string units (V4<V1). This also contributes to a reduction in the voltage stress applied to the select transistor ST1. If the dummy word lines DWLD and DWLS may also be controlled independently, a voltage that is lower than the voltage V1 may be applied to the dummy word lines DWLD and DWLS of the unselected string units, in the same manner as the select gate line SGD.

As described above, it is possible to prevent the over-erasure of the memory cell transistors MT, and the dummy transistors DTD and DTS by reducing the voltage stress applied to the string units SU that are not erasure targets. It is also possible to prevent the bad string information that is written in the select transistor ST1 from being destroyed.

2.3 Effects of Present Embodiment

As described above, the voltages of each wiring during the erase operation may be set as described in the present embodiment. In particular, according to the second example, the erasure is not carried out in relation to string units SU which passed the erase verification and string units SU that are already known to be bad strings. Therefore, it is possible to reduce the voltage stress applied to each transistor and to improve operation reliability.

3. Third Embodiment

Next, description will be given of the semiconductor memory device according to the third embodiment. The present embodiment relates to the memory hole (MH) open mask function described in the first embodiment. The MH open mask function is a function for preventing the wasteful repetition of data erasure by treating NAND strings containing a memory hole open defect as having passed the erase verification. Hereinafter, description will be given of points that differ from the first and second embodiments.

3.1 Configuration of Sense Amplifier 12

Figure 53:
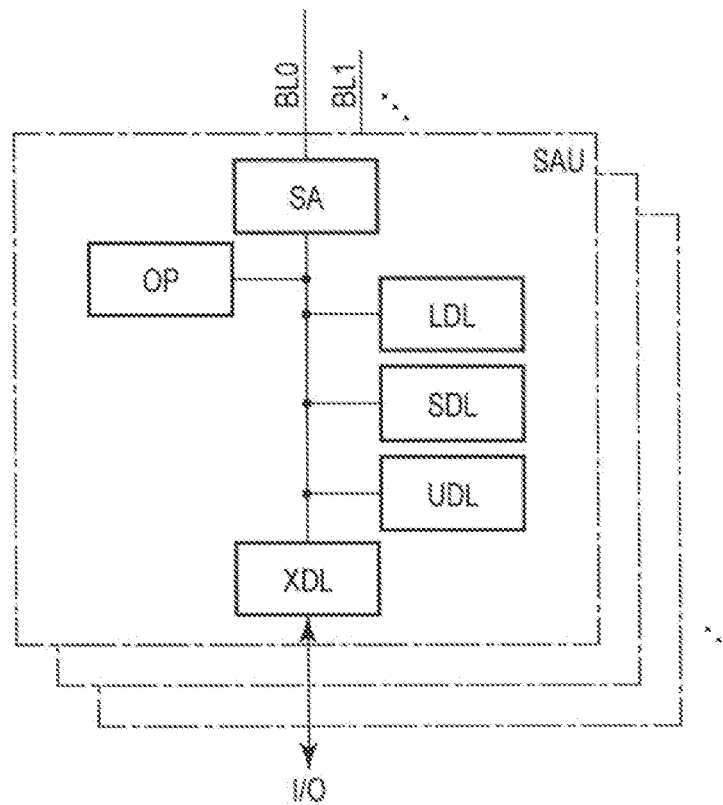
FIG. 53 is a block diagram of a sense amplifier according to a third embodiment.

First, description will be given of the configuration of the sense amplifier 12 using FIG. 53. FIG. 53 is a block diagram of the sense amplifier 12.

As illustrated, the sense amplifier 12 is provided with a plurality of sense amplifier units SAU provided for each bit line BL. The sense amplifier unit SAU is provided with a sense amplifier section SA, an operator section OP, and latch circuits LDL, SDL, UDL and XDL.

During the reading of data (including the verification reading), the sense amplifier section SA senses and amplifies the data that is read to the corresponding bit line BL. During the writing of data, the sense amplifier section SA applies a voltage corresponding to the write data to the corresponding bit line BL.

The operator section OP executes the various logical operations based on the data held in the latch circuits LDL, SDL, UDL, and XDL.

The latch circuits LDL, SDL, UDL, and XDL hold the write data received from the memory controller, the read data sensed and amplified by the sense amplifier section SA, or the operation result of the operator section 51. Reception of data between the sense amplifier 12 and the outside is performed via the latch circuit XDL.

3.2 Operation of Sense Amplifier 12

Figure 54:
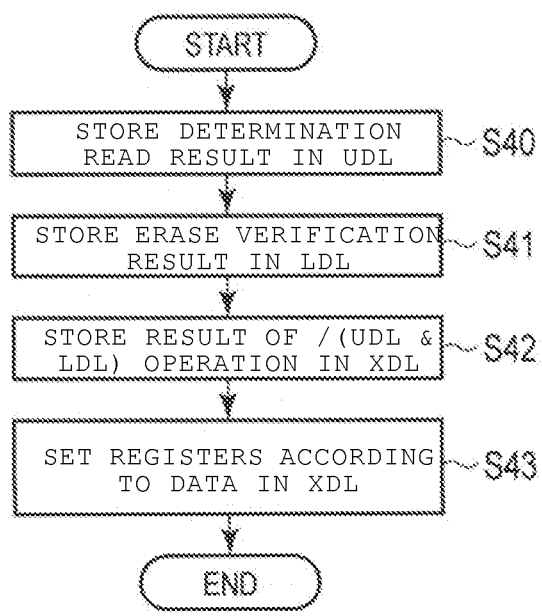
FIG. 54 is a flow chart showing the operations of a sense amplifier according to the third embodiment.

Next, description will be given of the operations of the sense amplifier 12 relating to the MH open mask function, using FIG. 54. FIG. 54 is a flowchart showing the operations of the sense amplifier 12, and corresponds to the details of steps S27 to S29 illustrated in FIG. 7.

First, the sense amplifier section SA performs the determination read, and the results are stored in the latch circuit UDL (step S40). For example, in the sense amplifier section SA, in the determination read, the bits that are determined not to be marked (no memory hole open defect) store a value of "0", and the bits that are determined to be marked store a value of "1". The result thereof is transferred to the latch circuit UDL.

Subsequently, the sense amplifier section SA performs the erase verification and stores the results thereof in the latch circuit LDL (step S41). Even in this case, bits which passed the erase verification in the sense amplifier section SA store a value of "0" in the same manner as in step S40, and the failed bits store a value of "1". The result thereof is transferred to the latch circuit LDL.

Next, the operator section OP subjects the data in the latch circuit UDL and the data in the latch circuit LDL to a logical operation (step S42). In the present example, the operator section OP performs a /(UDL & LDL) operation. In other words, the operator section OP obtains the logical AND of the data in the latch circuit UDL and the data in the latch circuit LDL and inverts the obtained values. That is, the operator section OP performs an operation in which XDL of a bit that is not MH open and that failed the erase verification is "0". A case in which the operation result is "0" indicates that the erase verification failed, not that MH open is true, and a result of "1" indicates either that the MH open is true or that the erase verification is passed, and as a result, the corresponding bit is determined to be passed.

Subsequently, the sequencer 14 sets the registers PS_REG, FS_REG, and BS_REG according to the result of the latch circuit XDL (step S43).

Figure 55:
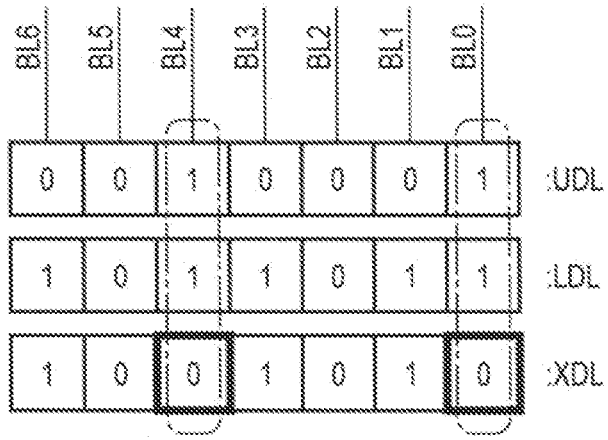
FIG. 55 is a block diagram of a latch circuit according to the third embodiment.

FIG. 55 is a specific example of the operation described above, and shows the data held in the latch circuits UDL, LDL, and XDL. In FIG. 55, to facilitate understanding, it is assumed that the number of bit lines is seven lines (BL0 to BL6), and there are MH open defects in the NAND string corresponding to the bit lines BL0 and BL4.

Thus, as a result of step S40, the value "0010001" is stored in the latch circuit UDL. In other words, the 7-bit data indicates the bit lines BL0 to BL6, in order from the lower bit, and the first bit and the fifth bit, from the lower bit, corresponding to the bit lines BL0 and BL4 where MH open defects are determined to be present are set to "1".

Subsequently, as a result of step S41, the value "1011011" is stored in the latch circuit LDL. In other words, the bit lines BL1, B13, and BL6 failed the erase verification. Naturally, the bit lines BL0 and BL5 also fail.

Subsequently, in step S42, the operator section OP stores the data, which is obtained by subjecting LDL and UDL in each bit to the AND operation and inverting the values, in XDL. As a result, the value "1001010" is stored in the latch circuit XDL. In other words, the bits corresponding to the bit lines BL0 and BL5 with MH open defects are converted to the value "0". Accordingly, the latch circuit XDL makes it appear to the sequencer 14 that the bit lines BL0 and BL5 passed both the determination read and the erase verification.

The sequencer 14 sets the registers PS_REG, FS_REG, and BS_REG according to the data stored in the latch circuit XDL.

3.3 Effects of Present Embodiment

The term "memory hole open defect" refers to a defect in which, due to the memory hole 26 becoming clogged, the etching during the memory hole 26 formation being insufficient, or the like in a NAND string, the memory hole 26 does not reach the well region 20, and the bit line BL and the source line SL are not electrically connected to one another. When such a defect occurs, the corresponding NAND string does not pass the erase verification, no matter how many times the erasure is repeated.

According to the present embodiment, this is dealt with by treating the NAND strings where a memory hole open defect is present as having passed the erase verification due to the logical operation in the sense amplifier 12. In other words, when the memory hole open defect is detected, the corresponding bit is no longer an erase verification target. Accordingly, it is possible to prevent erasure from being wastefully repeated due to memory hole open defects, and to prevent over-erasure of the memory cell transistors MT.

4. Fourth Embodiment

Next, description will be given of the semiconductor memory device according to the fourth embodiment. In the present embodiment, the dummy transistors DTD and DTS are written (this is referred to as dummy programming) after the erase operation illustrated in FIGS. 7 and 8 in the first to third embodiments. Hereinafter, description will be given of points that differ from the first to third embodiments.

4.1 Logic Circuit

Figure 56:
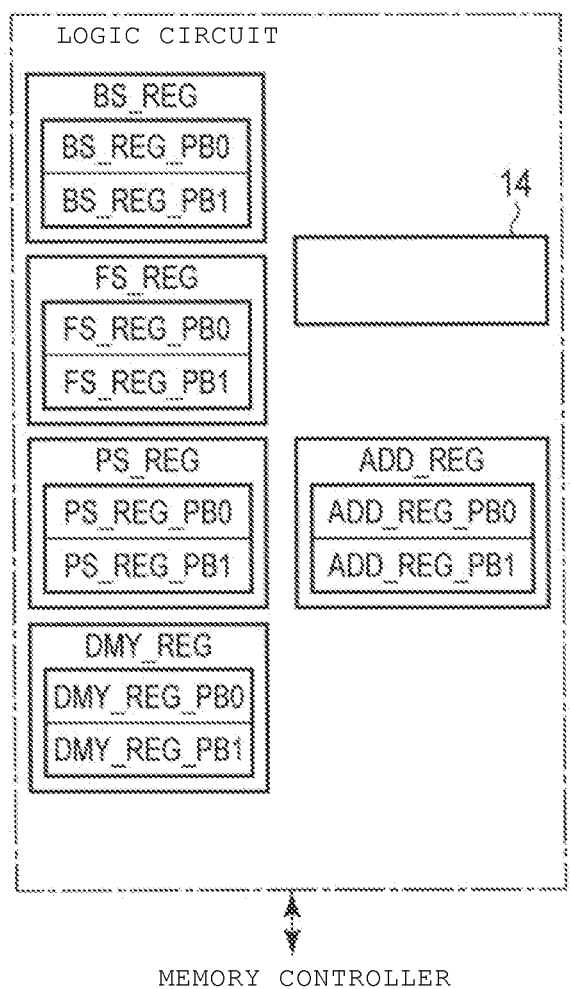
FIG. 56 is a block diagram of a logic circuit according to a fourth embodiment.

First, description will be given of the configuration of the logic circuit 2 according to the present embodiment using FIG. 56. FIG. 56 is a block diagram of the logic circuit 2.

As illustrated, the logic circuit 2 according to the present embodiment further includes a dummy register DMY_REG in addition to the components shown in FIG. 1 described in the first embodiment. The dummy register DMY_REG holds 4-bit data, in the same manner as BS_REG, FS_REG, and PS_REG, and each bit corresponds to the string units SU0 to SU3, in order from the lower bit. Each bit holds information indicating whether or not the corresponding string unit SU passed a pre-programming verification and a dummy programming verification (both described hereinafter). The dummy register DMY_REG is provided with a register DMY_REG_PB0 for the plane PB0, and a register DMY_REG_PB1 for the plane PB1.

4.2 Overall Flow of Dummy Programming

Figure 57A:
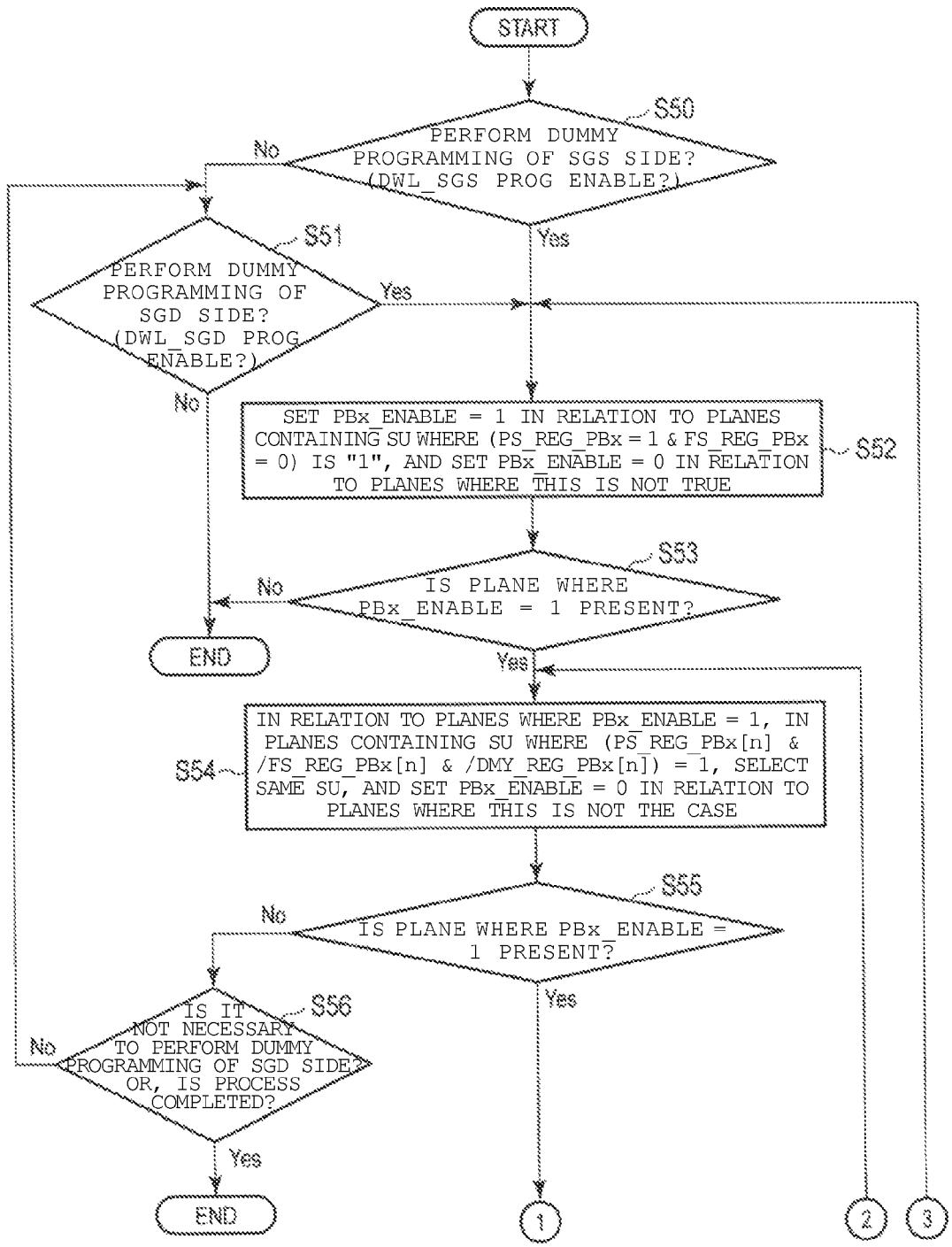
FIG. 57A is a flowchart of an erase operation according to the fourth embodiment.
Figure 57B:
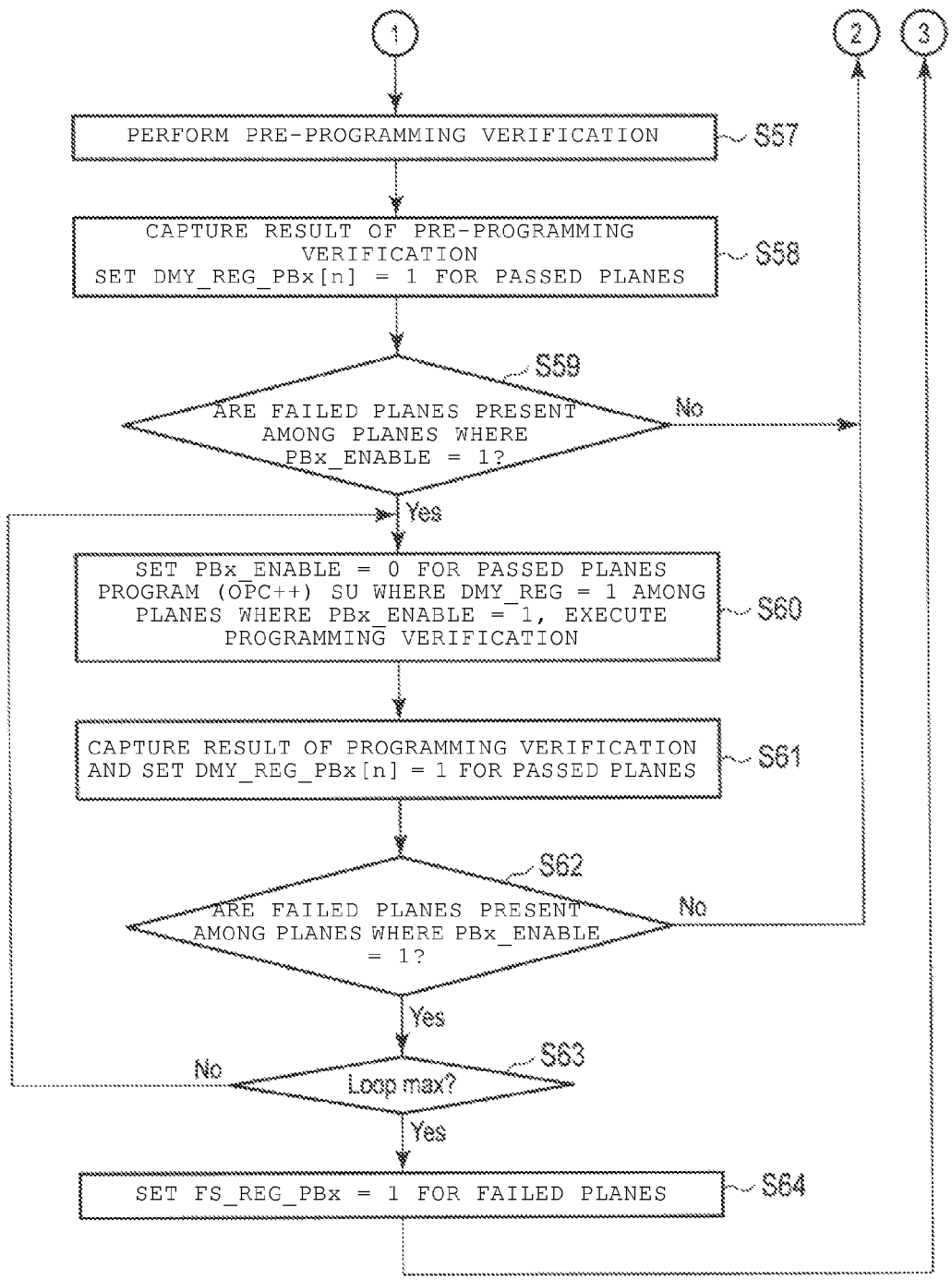
FIG. 57B is a flowchart continuing from FIG. 57A.

Next, description will be given of the overall flow of the dummy programming using FIGS. 57A and 57B. FIGS. 57A and 57B are a flowchart of the dummy programming operation, and the processes in each step are mainly performed by the sequencer 14.

The dummy programming may be performed on one or both of the dummy transistor DTD of the select gate line SGD side and the dummy transistor DTS of the select gate line SGS side. After the "END" of the flowchart illustrated in FIG. 7, the sequencer 14 determines whether or not to perform the dummy programming, and starts the process shown in FIG. 57 when performing the dummy programming.

When the dummy programming is to be performed on the dummy transistor DTS of the select gate line SGS side (YES in step S50), or when the dummy programming is to be performed on the dummy transistor DTD of the select gate line SGD side (YES in step S51), the process proceeds to step S52. In step S52, the sequencer 14 sets PBx_ENABLE=1 in relation to the planes containing string units SU where (PS_REG_PBx=1 & FS_REG_PBx=0) is "1", and sets PBx_ENABLE=0 in relation to the planes where this is not the case (step S52). In other words, the planes containing such string units SU are selected in order to perform the dummy programming only on the string units which passed the erase verification. That is, if all the string units SU of the selected block are determined to be failed strings or bad strings, there are no string units SU to be the target, even if the dummy programming operation is performed.

If no plane where PBx_ENABLE=1 is present (NO in step S53), the process is ended. When such a plane is present (YES in step S53), the process proceeds to step S54. In step S54, in relation to planes where PBx_ENABLE=1, in the planes containing string units SU where (PS_REG_PBx[n] & /FS_REG_PBx[n] & /DMY_REG_PBx[n])=1, the sequencer 14 selects the string units SU, and sets PBx_ENABLE=0 in relation to planes where this is not the case. In other words, the string units SU that satisfy PS_REG=1, FS_REG=0, and DM REG=0 are selected. When a plurality of string units SU that satisfy the above conditions are present, the string unit SU with the smallest string address is selected.

The sequencer 14 determines whether a plane where PBx_ENABLE="1" is present (step S55). If such a plane is not present (NO in step S55), the sequencer 14 determines whether to perform the SGD side dummy programming (step S56). When the SGD side dummy programming is not to be performed, the process is ended, and when the SGD side dummy programming is to be repeated, the sequencer 14 repeats the same process as for the SGS side dummy programming.

In step S55, when a plane where PBx_ENABLE=1 is present (YES in step S55), the sequencer 14 performs the pre-programming verification (step S57). The pre-programming verification is an operation in which a read operation is performed on the dummy transistors DT, and it is confirmed whether or not the thresholds of the dummy transistors DT are excessively reduced. Therefore, hereinafter, a case in which the thresholds of the dummy transistors DT are higher than a predetermined value will be defined as having passed the pre-programming verification, and a case in which the thresholds are the predetermined value or less (there is over-erasure) will be defined as having failed the pre-programming verification.

Subsequently, the sequencer 14 captures the results of the pre-program verification and, for planes that passed, sets DMY_REG_PBx=1 (step S58). If no failed planes are present among the planes where PBx_ENABLE=1, the sequencer 14 returns to step S54 and executes the pre-programming verification again.

When the pre-programming verification is failed in one of the planes (NO in step S59), the process proceeds to step S60. In other words, the sequencer 14 sets PBx_ENABLE of the passed planes to 0, and programs (dummy programs) the string units SU where DMY_REG=1 in the planes where PBx_ENABLE=1, thereby executing the programming verification (step S60).

Subsequently, the sequencer 14 captures the results of the programming verification in step S60 and, for planes that passed, sets DMY_REG_PBx[n]=1 (step S61). Meanwhile, when a failed plane is present among the planes where PBx_ENABLE=1 (YES in step S62), the sequencer 14 repeats steps S60 to S62 until the maximum repetition number of the dummy programming is reached (step S63). Meanwhile, if a failed plane is not present, the sequencer 14 returns to the process of step S54.

When the maximum repetition number is reached (YES in step S63), the sequencer 14 sets FS_REG_PBx of the string units corresponding to the failed planes to 1 (step S64), and returns to step S52.

As described above, in the present example, first, the processes illustrated in FIG. 58 are performed for the dummy transistors DTS adjacent to the source side select transistors ST2. Subsequently, the same processes are performed on the dummy transistors DTD adjacent to the drain side select transistors ST1. However, in the string units SU where the dummy transistor DTS failed (in other words, the string units SU where the register FS_REG is set to "1"), the dummy programming is not executed in relation to the dummy transistor DTD.

4.3 Specific Example of Dummy Programming

Figure 58A:
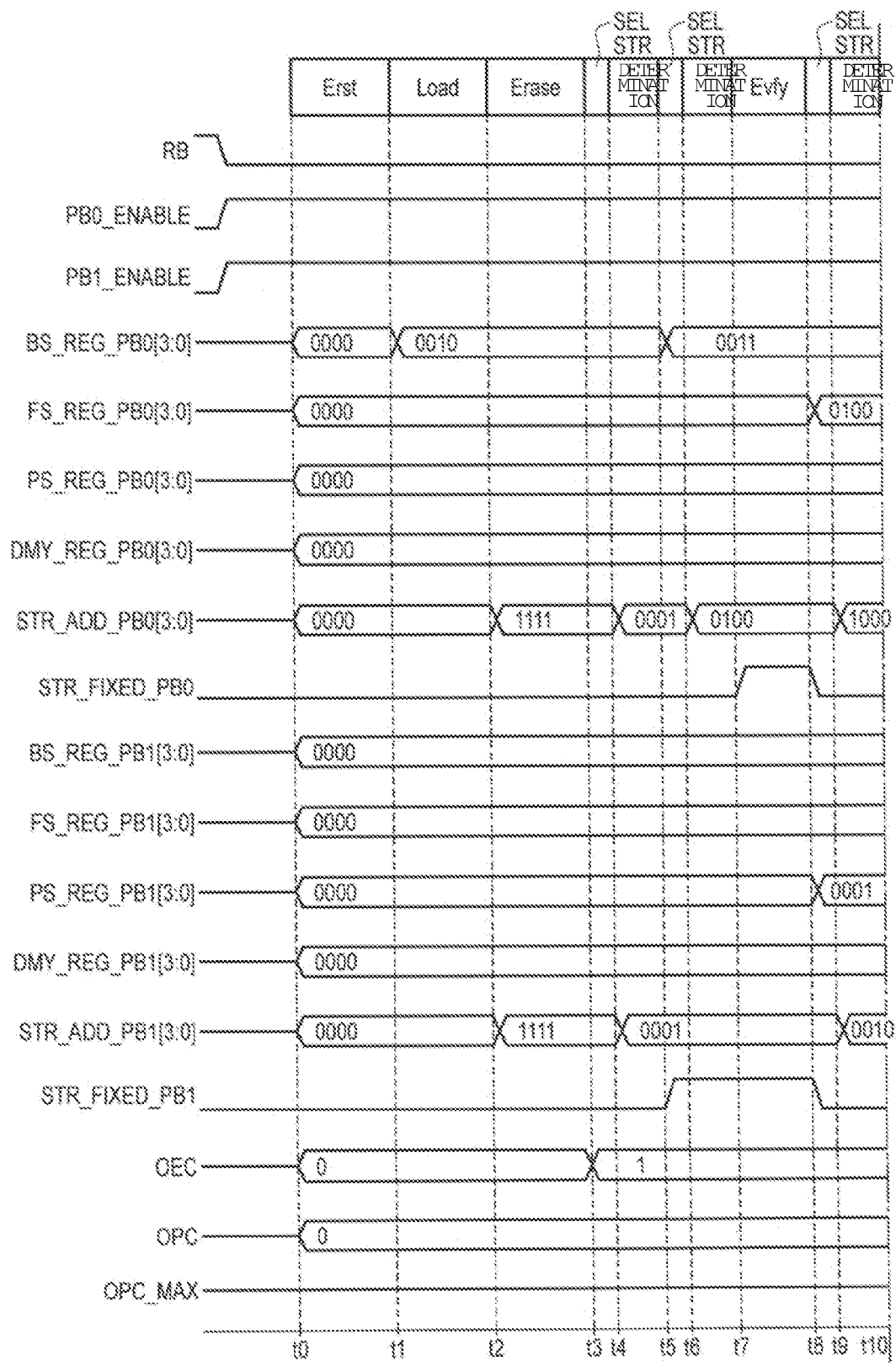
FIG. 58A is a timing chart of the erase operation according to the fourth embodiment.
Figure 58B:
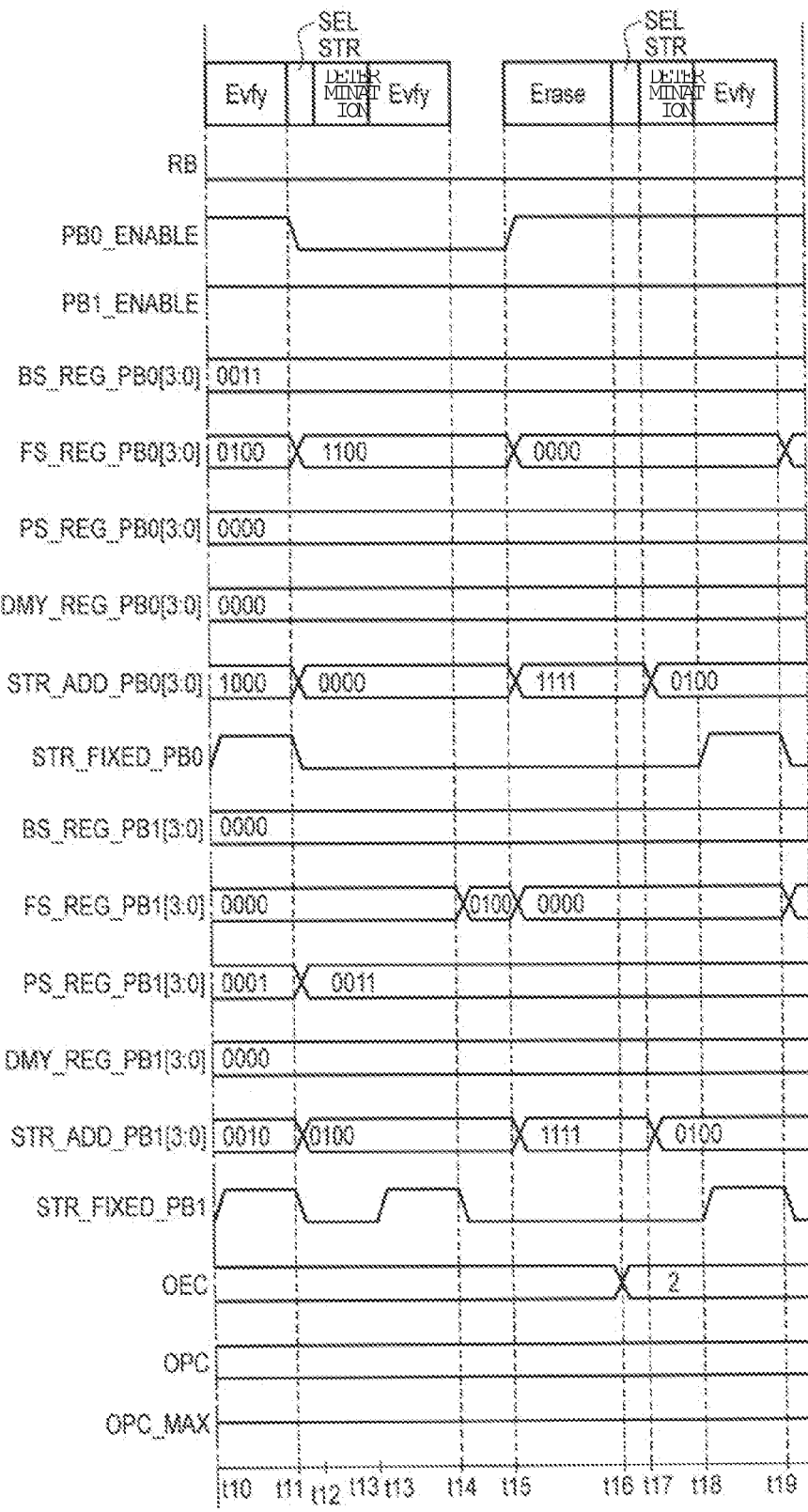
FIG. 58B is a timing chart continuing from FIG. 58A.
Figure 58C:
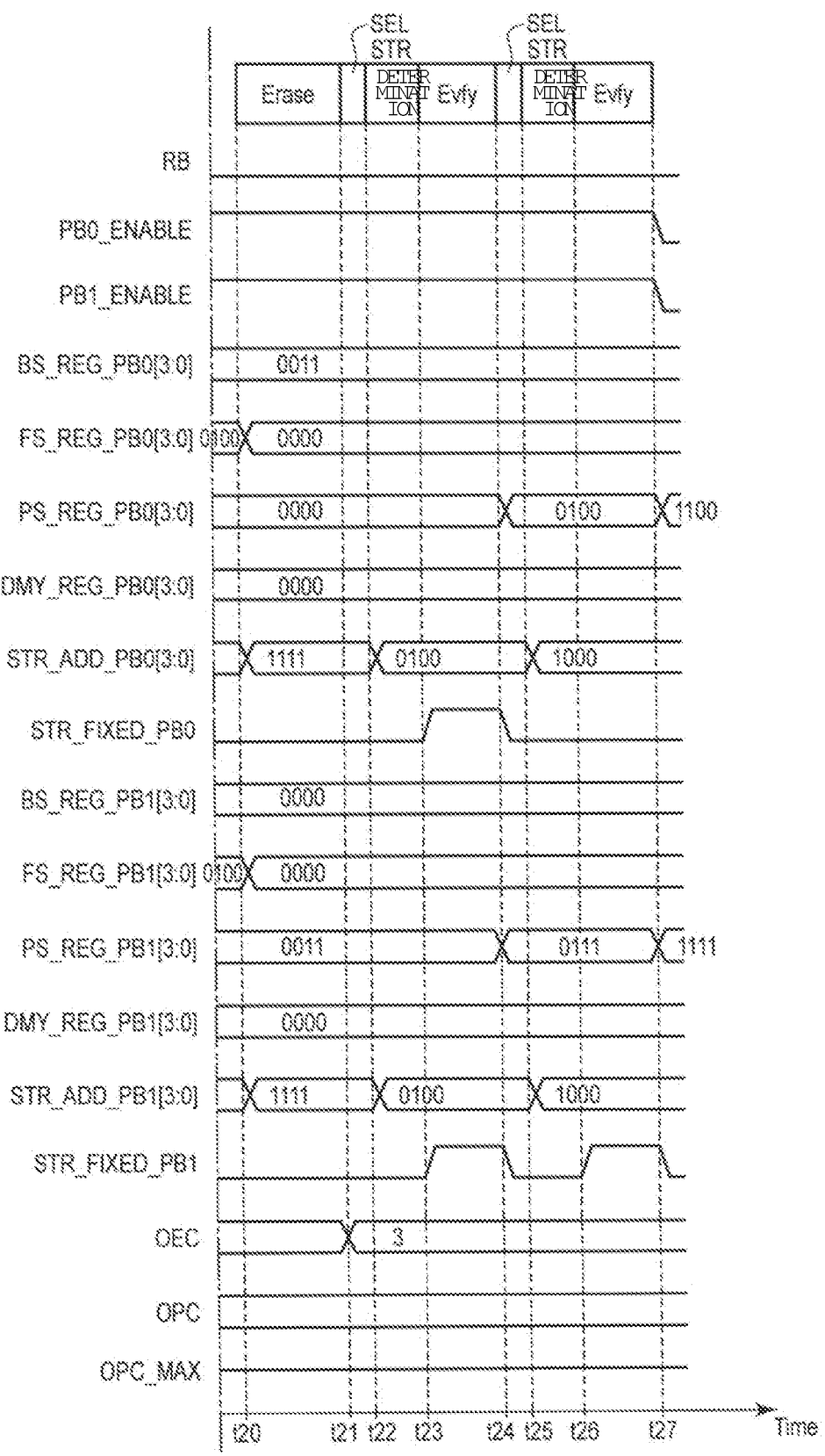
FIG. 58C is a timing chart continuing from FIG. 58B.
Figure 59A:
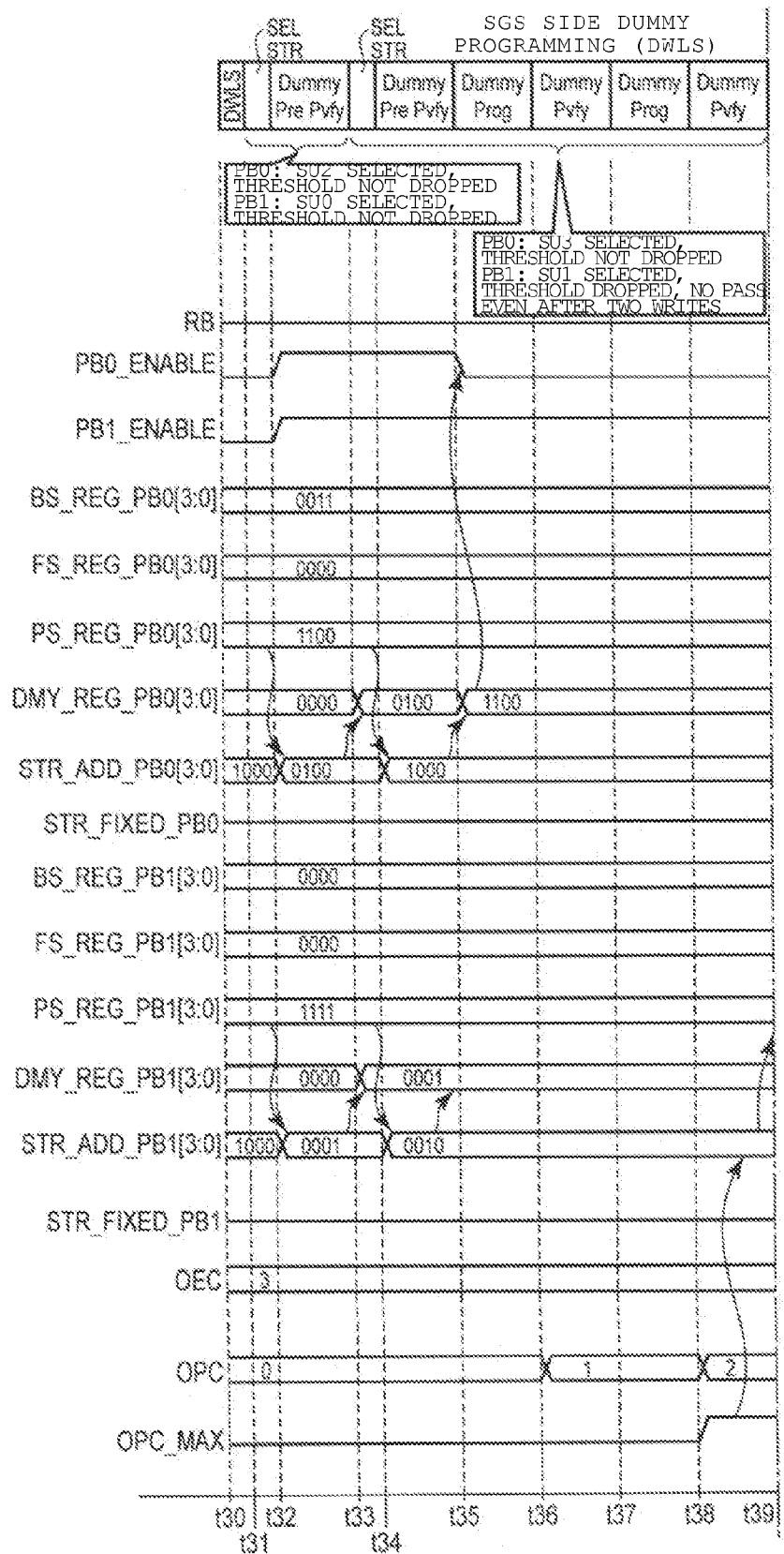
FIG. 59A is a timing chart of the erase operation according to the fourth embodiment.
Figure 59B:
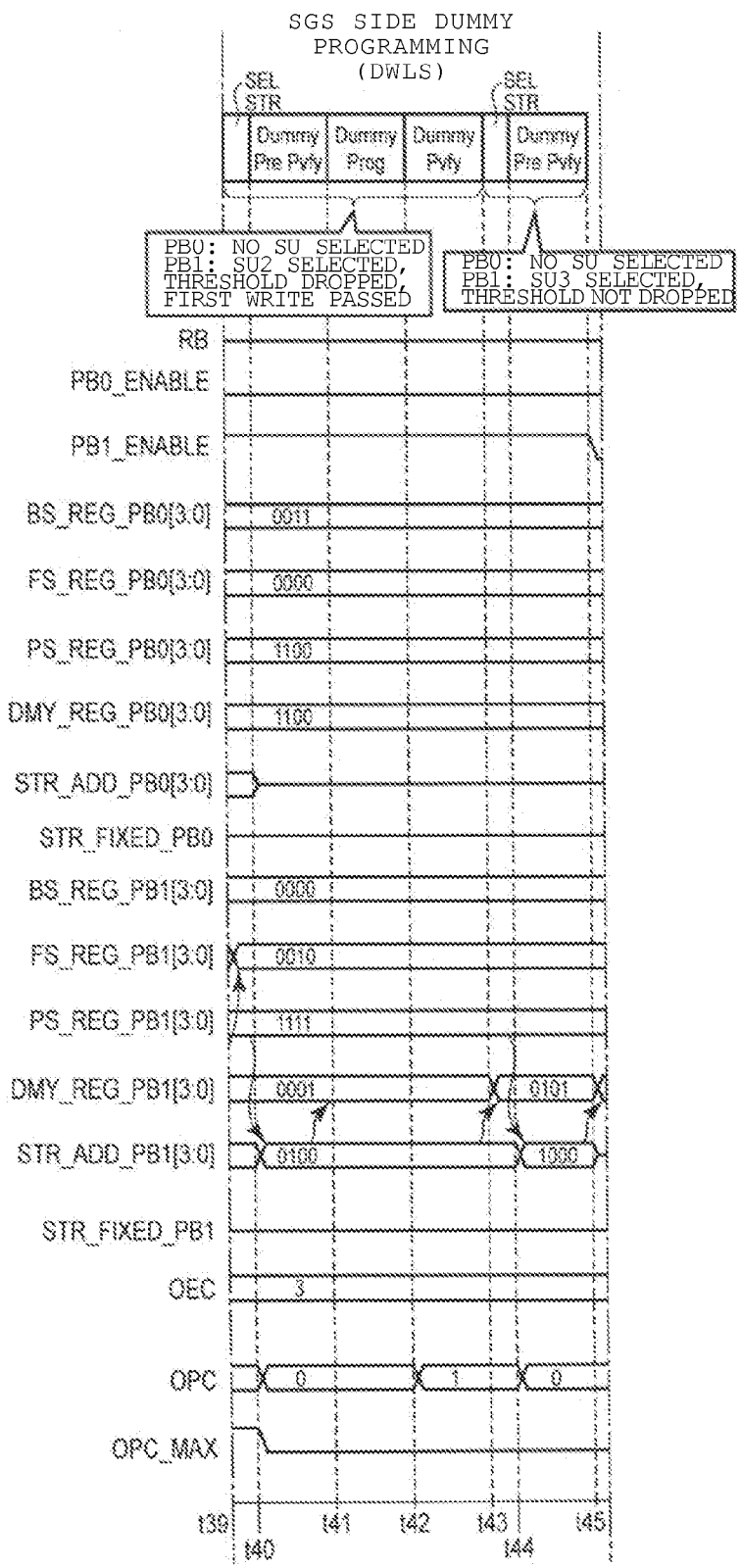
FIG. 59B is a timing chart continuing from FIG. 59A.
Figure 59C:
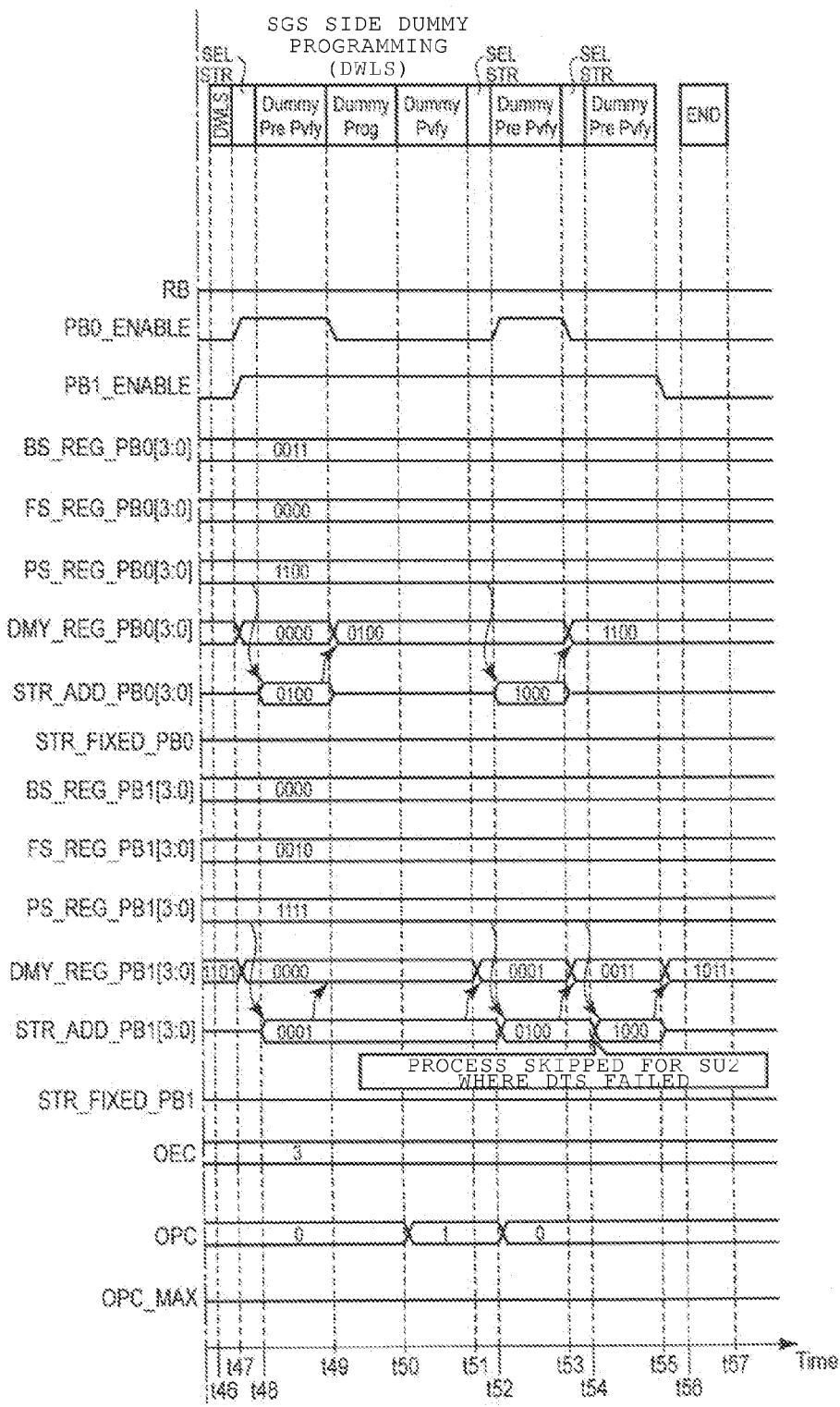
FIG. 59C is a timing chart continuing from FIG. 59B.

Next, description will be given exemplifying the multi-plane operation in the specific example of the dummy programming operation described above. FIGS. 58A to 58C are each a timing chart showing the changes of the various signals during the erase operation in a sequential manner. FIGS. 59A to 59C are each a timing chart during the dummy programming operation continuing from FIGS. 58A to 58C.

FIGS. 58A to 58C are substantially the same as FIGS. 24A and 24B described in the first embodiment. FIGS. 58A to 58C are different from the case of FIGS. 24A and 24B only in that the sequencer 14 controls the dummy registers DMY_REG_PB0[3:0] and DMY_REG_PB1[3:0] and the signals OPC and OPC_MAX. During the erase operation, the data of the dummy registers DMY_REG_PB0 and DMY_REG_PB1 are both maintained in the initialized state "0000". The signal OPC is a signal indicating the dummy programming number, and the signal OPC is incremented every time the sequencer 14 executes the dummy programming. Therefore, during the erase operation, the signal OPC is "0". The signal OPC_MAX is a signal that is set to the "H" level when the dummy programming number reaches the maximum repetition number.

After the erase operation described in the first embodiment, the sequencer 14 starts the dummy programming operation in relation to the dummy transistor DTS (time t30). In the plane PB0, since BS_REG="0011", FS_REG="0000", and PS_REG="1100", the sequencer 14 sets STR_ADD_to "0100" and selects the string unit SU2. Meanwhile, in the plane PB1, since BS_REG="0000", FS_REG="0000", and PS_REG="1111", the sequencer 14 sets STR_ADD_to "0001" and selects the string unit SU0. The sequencer 14 executes the pre-programming verification (Dummy Pre Pvfy, times t32 to t33).

As a result of the pre-programming verification, both the planes PB0 and PB1 pass the verification. Thus, the sequencer 14 sets the corresponding bit to "1" in the registers DMY_REG. In other words, the sequencer 14 sets the register DMY_REG_PB0 to "0100", and sets the register DMY_REG_PB1 to "0001" (time t33).

Since string units that satisfy the conditions of step S54 of FIG. 58 remain, the sequencer 14 subsequently selects the string unit SU3 of the plane PB0 by setting STR_ADD_PB0 to "1000", and selects the string unit SU1 of the plane PB1 by setting STR_ADD_PB1 to "0010". The sequencer 14 executes the pre-programming verification (times t34 to t35).

As a result of the pre-programming verification, the plane PB0 passes the verification, and the plane PB1 fails. Thus, the sequencer 14 updates DMY_REG_PB0 from "0100" to "1100", and maintains DMY_REG_PB1 at "0001" (time t35).

At time t35, since there are no longer a string unit SU that satisfies the conditions of step S54 of FIG. 58 in the plane PB0, the sequencer 14 sets PB0_ENABLE to the "L" level. Accordingly, time t35 onward adopts the single-plane operation.

Since the verification failed in the plane PB1, the dummy programming (Dummy Prog) is executed in relation to the string unit SU1 (times t35 to t36). The sequencer 14 increments the signal OPC from "0" to "1".

Subsequently, the sequencer 14 executes the dummy programming verification (Dummy Pvfy) in relation to the string unit SU1 (times t36 to t37). As a result, since the verification is failed, the sequencer 14 executes the dummy programming again (times t37 to t38). Thus, since the dummy programming number becomes "2", reaching the maximum repetition number, the sequencer 14 sets the signal OPC_MAX to the "H" level.

Subsequently, the sequencer 14 executes the dummy programming verification in relation to the string unit SU1 (times t38 to t39), which fails. Thus, since the signal OPC_MAX is the "H" level, the sequencer 14 sets the corresponding bit in FS_REG_PB1 to "1". In other words, the sequencer 14 sets FS_REG_PB1="0010" (time t39).

Subsequently, the sequencer 14 proceeds to the process of step S54, and selects the string unit SU2 of the plane PB1 (time t40). The string unit SU2, passes the dummy programming verification in the second dummy programming. Therefore, the sequencer 14 updates DMY_REG_PB0 from "0001" to "0101" at time t43.

Furthermore, the sequencer 14 selects the string unit SU3 of the plane PB1 (time t44). The string unit SU3 passes the pre-programming verification. Accordingly, the sequencer 14 updates DMY_REG_PB0 from "0101" to "1101" at time t45.

At this time, since no string units that satisfy the conditions of step S54 remain in the plane PB0, the sequencer 14 sets PB1_ENABLE to the "L" level.

According to the above description, the dummy programming in relation to the source side dummy transistors DTS is completed. Subsequently, the sequencer 14 starts the dummy programming in relation to the drain side dummy transistor DTD (time t46).

Since the dummy programming in relation to the dummy transistor DTD is the same as that with the dummy transistor DTS, the details thereof will be omitted. However, the dummy transistor DTS of the string unit SU2 of the plane PB1 fails the dummy programming. Therefore, in the plane PB1, the dummy programming is not performed in relation to the dummy transistor DTD of the same string unit SU2 (refer to time t54).

4.4 Effects of Present Embodiment

In NAND flash memory, sometimes a dummy transistor is provided between the select transistor and the memory cell transistor. The dummy transistor does not function as a data memory device, and functions as a simple current path. In order for the NAND string to operate normally, it is preferable that the threshold of the dummy transistor also be set within a predetermined range.

This is because, a fixed degree of voltage stress is also applied to the dummy transistors during the erasure of the data, and there may be a case in which the threshold is excessively reduced. Therefore, in the present embodiment, after the erasure, the program is executed in relation to the dummy transistors, thereby setting the thresholds of dummy transistors in an over-erased state to a normal value. Accordingly, it is possible to improve operation reliability of the NAND flash memory 1.

At this time, the sequencer 14 determines the string units SU to become dummy programming target candidates according to the states of the registers BS_REG, FS_REG, and PS_REG. In other words, the string units SU where PS_REG="1", FS_REG="0", and BS_REG="0" are the dummy programming target candidates.

In other words, the string units where FS_REG="1" and/or BS_REG="1" are already defective strings before performing the dummy programming. Therefore, performing the dummy programming in relation to these string units is wasteful. Accordingly, in the present embodiment, these string units are no longer dummy programming candidates. Accordingly, it is possible to increase the speed of the dummy programming operation.

In the present embodiment, before performing the dummy programming, the string units that satisfy PS_REG="1", FS_REG="0", and BS_REG="0" are verified. In other words, it is confirmed whether or not the dummy transistors are over-erased. The dummy programming is only executed in relation to the dummy transistors that are over-erased. Therefore, programming may be performed only in relation to the dummy transistors for which the dummy programming is really necessary, and it is possible to increase the speed of the dummy programming operation.

In the string units SU where the source side dummy transistor DTS failed, the dummy programming of the drain side dummy transistor DTD is not performed. This is because, when the dummy transistor DTS fails, the corresponding string unit is identified as defective, and it is not necessary to perform the dummy programming in relation to the dummy transistor DTD of such string units SU. This contributes to the increase in speed of the dummy programming.

5. Fifth Embodiment

Next, description will be given of the semiconductor memory device according to the fifth embodiment. In the present embodiment, the status of the semiconductor memory device described in the first to fourth embodiments is read by a memory controller that controls the semiconductor memory device. Hereinafter, description will be given of points that differ from the first to fourth embodiments.

5.1 Configuration of Memory Controller

First, description will be given of the memory controller according to the present embodiment using FIG. 60. FIG. 60 is a block diagram of a memory system according to the present embodiment.

As illustrated, the memory system is provided with a NAND flash memory 100 and a controller 200. The controller 200 and the NAND flash memory 100 may configure a single semiconductor device by the combination thereof, for example. Examples of such a configuration include a memory card such as an SD™ card and a solid state drive (SSD).

The NAND flash memory 100 is the semiconductor memory device 1 described in the above embodiments.

In response to commands from an external host device, the controller 200 sends commands such as read, write, and erase to the NAND flash memory 100. The controller 200 also manages the memory space in the NAND flash memory 100.

The controller 200 is provided with a host interface circuit 210, internal memory (RAM) 220, a processor (CPU) 230, buffer memory 240, a NAND interface circuit 250, and an ECC circuit 260.

The host interface circuit 210 is connected to the host device via a controller bus, and manages the communication with the host device. The host interface circuit 210 also transfers the commands and data which are received from the host device to the CPU 230 and the buffer memory 240, respectively. The host interface circuit 210 also transfers the data in the buffer memory 240 to the host device in response to commands from the CPU 230.

The NAND interface circuit 250 is connected to the NAND flash memory 100 via a NAND bus, and manages the communication with the NAND flash memory 100. The NAND interface circuit 250 also transfers the commands which are received from the CPU 230 to the NAND flash memory 100, and during the writing, transfers the write data in the buffer memory 240 to the NAND flash memory 100. During the reading, the NAND interface circuit 250 also transfers the data which is read from the NAND flash memory 100 to the buffer memory 240.

The CPU 230 controls the overall operation of the controller 200. For example, when the CPU 230 receives a write command from the host device, the CPU 230 issues a write command based on the NAND interface in response to the received command. The same applies to reading and erasure. The CPU 230 also executes various processes for managing the NAND flash memory 100, such as ware leveling. The CPU 230 executes the various operations. For example, the CPU 230 subjects the data to encryption, randomization or the like. The CPU 230 also issues various status reading commands, and reads the status of the NAND flash memory 100.

The ECC circuit 260 executes an error correction process (Error Checking and Correcting: ECC) on the data. In other words, the ECC circuit 260 generates parity based on the write data during the writing of the data, generates a syndrome from the parity during the reading, detects errors, and corrects the errors. Note that, the CPU 230 may include the function of the ECC circuit 260.

The internal memory 220 is semiconductor memory such as DRAM, for example, and is used as the working area of the CPU 230. The internal memory 220 holds firmware for managing the NAND flash memory 100, various management tables and the like.

5.2 Status Reading Commands

Next, description will be given of the status reading commands issued by the memory controller 200. FIG. 61 is a timing chart of the various signals during status reading.

The chip enable signal /CE, the address latch enable signal ALE, the command latch enable signal CLE, the write enable signal /WE, the read enable signal /RE, and the input output signal I/O in FIG. 61 are signals which are transmitted and received between the controller 200 and the NAND flash memory 100.

/CE is a signal for enabling the NAND flash memory 100, and asserts that the NAND flash memory 100 is enabled when at the Low level. ALE is a signal that notifies the NAND flash memory that the input signal is an address signal. CLE is a signal that notifies the NAND flash memory that the input signal is a command. /WE is a signal for causing the NAND flash memory 100 to capture the input signal.

As illustrated, the controller 200 first issues the status reading command ("XXH" in FIG. 61) "80H", and asserts CLE (the "H" level). /WE is asserted. Accordingly, the status reading command is stored in the registers of the NAND flash memory 100.

Subsequently, when the controller 200 asserts /RE, the NAND flash memory 100 outputs the requested status information in response.

FIGS. 62 and 63 are diagrams showing the contents of CMD 70 and CMD 71, which are general status reading commands, and CMD 71 is a status reading command which is used with two-plane chips.

In the present embodiment, the commands "XH", "YH", and "ZH" for reading the information of PS_REG, FS_REG, and BS_REG are provided. The contents of these commands are shown in FIGS. 64 to 66. FIGS. 64 to 66 show the (8-bit)

bit information of each input output signal, read using the commands "XH", "YH", and "ZH". In the present example, a case is shown in which there are two planes, and one block contains four string units. As illustrated, by using these commands, it is possible to read the information held in PS_REG, FS_REG, and BS_REG in relation to each string unit SU of each plane.

Figure 67:
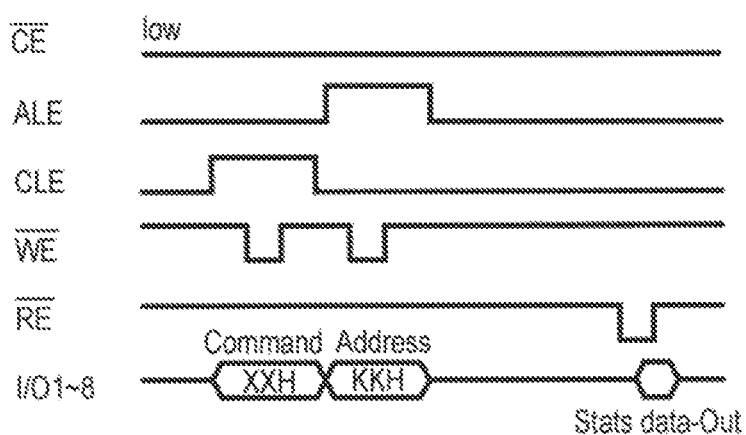
FIG. 67 is a timing chart of the various signals during reading of a status according to the fifth embodiment.

FIG. 67 shows /CE, ALE, CLE, /WE, /RE, and I/O when there are two planes, and 12 string units SU are included in one block. In the present example, the address is input directly after the status reading command. The contents of the status commands "XH", "YH", and "ZH" in the case of the present example are shown in FIGS. 68 to 70. As illustrated, it is possible to specify the information to be read using the address which is input.

When the dummy programming is performed, it is also possible to read the information of the dummy register DMY_REG. FIG. 71 shows such a command "WH", and shows a case in which there are two planes, and four string units per one block. As illustrated, it is possible to read the information of the dummy registers in relation to each string unit of each plane using an 8-bit input output signal.

5.3 Effects of Present Embodiment

According to the present example, the memory controller may read the status of the NAND flash memory in units of string units. Accordingly, it is possible to control the NAND flash memory more accurately.

For example, after the erase operation is completed, it is possible to issue a command which causes the thresholds of the select transistors ST1 of the failed string units to rise based on the information of FS_REG. Accordingly, it is also possible to mark the select transistor as a bad string for delayed defects. More specifically, a write command is issued in relation to the select transistors ST1 of the string units where FS_REG="1".

5. Modification Example

As described above, the NAND flash memory 1 according to above embodiments is provided with a plurality of string units, a first register (BS_REG), a second register (FS_REG), a third register (PS_REG), and a control circuit (the sequencer 14). Each string unit is a collection of NAND strings in which a plurality of memory cells are stacked. The first register (BS_REG) is capable of holding information indicating that a string unit is a bad string. The second register (FS_REG) is capable of holding information indicating that the string unit failed verification. The third register (PS_REG) holds information indicating that the string unit is a string which passed verification. The control circuit skips an erase verification operation in relation to one of the string units based on the information in the first to third registers.

According to the present configuration, it is possible to omit wasteful erase verification, and to improve the operation speed of the NAND flash memory.

However, the embodiments are not limited to the embodiments described above, and various modifications may be made thereto. For example, in the embodiments described above, a case is described in which one of the dummy transistors DT is provided for each of the drain side and the source side; however, may be provided in plural numbers. In this case, when one of the dummy transistors DT fails in the dummy programming, the dummy programming in relation to the corresponding string unit may be stopped.

Figure 72:
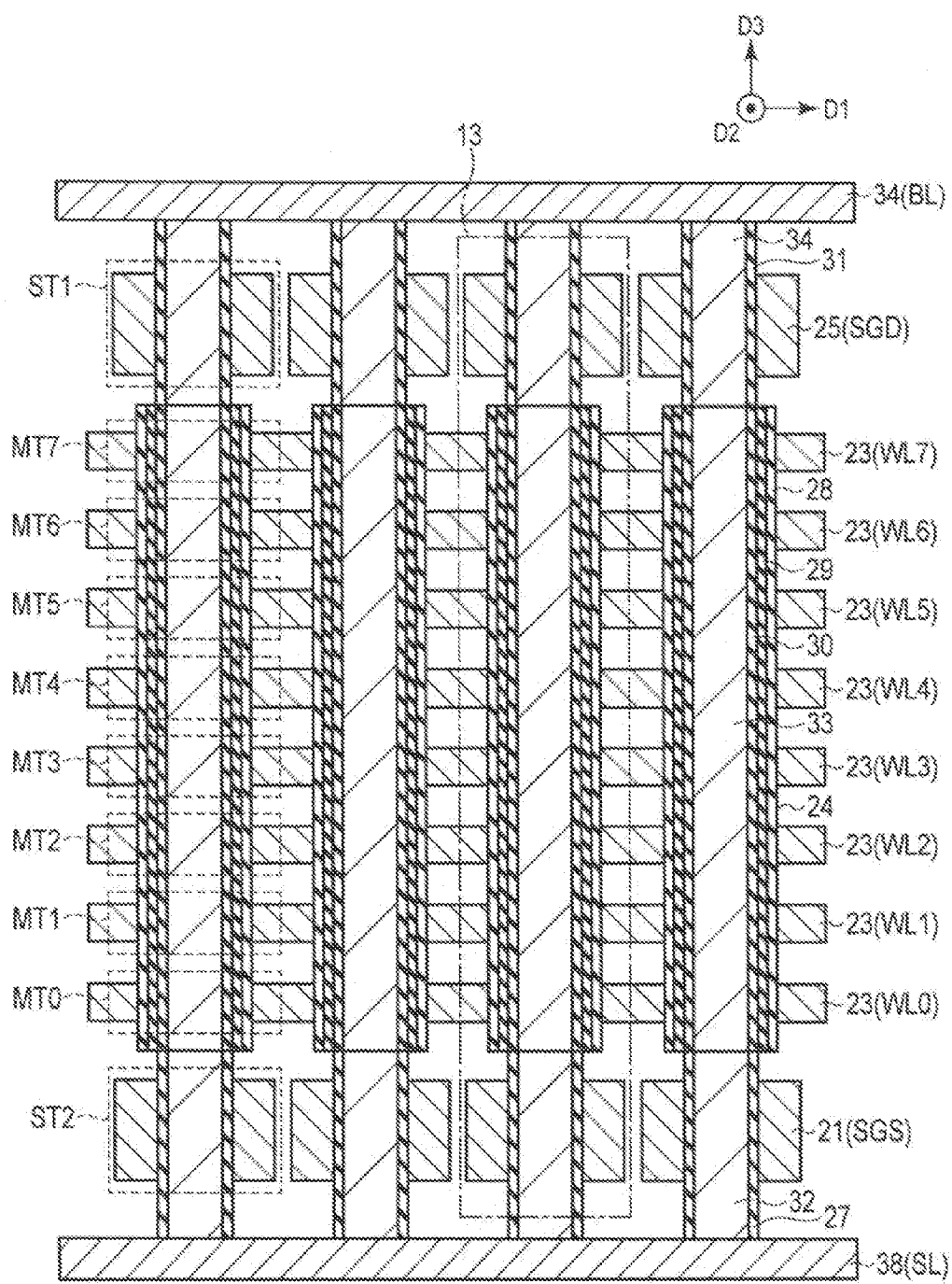
FIG. 72 is a cross-sectional diagram of a memory cell array according to a modification example of the first to fifth embodiments.

The configuration of the memory cell array may be a configuration such as that shown in FIG. 72, for example. In other words, the pillars 32 to 34 are formed on the source line SL, and the select gate lines SGS may be independent for each string unit SU.

Furthermore, the order of the processes of the flowcharts described in the above embodiments may be changed to the extent which is possible.

In the above embodiments, description is given exemplifying a NAND flash memory containing a three-dimensional stacked memory cell array; however, the memory cells may be two-dimensionally arranged NAND flash memory, and an exemplary embodiment may be applied to semiconductor memory devices other than the NAND flash memory in general. Each embodiment may be individually embodied; however, a plurality of embodiments which may be combined may be embodied in combination.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a block including a plurality of string units, each including a plurality of memory cells electrically connected in series;
a bad string register in which information indicating which of the string units is a bad string is stored;
a control circuit configured to control an erase operation on the memory cells, the erase operation including a first erase operation followed by a first operation and a first verify operation in this order and as needed a subsequent erase operation followed by a subsequent verify operation, the control circuit being configured to skip a verify operation for a string unit during the erase operation if the information in the bad string register indicates the string unit is a bad string; and
a plurality of word lines electrically connected to memory cells,
wherein the control circuit is configured to perform the first operation in a state where a pass voltage is applied to at least one of the word lines.

2. The device according to claim 1, further comprising:
first and second select transistors electrically connected in series to opposite ends of a selected string unit that is one of the plurality of string units, wherein
during the erase operation, the control circuit is configured to apply voltages to gates of the first and second select transistors and the memory cells of the selected string unit and determine whether or not the selected string unit is a bad string based on a current flowing therethrough.

3. The device according to claim 2, further comprising:
a sense amplifier configured to detect a level of the current flowing through the first and second select transistors and the memory cells of the selected string unit.

4. The device according to claim 3, wherein
the control circuit is configured to update the bad string register to indicate that the selected string unit is a bad string if the level of the current sensed by the sense amplifier is below a threshold level.

5. The device according to claim 1, further comprising:
a verification failed register, in which information indicating which of the string units has failed verification is stored; and
a verification passed register, in which information indicating which of the string units has passed verification is stored, wherein
the control circuit is configured to update the verification failed register and the verification passed register following each verify operation.

6. The device according to claim 5, wherein
the control circuit is configured to perform each verify operation by performing a read operation sequentially on remaining string units, the remaining string units including all of the string units that are not indicated by the bad string register as a bad string and by the verification passed register as having passed verification.

7. The device according to claim 6, wherein
the control circuit is configured to perform the subsequent erase operation followed by the subsequent verify operation if the verify operation on one of the remaining string units fails.

8. The device according to claim 1, wherein
each of the first and subsequent erase operations is performed collectively on the plurality of string units and each of the first and subsequent verify operations is performed on the string unit one at a time.

9. A semiconductor memory device, comprising:
a memory cell array including a plurality of memory planes, each memory plane including a plurality of memory blocks, each memory block including a plurality of string units, the memory planes including a first memory plane with a plurality of string units and a second memory plane with a plurality of string units;
a bad string register in which information indicating which of the string units is a bad string is stored; and
a control circuit configured to perform an erase operation that includes a first erase operation performed collectively on the first and second memory planes followed by a first verify operation performed on the first and second memory planes independently with respect to each other and as needed a subsequent erase operation performed collectively on the first and second memory planes followed by a subsequent verify operation performed on the first and second memory planes independently with respect to each other,
wherein, during the erase operation, the control circuit is configured to skip a verify operation for a string unit if the information in the bad string register indicates the string unit is a bad string.

10. The device according to claim 9, further comprising:
a verification failed register, in which information indicating which of the string units has failed verification is stored; and
a verification passed register, in which information indicating which of the string units has passed verification is stored, wherein
the control circuit is configured to update the verification failed register and the verification passed register following each verify operation.

11. The device according to claim 10, wherein
the control circuit is configured to perform the subsequent erase operation only after determining that each of the memory planes meets one of the following two conditions: (1) the verification failed register indicates that at least one of the string units of the memory plane has failed verification; and (2) all of the string units of the memory plane are indicated by the bad string register as a bad string or indicated by the verification passed register as having passed verification.

12. The device according to claim 11, wherein
the control circuit is configured to perform each verify operation by performing a read operation sequentially on remaining string units of each memory plane, the remaining string units including all of the string units that are not indicated by the bad string register as a bad string and by the verification passed register as having passed verification.

13. The device according to claim 9, further comprising:
first and second select transistors electrically connected in series to opposite ends of a selected string unit, wherein
during the erase operation, the control circuit is configured to apply voltages to gates of the first and second select transistors and the memory cells of the selected string unit and determine whether or not the selected string unit is a bad string based on a current flowing therethrough.

14. The device according to claim 13, further comprising:
a sense amplifier configured to detect a level of the current flowing through the first and second select transistors and the memory cells of the selected string unit.

15. The device according to claim 14, wherein
the control circuit is configured to update the bad string register to indicate that the selected string unit is a bad string if the level of the current sensed by the sense amplifier is below a threshold level.

16. The device according to claim 9, wherein:
each of the string units include dummy memory cells, and the control circuit is configured to perform programming of the dummy memory cells of a selected string unit if the selected string unit is not indicated by the bad string register as a bad string and to not perform programming of the dummy memory cells of a selected string unit if the selected string unit is indicated by the bad string register as a bad string.

17. A method of performing an erase operation in a semiconductor memory device having a plurality of string units, each including a plurality of memory cells electrically connected in series, and a bad string register in which information indicating which of the string units is a bad string is stored, said method comprising:
performing a first erase operation collectively on all of the string units;
performing a first verify operation on the string units one at a time, excluding any string unit indicated in the bad string register as a bad string; and
if any of the string units failed the first verify operation, performing a second erase operation collectively on all of the string units followed by a second verify operation, and if none of the string units failed the first verify operation, terminating the erase operation.

18. The method according to claim 17, further comprising:
after the first erase operation and before the first verify operation, applying voltages to gates of first and second select transistors that are electrically connected in series to opposite ends of a selected string unit that is one of the plurality of string units and gates of the memory cells of the selected string unit, and determining whether or not the selected string unit is a bad string based on a current flowing therethrough.

19. The method according to claim 18, further comprising:
updating the bad string register to indicate that the selected string unit is a bad string if the level of the current flowing through the first and second select transistors and the memory cells is below a threshold level.

* * * * *